(12) United States Patent
Yun et al.

(10) Patent No.: US 12,288,778 B2
(45) Date of Patent: Apr. 29, 2025

(54) DISPLAY DEVICE AND MANUFACTURING METHOD THEREOF

(71) Applicant: SAMSUNG DISPLAY CO., LTD., Yongin-si (KR)

(72) Inventors: Sung Jae Yun, Yongin-si (KR); Sang Hoon Park, Yongin-si (KR); Jee Hoon Park, Yongin-si (KR); Dong Woo Shin, Yongin-si (KR); Hang Jae Lee, Yongin-si (KR); Jae Won Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/490,729

(22) Filed: Oct. 19, 2023

(65) Prior Publication Data

US 2024/0047445 A1  Feb. 8, 2024

Related U.S. Application Data

(63) Continuation of application No. 17/451,090, filed on Oct. 15, 2021, now Pat. No. 11,798,927.

(30) Foreign Application Priority Data

Oct. 16, 2020 (KR) .................. 10-2020-0134579

(51) Int. Cl.
*H01L 25/16* (2023.01)
*H01L 27/12* (2006.01)

(52) U.S. Cl.
CPC ........ *H01L 25/167* (2013.01); *H01L 27/1259* (2013.01)

(58) Field of Classification Search
None
See application file for complete search history.

(56) References Cited

U.S. PATENT DOCUMENTS

| 8,432,528 B2 | 4/2013 | Nara et al. |
| 9,978,725 B2 | 5/2018 | Do |

(Continued)

FOREIGN PATENT DOCUMENTS

| JP | 3952729 B2 | 8/2007 |
| JP | 3994716 B2 | 10/2007 |

(Continued)

*Primary Examiner* — Bo B Jang
(74) *Attorney, Agent, or Firm* — Womble Bond Dickinson (US) LLP

(57) ABSTRACT

A display device includes: a substrate including a pixel area; and a pixel in the pixel area, the pixel including a first sub-light emitting area, a second sub-light emitting area, and a peripheral area surrounding the first and second sub-light emitting areas. The pixel may include: a first electrode, a second electrode, a third electrode, and a fourth electrode that are spaced from each other; a plurality of light emitting elements in the first and second sub-light emitting areas; a bank in the peripheral area and including a first opening corresponding to the first sub-light emitting area and a second opening corresponding to the second sub-light emitting area; and an intermediate bank between the first sub-light emitting area and the second sub-light emitting area and partially overlapping the second and third electrodes in a plan view.

18 Claims, 32 Drawing Sheets

(56) References Cited

U.S. PATENT DOCUMENTS

| | | | |
|---|---|---|---|
| 2018/0190736 A1* | 7/2018 | Kim | H10K 59/122 |
| 2019/0013371 A1* | 1/2019 | Kim | H10K 71/621 |
| 2019/0189713 A1* | 6/2019 | Kondo | H10K 50/16 |
| 2020/0335562 A1* | 10/2020 | Kim | H10K 59/122 |
| 2021/0336142 A1 | 10/2021 | Jeong et al. | |
| 2022/0052228 A1 | 2/2022 | Yang et al. | |

FOREIGN PATENT DOCUMENTS

| | | |
|---|---|---|
| JP | 5286719 B2 | 9/2013 |
| KR | 10-1401687 B1 | 5/2014 |
| KR | 10-1429095 B1 | 8/2014 |
| KR | 10-1530728 B1 | 6/2015 |

* cited by examiner

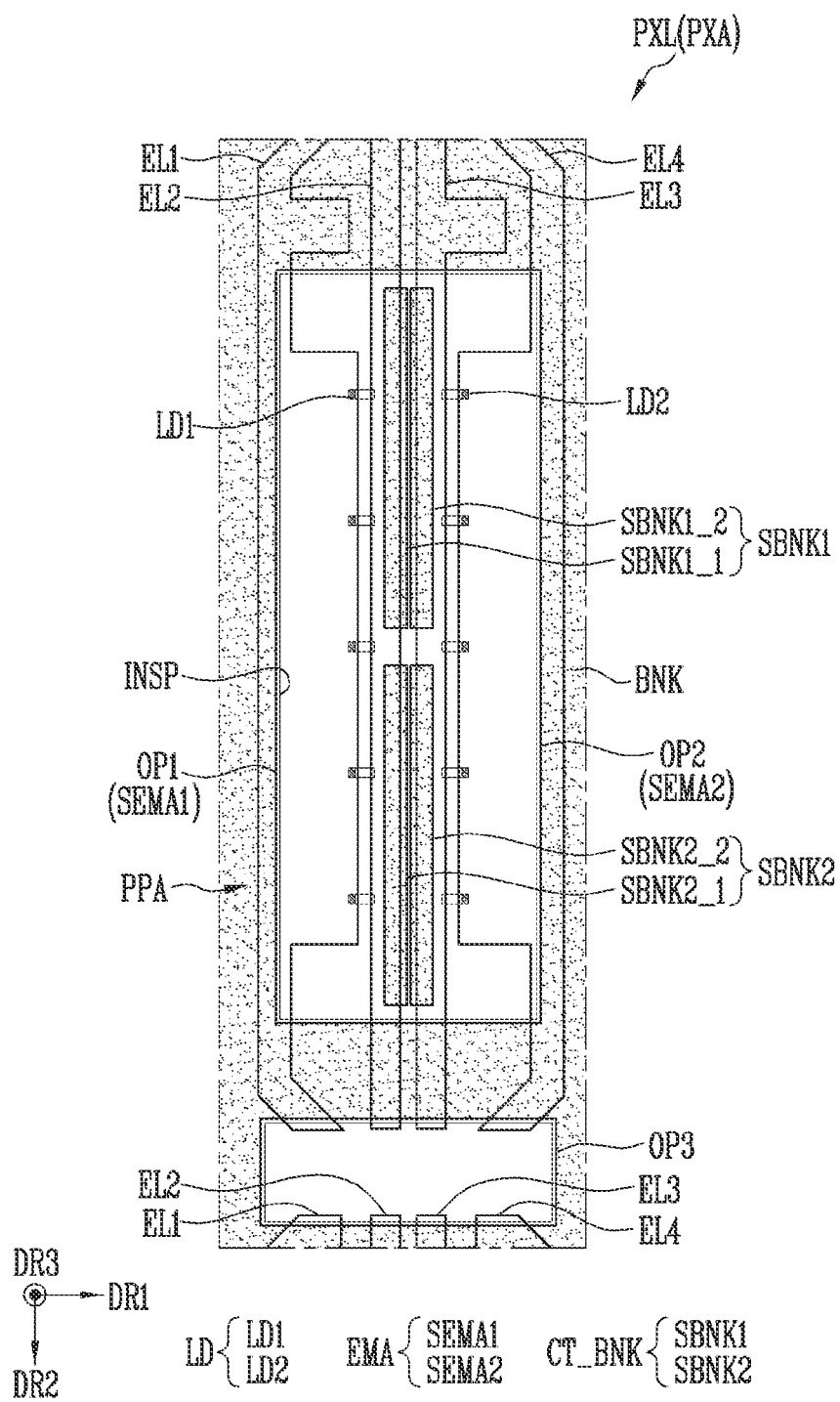

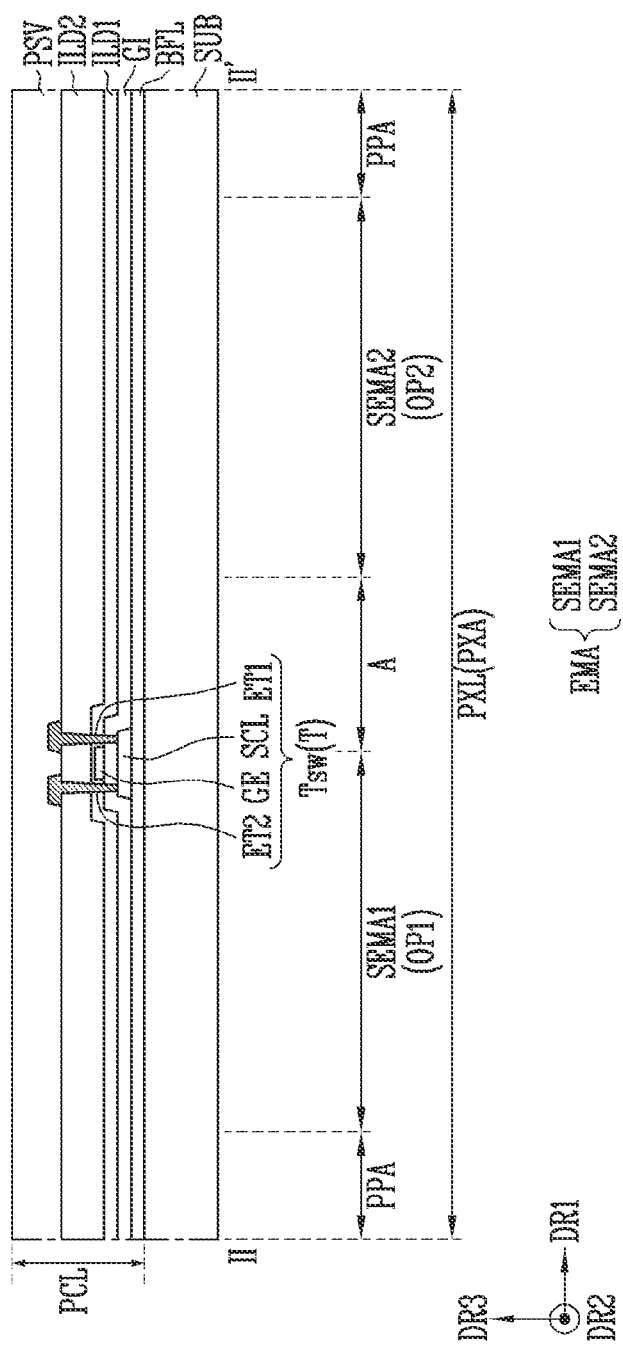

DISPLAY DEVICE AND MANUFACTURING METHOD THEREOF

CROSS-REFERENCE TO RELATED APPLICATIONS

This application is a continuation of U.S. patent application Ser. No. 17/451,090, filed Oct. 15, 2021, which claims priority to and the benefit of Korean Patent Application No. 10-2020-0134579, filed Oct. 16, 2020, the entire content of both of which is incorporated herein by reference.

BACKGROUND

1. Field

The present disclosure relates to a display device and a manufacturing method thereof.

2. Description of the Related Art

As an interest in an information display largely increases and a demand for using a portable information medium increases, a demand and commercialization for a display device has been progressed in priority.

SUMMARY

The present disclosure has been made in an effort to provide a display device that may improve reliability by reducing or minimizing a non-ejected area of ink including light emitting elements.

Some embodiments of the present disclosure have been made in an effort to provide a manufacturing method of the above-mentioned display device.

An embodiment of the present disclosure provides a display device including: a substrate including a pixel area; and a pixel in the pixel area, the pixel including a first sub-light emitting area, a second sub-light emitting area, and a peripheral area surrounding the first and second sub-light emitting areas. The pixel may include: a first electrode, a second electrode, a third electrode, and a fourth electrode that are spaced from each other; a plurality of light emitting elements in the first and second sub-light emitting areas; a bank in the peripheral area and including a first opening corresponding to the first sub-light emitting area and a second opening corresponding to the second sub-light emitting area; and an intermediate bank between the first sub-light emitting area and the second sub-light emitting area and partially overlapping the second and third electrodes in a plan view.

At least one of at least one surface of the bank and at least one surface of the intermediate bank may include a liquid-repellent layer that is liquid-repellent-treated.

When viewed in a cross-sectional view, at least one of an upper surface of the bank and an upper surface of the intermediate bank may include the liquid-repellent layer. The liquid-repellent layer may be a layer containing fluorine (F).

When viewed in a cross-sectional view, each of a side surface of the bank and a side surface of the intermediate bank may not liquid-repellent-treated and may have a lyophilic characteristic.

The intermediate bank may be integrally provided with the bank to be connected to the bank. The intermediate bank may be spaced from the bank.

The intermediate bank may include a first sub-bank and a second sub-bank that are spaced from each other in a second direction different from a first direction. The first sub-bank may include a 1-1-th sub-bank and a 1-2-th sub-bank that are spaced from each other in the first direction, and the second sub-bank may include a 2-1-th sub-bank and a 2-2-th sub-bank that are spaced from each other in the first direction.

The intermediate bank may include a first sub-bank and a second sub-bank that are spaced from each other in a first direction.

The pixel may further include an insulating pattern in the peripheral area and overlapping the bank, and the insulating pattern may be located between the substrate and the bank.

The bank and the insulating pattern may have a same planar shape.

When viewed in a cross-sectional view, the intermediate bank and the bank may have different thicknesses. When viewed in a cross-sectional view, a thickness of the intermediate bank may be less than that of the bank.

The light emitting elements may include: at least one first light emitting element between the first electrode and the second electrode; and at least one second light emitting element between the third electrode and the fourth electrode.

The pixel may further include: a first contact electrode on the first electrode to connect one end portion of the first light emitting element and the first electrode; an intermediate electrode on each of the second and fourth electrodes to connect an other end portion of the first light emitting element and one end portion of the second light emitting element; and a second contact electrode on the third electrode to connect an other end portion of the second light emitting element and the third electrode.

The first electrode may include a 1-1-th electrode and a 1-2-th electrode that are spaced from each other and face each other along one direction; the second electrode may include a 2-1-th electrode and a 2-2-th electrode that are spaced from each other and face each other along the one direction; the third electrode may include a 3-1-th electrode and a 3-2-th electrode that are spaced from each other and face each other along the one direction; and the fourth electrode may include a 4-1-th electrode and a 4-2-th electrode that are spaced from each other and face each other along the one direction.

The light emitting elements may include: at least one first light emitting element between the 1-1-th electrode and the 2-1-th electrode; at least one second light emitting element between the 1-2-th electrode and the 2-2-th electrode; at least one third light emitting element between the 3-2-th electrode and the 4-2-th electrode; and at least one fourth light emitting element between the 4-1-th electrode and the 3-1-th electrode.

The first sub-light emitting area may include a 1-1-th sub-light emitting area and a 1-2-th sub-light emitting area spaced from each other along the one direction; and the second sub-light emitting area may include a 2-1-th sub-light emitting area and a 2-2-th sub-light emitting area spaced from each other along the one direction.

The intermediate bank may include: a first sub-bank between the 1-1-th sub-light emitting area and the 2-1-th sub-light emitting area and partially overlapping each of the 2-1-th and 3-1-th electrodes; and a second sub-bank between the 1-2-th sub-light emitting area and the 2-2-th sub-light emitting area and partially overlapping each of the 2-2-th and 3-2-th electrodes.

Another embodiment of the present invention provides a method of forming a pixel of a display device, the pixel being in at least one pixel area including a first sub-light emitting area, a second sub-light emitting area, and a peripheral area surrounding the first and second sub-light emitting areas, on a substrate. The method includes: forming a first electrode, a second electrode, a third electrode, and a fourth electrode that are spaced from each other on the substrate; forming an insulating layer on the first to fourth electrodes; forming an insulating pattern on one area of the insulating layer corresponding to the peripheral area; forming a bank on the insulating pattern, and forming an intermediate bank on one area of the insulating layer between the first sub-light emitting area and the second sub-light emitting area; performing a liquid-repellent treatment process using plasma to form a liquid-repellent layer on each of an upper surface of the bank and an upper surface of the intermediate bank; aligning a plurality of light emitting elements between the first electrode and the second electrode and between the third electrode and the fourth electrode, respectively; and forming a first contact electrode, a second contact electrode, and an intermediate electrode spaced from each other on the light emitting elements.

According to the display device and the manufacturing method thereof of embodiments of the present disclosure, an intermediate bank is added (or disposed) to each pixel, and a side surface of the intermediate bank has a lyophilic property, so that ink including a plurality of light emitting elements may be easily controlled.

In addition, according to embodiments of the present disclosure, by reducing or minimizing a non-ejected area of ink, it is possible to prevent or reduce defects due to the non-ejecting of the ink.

Effects and aspects according to embodiments of the present disclosure is not limited by what is illustrated in the above, and more various effects and aspects are included in the present disclosure.

BRIEF DESCRIPTION OF THE DRAWINGS

FIG. 10A-FIG. 10D illustrate schematic top plan views of the intermediate bank shown in FIG. 5 according to another embodiment.

FIG. 11A-FIG. 11I illustrate sequential schematic cross-sectional views of a manufacturing method of the pixel of FIG. 8A.

DETAILED DESCRIPTION

Figure 1:
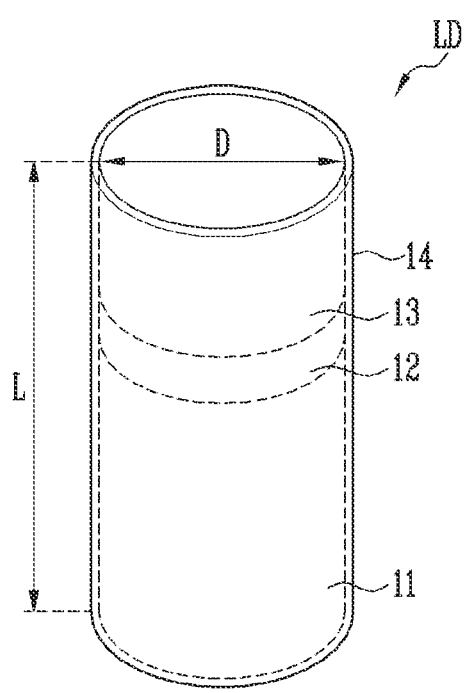
FIG. 1 illustrates a schematic perspective view of a light emitting element according to an embodiment of the present disclosure.

Because the present disclosure may be variously modified and have various forms, embodiments will be illustrated and described in detail in the following. This, however, by no means restricts the disclosure to the specific embodiments, and it is to be understood as embracing all included in the spirit and scope of the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the present disclosure is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In the present disclosure, when an element of a layer, film, region, area, plate, or the like is referred to as being formed "on" another element, the formed direction is not limited to an upper direction but includes a lateral or lower direction. In contrast, when an element of a layer, film, region, area, plate, or the like is referred to as being "below" another element, it may be directly below the other element, or intervening elements may be present.

It is to be understood that, in the present disclosure, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there is no other constituent element (for example, a third constituent element) between the one constituent element and the another constituent element.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, with reference to accompanying drawings, embodiments of the present disclosure and others that can be used by those skilled in the art to understand the contents of the present disclosure will be described in more detail. In the description below, singular forms are to include plural forms unless the context clearly indicates only the singular.

Figure 2:
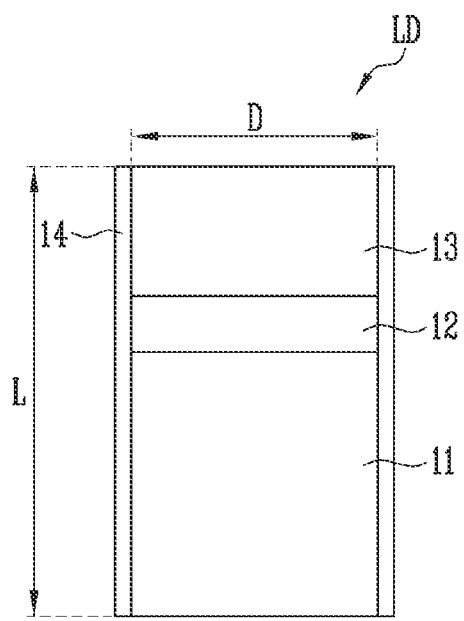
FIG. 2 illustrates a cross-sectional view of the light emitting element of FIG. 1.

FIG. 1 illustrates a schematic perspective view of a light emitting element according to an embodiment of the present disclosure, and FIG. 2 illustrates a cross-sectional view of the light emitting element of FIG. 1.

In an embodiment of the present disclosure, a type and/or shape of the light emitting element is not limited to embodiments shown in FIG. 1 and FIG. 2.

Referring to FIG. 1 and FIG. 2, a light emitting element LD may include a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 are sequentially stacked.

The light emitting element LD may be provided to have a shape extending in one direction. When the extending direction of the light emitting element LD is a length direction, the light emitting element LD may include one end portion (or lower end portion) and the other end portion (or upper end portion) along the extending direction. One of the first and second semiconductor layers 11 and 13 may be disposed at one end portion (or lower end portion) of the light emitting element LD, and the remaining semiconductor layers of the first and second semiconductor layers 11 and 13 may be disposed at the other end portion (or upper end portion) of the light emitting element LD. For example, the first semiconductor layer 11 may be disposed at one end portion (or lower end portion) of the light emitting element LD, and the second semiconductor layer 13 may be disposed at the other end portion (or upper end portion) of the light emitting element LD.

The light emitting element LD may be provided in various shapes. For example, the light emitting element LD may have a rod-like shape or a bar-like shape that is long in a length L direction (that is, an aspect ratio is greater than 1). In the embodiment of the present disclosure, a length L of the light emitting element LD in the length L direction may be larger than a diameter D thereof (or a width of a cross-section thereof). However, the present disclosure is not limited thereto, and in some embodiments, the light emitting element LD may have a short (that is, aspect ratio smaller than 1) rod or bar shape in the length L direction. Further, the light emitting element LD may have a rod or bar shape of which the length L and the diameter D are the same.

For example, the light emitting element LD may include a light emitting diode (LED) manufactured in a ultra-small size having the diameter D and/or the length L of nano scale to micro scale.

When the light emitting element LD is long in the length L direction (that is, the aspect ratio is larger than 1), the diameter D of the light emitting element LD may be about 0.5 µm to 6 µm, and the length L thereof may be about 1 µm to 10 µm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD is applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN, and may be a n-type semiconductor layer doped with a first conductive dopant (or n-type dopant) such as Si, Ge, Sn, or the like. However, the material included in the first semiconductor layer 11 is not limited thereto, and the first semiconductor layer 11 may be made of various materials. In the embodiment of the present disclosure, the first semiconductor layer 11 may include a gallium nitride (GaN) semiconductor material doped with the first conductive dopant (or n-type dopant). The first semiconductor layer 11 may include an upper surface contacting the active layer 12 along the direction of the length L of the light emitting element LD and a lower surface exposed to the outside. The lower surface of the first semiconductor layer 11 may be one end portion (or lower end portion) of the light emitting element LD.

The active layer 12 is disposed on the first semiconductor layer 11, and may be formed to have a single or multi-quantum well structure. For example, when the active layer 12 is formed of a multi-quantum well structure, the active layer 12 may have a structure in which a barrier layer, a strain reinforcing layer, and a well layer, which consist of one unit, are periodically and repeatedly stacked. Because the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of 400 nm to 900 nm, and may have a double hetero-structure. In the embodiment of the present disclosure, a cladding layer doped with a conductive dopant may be formed on upper and/or lower portions of the active layer 12 along the direction of the length L of the light emitting element LD. For example, the clad layer may be formed as an AlGaN layer or an InAlGaN layer. In some embodiments, a material such as AlGaN and InAlGaN may be used to form the active layer 12, and, various materials may also form the active layer 12. The active layer 12 may include a first surface contacting the first semiconductor layer 11 and a second surface contacting the second semiconductor layer 13.

When an electric field of a suitable voltage (e.g., a set or predetermined voltage) or more is applied to respective end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various light emitting devices in addition to pixels of a display device.

The second semiconductor layer 13 is disposed on the second surface of the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg. However, the material included in the second semiconductor layer 13 is not limited thereto, and the second semiconductor layer 13 may be formed of various materials. In the embodiment of the present disclosure, the second semiconductor layer 13 may include a gallium nitride (GaN) semiconductor material doped with the second conductive dopant (or p-type dopant). The second semiconductor layer 13 may include a lower surface contacting the second surface of the active layer 12 along the length L direction of the light emitting element LD and an upper surface exposed to the outside. Here, the upper surface of the second semiconductor layer 13 may be the other end portion (or upper end portion) of the light emitting element LD.

In the embodiment of the present disclosure, the first semiconductor layer 11 and the second semiconductor layer 13 may have different thicknesses from each other in the length L direction of the light emitting element LD. For example, the first semiconductor layer 11 may have a relatively thicker thickness than that of the second semiconductor layer 13 along the length L direction of the light emitting element LD. Accordingly, the active layer 12 of the light emitting element LD may be disposed to be closer to the upper surface of the second semiconductor layer 13 than the lower surface of the first semiconductor layer 11.

While it is illustrated that each of the first semiconductor layer 11 and the second semiconductor layer 13 is formed as one layer, the present disclosure is not limited thereto. In the embodiment of the present disclosure, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto.

In some embodiments, the light emitting element LD may further include an additional electrode (hereinafter referred to as a 'first additional electrode') disposed on the second semiconductor layer 13 in addition to the first semiconductor layer 11, the active layer 12, and the second semiconductor layer 13 described above. In another embodiment, another additional electrode (hereinafter referred to as a "second additional electrode") disposed on one end of the first semiconductor layer 11 may be further included.

Each of the first and second additional electrodes may be an ohmic contact electrode, but the present disclosure is not limited thereto. In some embodiments, the first and second additional electrodes may be a schottky contact electrode. The first and second additional electrodes may contain a conductive material. For example, the first and second additional electrodes may include an opaque metal in which chromium (Cr), titanium (Ti), aluminum (Al), gold (Au), nickel (Ni), and an oxide or alloy thereof are used alone or in combination, but the present disclosure is not limited thereto. In some embodiments, the first and second additional electrodes may include a transparent conductive oxide such as an indium tin oxide (ITO), an indium zinc oxide (IZO), a zinc oxide (ZnO), an indium gallium zinc oxide (IGZO), and an indium tin zinc oxide (ITZO).

Materials included in the first and second additional electrodes may be the same or different from each other. The first and second additional electrodes may be substantially transparent or translucent. Accordingly, light generated by the light emitting element LD may transmit through each of the first and the second additional electrodes to be outputted to the outside of the light emitting element LD. In some embodiments, when the light generated by the light emitting element LD does not transmit through the first and the second additional electrodes and is discharged to the outside through an area except for respective end portions of the light emitting element LD, the first and the second additional electrodes may include an opaque metal.

In the embodiment of the present disclosure, the light emitting element LD may further include an insulating film 14. However, in some embodiments, the insulating film 14 may be omitted, or it may be provided so as to cover only some of the first semiconductor layer 11, the active layer 12, and the second semiconductor layer 13.

The insulating film 14 may prevent an electrical short circuit that may occur when the active layer 12 contacts conductive materials other than the first and second semiconductor layers 11 and 13 of the same light emitting element LD. Further, the insulating film 14 may reduce or minimize surface defects of the light emitting element LD to improve lifespan and luminous efficiency of the light emitting element LD. Also, when a plurality of light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The insulating film 14 may be provided in a form that entirely surrounds an outer peripheral surface (e.g., an outer circumferential surface) of a light emitting stacked structure including the first semiconductor layer 11, the active layer 12, and the second semiconductor layer 13.

In the above-described embodiment, the structure in which the insulating film 14 entirely surrounds the outer peripheral surfaces (e.g., the outer circumferential surfaces) of the first semiconductor layer 11, the active layer 12, and the second semiconductor layer 13 is described, but the present disclosure is not limited thereto. In some embodiments, when the light emitting element LD includes a first additional electrode, the insulating film 14 may entirely surround the outer peripheral surface (e.g., the outer circumferential surface) of each of the first semiconductor layer 11, the active layer 12, the second semiconductor layer 13, and the first additional electrode. According to another embodiment, the insulating film 14 may not entirely surround the outer peripheral surface (e.g., the outer circumferential surface) of the first additional electrode, or may only surround a portion of the outer peripheral surface (e.g., the outer circumferential surface) of the first additional electrode and may not surround the remaining portion of the external peripheral surface (e.g., an external circumferential surface) of the first additional electrode. In some embodiments, when the first additional electrode is disposed at the other end portion (or an upper end portion) of the light emitting element LD and a second additional electrode is disposed at one end portion (or a lower end portion) of the light emitting element LD, the insulating film 14 may expose at least one area of each of the first and second additional electrodes.

The insulating film 14 may include a transparent insulating material. For example, the insulating film 14 may include at least one or more of insulating materials of a silicon oxide (SiOx), a silicon nitride (SiNx), a silicon oxynitride (SiOxNy), an aluminum oxide (AlOx), a titanium oxide (TiOx), a hafnium oxide (HfOx), a titanium strontium oxide (SrTiOx), a cobalt oxide (CoxOy), a magnesium oxide (MgO), a zinc oxide (ZnO), a ruthenium oxide (RuOx), a nickel oxide (NiO), a tungsten oxide (WOx), tantalum oxide (TaOx), a gadolinium oxide (GdOx), a zirconium oxide (ZrOx), a gallium oxide (GaOx), a vanadium oxide (VxOy), ZnO:Al, ZnO:B, InxOy:H, a niobium oxide (NbxOy), a fluorinated magnesium (MgFx), a fluorinated aluminum (AlFx), an alucone polymer film, a titanium nitride (TiN), a tantalum nitride (TaN), an aluminum nitride (AlNx), a gallium nitride (GaN), a tungsten nitride (WN), a hafnium nitride (HfN), a niobium nitride (NbN), gadolinium nitride (GdN), a zirconium nitride (ZrN), and a vanadium nitride (VN), but the present disclosure is not limited thereto, and various materials having insulating properties may be used as the material of the insulating film 14.

The insulating film 14 may be provided as a single film, or may be provided as a multi-film including at least a double film. For example, when the insulating film 14 is configured as a double film including a first layer and a second layer that are sequentially stacked, the first layer and the second layer may be made of different materials (or substances), and may be formed by different processes. In some embodiments, the first layer and the second layer may contain the same material.

In some embodiments, the light emitting element LD may be implemented in a light emitting pattern having a core-shell structure. In this case, the above-described first semiconductor layer 11 may be positioned at a core, that is, a middle (or center or central region) of the light emitting element LD, and the active layer 12 may surround the outer peripheral surface (e.g., the outer circumferential surface) of the first semiconductor layer 11, and the second semiconductor layer 13 may be provided and/or formed to surround the active layer 12 along the outer peripheral surface of the active layer 12. Further, the light emitting element LD may further include an additional electrode surrounding at least one side of the second semiconductor layer 13. In some embodiments, the light emitting element LD may further include the insulating film 14 provided on the outer peripheral surface (e.g., the outer circumferential surface) of the light emitting pattern having a core-shell structure and including a transparent insulating material. The light emitting element LD implemented in the light emitting pattern having the core-shell structure may be manufactured by a growth method.

The above-described light emitting element LD may be used as a light emitting source (or light source) for various display devices. The light emitting element LD may be manufactured through a surface treatment process. For example, when the plurality of light emitting elements LD are mixed with a fluid solution (or a solvent) and supplied to each pixel area (for example, a light emitting area of each pixel or a light emitting area of each sub pixel), each light emitting element LD may be surface-treated so that the light emitting elements LD may not be non-uniformly aggregated in the solution and may be uniformly sprayed.

A light emitting unit (or light emitting device) including the above-described light emitting element LD may be used in various types of electronic devices that require a light source in addition to the display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
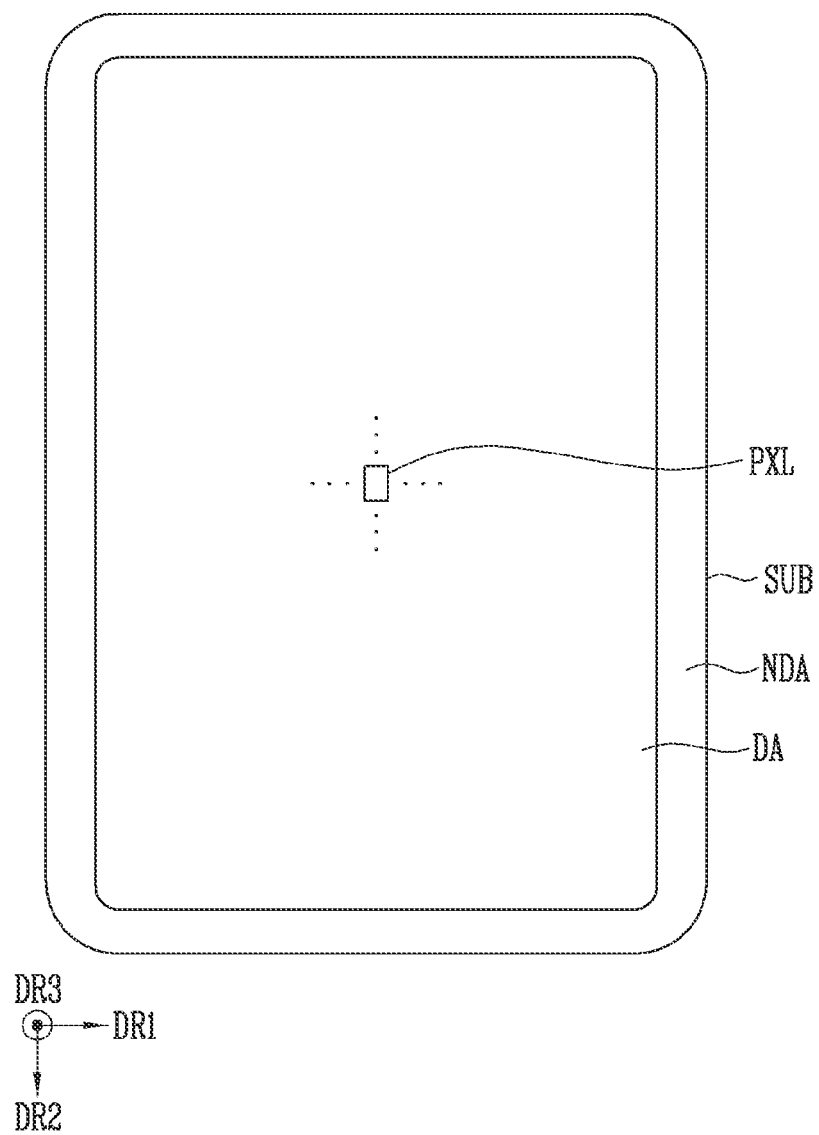
FIG. 3 illustrates a display device according to an embodiment of the present disclosure, for example, a schematic top plan view of a display device using the light emitting elements shown in FIG. 1 and FIG. 2 as a light source.

FIG. 3 illustrates a display device according to an embodiment of the present disclosure, particularly, a schematic top plan view of a display device using the light emitting elements shown in FIG. 1 and FIG. 2 as a light source.

In FIG. 3, for convenience, a structure of the display device is briefly illustrated based on a display area DA on which an image is displayed.

Referring to FIG. 1-FIG. 3, the display device according to an embodiment of the present disclosure may include a substrate SUB, a plurality of pixels PXL provided on the substrate SUB and respectively including at least one light emitting element LD, a driver provided on the substrate SUB and driving the pixels PXL, and a wire part connecting the pixels PXL and the driver.

When the display device is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the present disclosure may be applied thereto.

The display device may be classified into a passive matrix type display device or an active matrix type display device according to a method of driving the light emitting element LD. For example, when the display device is implemented as the active matrix type display device, each of the pixels PXL may include a driving transistor for controlling an amount of current supplied to the light emitting element LD, a switching transistor for transmitting a data signal to the driving transistor, and the like.

The display device may be provided in various shapes, and as an example, may be provided in a rectangular plate shape having two pairs of sides parallel to each other, but the present disclosure is not limited thereto. When the display device is provided in the rectangular plate shape, one of the two pairs of sides may be provided to be longer than the other a pair of sides. For better understanding and ease of description, a case in which the display device has a rectangular shape with a pair of long sides and a pair of short sides is illustrated, and an extending direction of the long side is indicated as the second direction DR2, an extending direction of the short side is indicated as the first direction DR1, and a direction perpendicular to the extending directions of the long and short sides is indicated as the third direction DR3. The display device provided in the rectangular plate shape may have a round shape at a corner portion where one long side and one short side contact (or meet), but the present disclosure is not limited thereto.

The substrate SUB may include a display area DA and a non-display area NDA. The non-display area NDA may surround the display area DA along the edge or periphery of the display area DA.

The display area DA may be an area in which the pixels PXL for displaying an image are provided. The non-display area NDA may be an area in which the driver for driving the pixels PXL and a portion of the wire part for connecting the driving circuits and the pixels PXL are provided. For better understanding and ease of description, only one pixel PXL is shown in FIG. 3, but a plurality of pixels PXL may be substantially provided in the display area DA of the substrate SUB.

The non-display area NDA may be provided in at least one side of the display area DA. The non-display area NDA may surround a periphery (or edge) of the display area DA. The non-display area NDA may be provided with a wire part connected to the pixels PXL and a driver for driving the pixels PXL.

The wire part may electrically connect the driver and the pixels PXL. The wire part provides a signal to each pixel PXL, and it may be signal lines connected to each pixel PXL, for example, a fan-out line connected to a scan line, a data line, a light emitting control line, and the like. Further, the wire part is a fan-out line connected to signal lines connected to each pixel PXL, for example, connected to a control line, a sensing line, and the like, in order to compensate for changes in electrical characteristics of each pixel PXL in real time.

The substrate SUB may include a transparent insulating material to transmit light. The substrate SUB may be a rigid substrate or a flexible substrate.

One area on the substrate SUB is provided as the display area DA in which pixels PXL are disposed, and the remaining area on the substrate SUB may be provided as the non-display area NDA. For example, the substrate SUB may include the display area DA including pixel areas in which respective pixels PXL are disposed, and the non-display area NDA disposed around the display area DA (or adjacent to the display area DA).

Each of the pixels PXL may be provided in the display area DA on the substrate SUB. In the embodiment of the present disclosure, the pixels PXL may be arranged in the display area DA in a stripe arrangement or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each pixel PXL may include at least one or more light emitting element LD driven by corresponding scan and data signals. The light emitting element LD has a size as small as nano-scale to micro-scale, and may be mutually connected to light emitting elements disposed adjacent, in parallel, but the present disclosure is not limited thereto. The light emitting element LD may form a light source of each pixel PXL.

Each pixel PXL includes at least one light source, for example, the light emitting element LD shown in FIG. 1 driven by a signal (a set or predetermined signal) (for example, a scan signal and a data signal) and/or a power source (e.g., a set or predetermined power source) (for example, a first driving power source and a second driving power source). However, in the embodiment of the present disclosure, the type of the light emitting element LD that may be used as the light source of each pixel PXL is not limited thereto.

The driver may provide a signal (e.g., a set or predetermined signal) and a power (e.g., from a set or predetermined power source) to each pixel PXL through the wire part, thereby controlling driving of the pixel PXL. The driver may include a scan driver, a light emission driver, and a data driver, and a timing controller.

Figure 4:
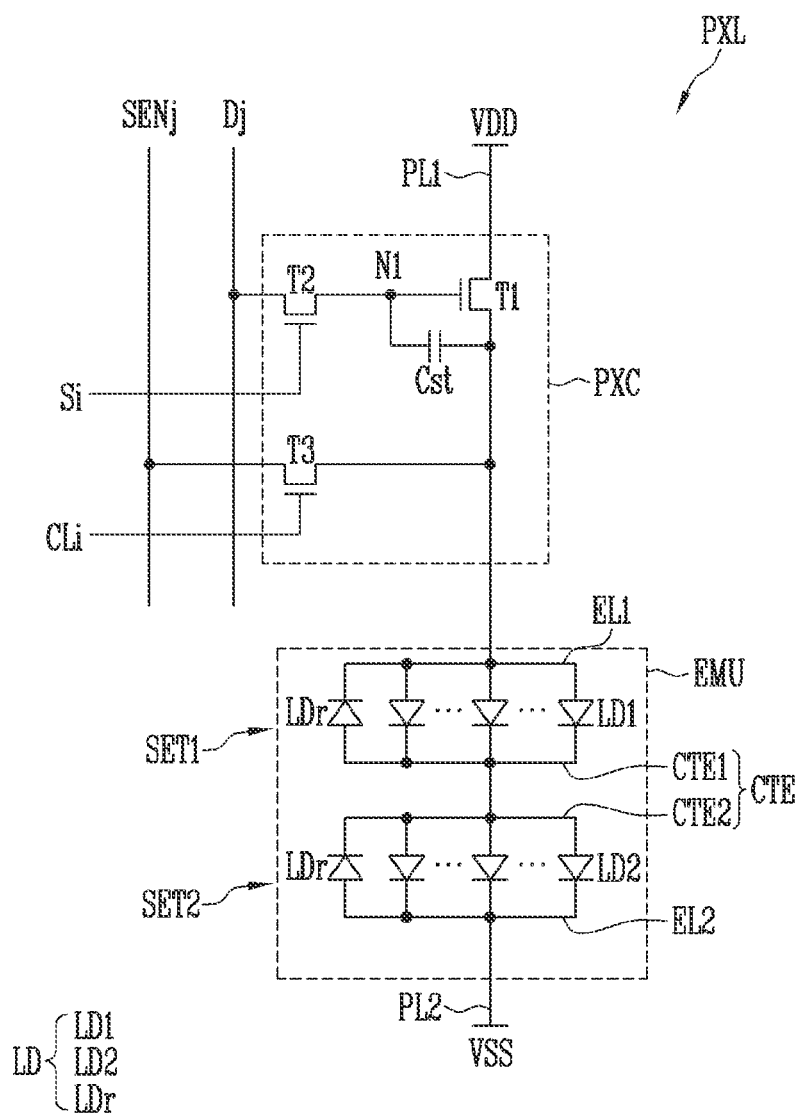
FIG. 4 illustrates a circuit diagram of an electrical connection relationship between constituent elements included in one pixel shown in FIG. 3 according to an embodiment.

FIG. 4 illustrates a circuit diagram of an electrical connection relationship between constituent elements included in one pixel shown in FIG. 3 according to an embodiment.

For example, FIG. 4 illustrates an electrical connection relationship between constituent elements included in a pixel PXL applicable to an active display device according to an embodiment. However, the types of constituent elements included in the pixel PXL to which the embodiment of the present disclosure may be applied are not limited thereto.

In FIG. 4, not only the constituent elements included in each of the pixels PXL illustrated in FIG. 3 but also the area in which the constituent elements are provided are comprehensively referred to as the pixel PXL.

Referring to FIG. 1-FIG. 4, one pixel PXL (hereinafter referred to as a 'pixel') may include a light emitting unit EMU that generates luminance light corresponding to a data signal. Further, the pixel PXL may further selectively include a pixel circuit PXC for driving the light emitting unit EMU.

In some embodiments, the light emitting unit EMU may include a plurality of light emitting elements LD connected in parallel between the first power line PL1 that is connected to the first driving power source VDD to receive the voltage of the first driving power source VDD and the second power line PL2 that is connected to the second driving power source VSS to receive the voltage of the second driving power source VSS. For example, the light emitting unit EMU may include a first electrode EL1 (also referred to as a "first alignment electrode") connected to the first power source VDD via the pixel circuit PXC and the first power line PL1, a second electrode EL2 (also referred to as a "second alignment electrode") connected to the second power source VSS through the second power line PL2, and a plurality of light emitting elements LD connected in parallel in the same direction between the first and second electrodes EL1 and EL2. In the embodiment of the present disclosure, the first electrode EL1 may be an anode, and the second electrode EL2 may be a cathode.

Each of the light emitting elements LD included in the light emitting unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first electrode EL1 and the second electrode EL2 respectively supplied with voltages of different potentials may form respective effective light source. These effective light sources may be collected to form the light emitting unit EMU of the pixel PXL.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

While the embodiment in which respective end portions of the light emitting elements LD are connected in the same direction between the first and second driving power sources VDD and VSS is illustrated, the present disclosure is not limited thereto. In some embodiments, the light emitting unit EMU may further include at least one ineffective light source, for example, a reverse light emitting element LDr, in addition to the light emitting elements LD forming respective effective light sources. The reverse light emitting element LDr is connected in parallel between the first and second electrodes EL1 and EL2 together with the light emitting elements LD forming the effective light sources, but may be connected between the first and second electrodes EL1 and EL2 in the opposite direction with respect to the light emitting elements LD. The reverse light emitting element LDr maintains an inactive state even when a driving voltage (e.g., a set or predetermined driving voltage) (for example, a driving voltage in the forward direction) is applied between the first and second electrodes EL1 and EL2, thus a current does not substantially flow in the reverse light emitting element LDr.

The pixel circuit PXC may be connected to a scan line Si and a data line Dj of the pixel PXL. For example, when the pixel PXL is disposed in an i-th (i is a natural number) row and a j-th (j is a natural number) column of the display area DA, the pixel circuit PXC of the pixel PXL may be connected to an i-th scan line Si and a j-th data line Dj of the display area DA. Further, the pixel circuit PXC may be connected to an i-th control line CLi and a j-th sensing line SENj of the display area DA.

The pixel circuit PXC described above may include first to third transistors T1, T2, and T3 and a storage capacitor Cst.

A first terminal of the first transistor T1 (e.g., a driving transistor) may be connected to the first driving power source VDD, and a second terminal thereof may be electrically connected to the first electrode EL1 of each of the light emitting elements LD. A gate electrode of the first transistor T1 may be connected to a first node N1. The first transistor T1 may control an amount of driving current supplied to the light emitting elements LD in response to a voltage of the first node N1.

A first terminal of the second transistor T2 (e.g., a switching transistor) may be connected to the j-th data line Dj, and a second terminal thereof may be connected to the first node N1. Here, the first terminal and the second terminal of the second transistor T2 are different terminals, and for example, when the first terminal is a source electrode, the second terminal may be a drain electrode. Further, a gate electrode of the second transistor T2 may be connected to the i-th scan line Si.

The second transistor T2 is turned on when a scan signal of a voltage capable of turning on the second transistor T2 (e.g., a high level voltage) is supplied from the i-th scan line Si to electrically connect the j-th data line Dj and the first node N1. In this case, a data signal of a corresponding frame is supplied to the j-th data line Dj, and accordingly, the data signal is transmitted to the first node N1. The data signal transmitted to the first node N1 is charged in the storage capacitor Cst. For example, the storage capacitor Cst is charged to a voltage corresponding to the data signal transmitted to the first node N1.

The third transistor T3 may be connected between the first transistor T1 and the j-th sensing line SENj. For example, a first terminal of the third transistor T3 may be connected to the second terminal (for example, the source electrode) of the first transistor T1 connected to the first electrode EL1, and a second terminal of the third transistor T3 may be connected to the j-th sensing line SENj. A gate electrode of the third transistor T3 may be connected to the i-th control line CLi. The third transistor T3 is turned on by a control signal of a gate-on voltage (e.g., a high level voltage) supplied to the i-th control line CLi during a sensing period (e.g., a set or predetermined sensing period) to electrically connect the j-th sensing line SENj to the first transistor T1.

The sensing period may be a period for extracting characteristic information (for example, a threshold voltage of the first transistor T1) of each of the pixels PXL disposed in the display area DA.

One electrode of the storage capacitor Cst may be connected to the first node N1, and the other electrode may be connected to the second terminal (for example, the source electrode) of the first transistor T1 connected to the first electrode EL1. The storage capacitor Cst may charge a voltage corresponding to the data signal supplied to the first node N1, and may maintain the charged voltage until a data signal of a next frame is supplied.

Each light emitting unit EMU may be configured to include at least one serial stage including a plurality of light emitting elements LD connected in parallel to each other. That is, the light emitting unit EMU may be configured in a series/parallel mixed structure as shown in FIG. 4.

The light emitting unit EMU may include first and second serial stages SET1 and SET2 sequentially connected between the first and second driving power sources VDD and VSS. Each of the first and second serial stages SET1 and SET2 may include two electrodes (EL1 and CTE1, CTE2 and EL2) configuring an electrode pair of the corresponding serial stage, and a plurality of light emitting elements LD connected in parallel in the same direction between the two electrodes (EL1 and CTE1, CTE2 and EL2).

The first serial stage SET1 includes the first electrode EL1 and the first intermediate electrode CTE1, and it may include at least one first light emitting element LD1 connected between the first electrode EL1 and the first intermediate electrode CTE1. Further, the first serial stage SET1 may include a reverse direction light emitting element LDr connected to the first light emitting element LD1 in an opposite direction between the first electrode EL1 and the first intermediate electrode CTE1.

The second serial stage SET2 includes the second intermediate electrode CTE2 and the second electrode EL2, and it may include at least one second light emitting element LD2 connected between the second intermediate electrode CTE2 and the second electrode EL2. Further, the second serial stage SET2 may include a reverse direction light emitting element LDr connected to the second light emitting element LD2 in an opposite direction between the second electrode EL2 and the second intermediate electrode CTE2.

The first intermediate electrode CTE1 of the first serial stage SET1 and the second intermediate electrode CTE2 of the second serial stage SET2 are integrally provided to be connected to each other. That is, the first intermediate electrode CTE1 and the second intermediate electrode CTE2 may form an intermediate electrode CTE that electrically connects the continuous first serial stage SET1 and second serial stage SET2. When the first intermediate electrode CTE1 and the second intermediate electrode CTE2 are integrally provided, the first intermediate electrode CTE1 and the second intermediate electrode CTE2 may be different areas of the intermediate electrode CTE.

In the above-described embodiment, the first electrode EL1 of the first serial stage SET1 may be an anode electrode of the light emitting unit EMU of each pixel PXL, and the second electrode EL2 of the second serial stage SET2 may be a cathode electrode of the light emitting unit EMU.

FIG. 4 discloses the embodiment in which all of the first to third transistors T1 to T3 are N-type transistors, but the present disclosure is not limited thereto. For example, at least one of the first to third transistors T1 and T3 described above may be changed to a P-type transistor. Further, although FIG. 4 discloses the embodiment in which the light emitting unit EMU is connected between the pixel circuit PXC and the second driving power source VSS, the light emitting unit EMU may also be connected between the first driving power source VDD and the pixel circuit PXC.

The structure of the pixel circuit PXC may be variously changed. For example, the pixel circuit PXC may additionally include other circuit elements such as at least one transistor element such as a transistor element for initializing the first node N1 and/or a transistor element for controlling a light emission time of the light emitting elements LD, or a boosting capacitor for boosting the voltage of the first node N1.

The structure of the pixel PXL that may be applied to the present disclosure is not limited to the embodiment illustrated in FIG. 4, and the corresponding pixel PXL may have various structures. For example, each pixel PXL may be configured inside a passive light emitting display device or the like. In this case, the pixel circuit PXC may be omitted, and respective end portions of the light emitting elements LD included in the light emitting unit EMU may be directly connected to the i-th scan line Si, the j-th data line Dj, the first power line PL1 to which the first driving power source VDD is applied, the second power line PL2 to which the second driving power source VSS is applied, and/or a control line (e.g., a set or predetermined control line, e.g., CLi).

Figure 5:
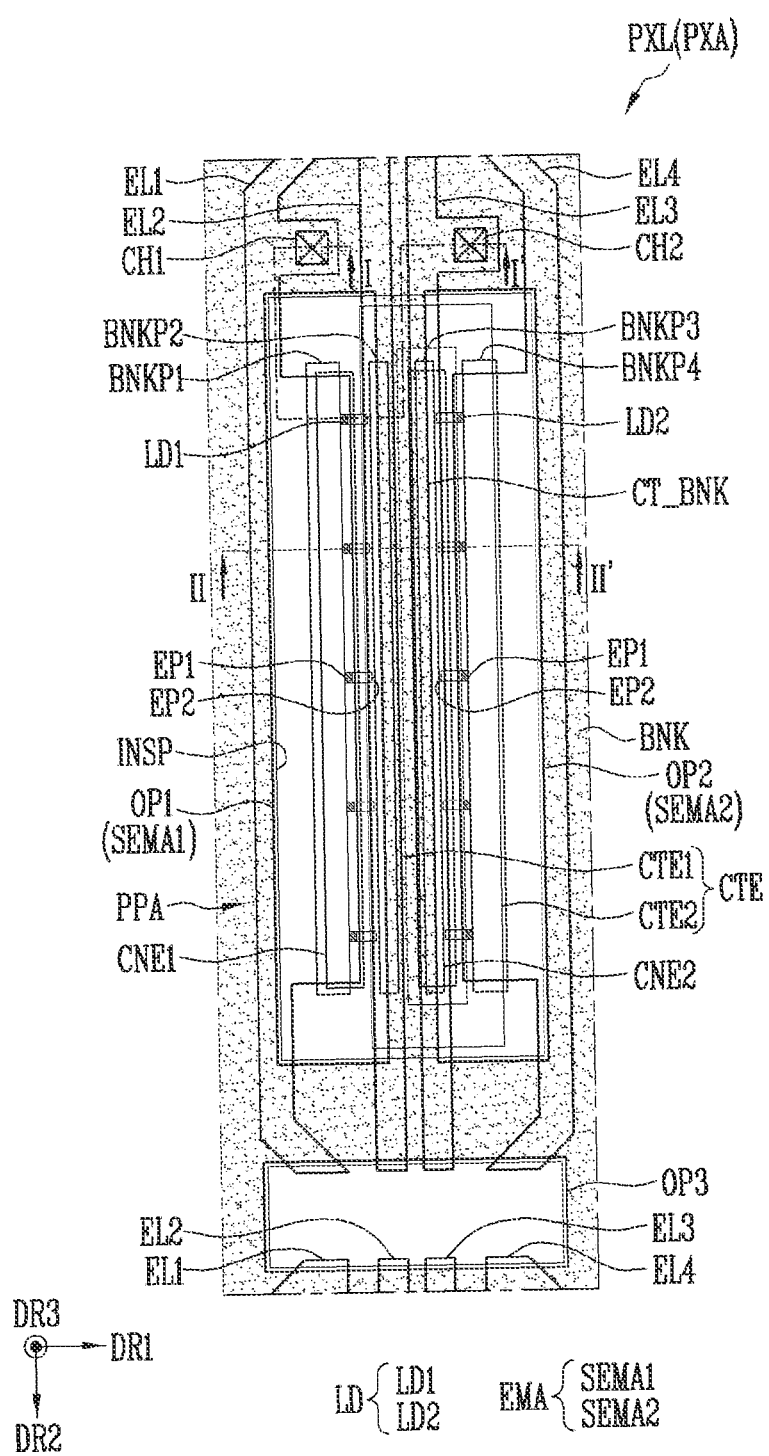
FIG. 5 illustrates a schematic top plan view of one of the pixels shown in FIG. 3.
Figure 6:
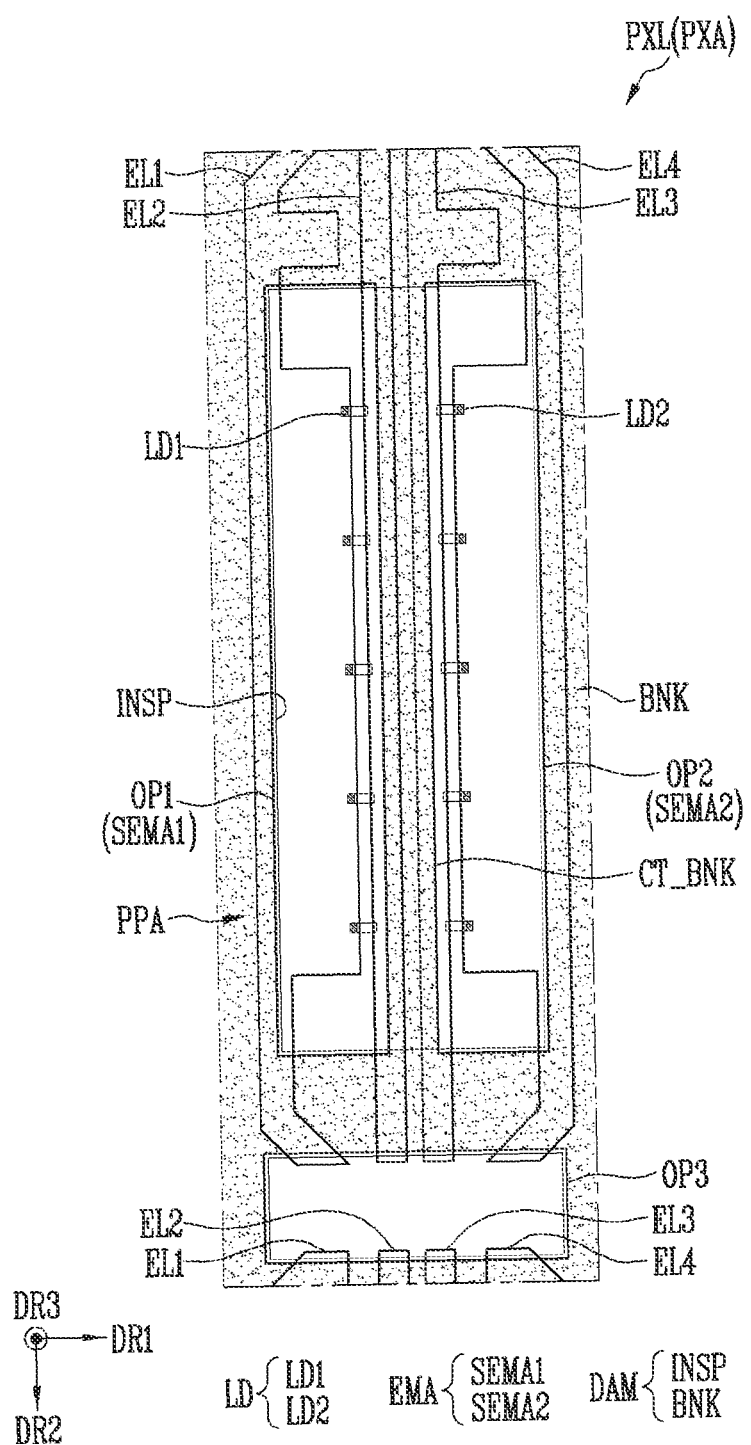
FIG. 6 illustrates a schematic top plan view of a bank, an intermediate bank, first to fourth electrodes, and light emitting elements, which are included in the pixel of FIG. 5.

FIG. 5 illustrates a schematic top plan view of one of the pixels shown in FIG. 3, and FIG. 6 illustrates a schematic top plan view of a bank, an intermediate bank, first to fourth electrodes, and light emitting elements that are included in the pixel of FIG. 5.

In FIG. 5, for convenience, the transistors T electrically connected to the light emitting elements LD and the signal lines electrically connected to the transistors T are omitted.

In the embodiment of the present disclosure, for better understanding and ease of description, a horizontal direction in a plan view is indicated by the first direction DR1, a vertical direction in a plan view is indicated by the second direction DR2, and a thickness direction of the substrate SUB in a plan view is indicated by the third direction DR3. The first to third directions DR1, DR2, and DR3 may refer to directions indicated by the first to third directions DR1, DR2, and DR3, respectively.

Referring to FIG. 3, FIG. 5, and FIG. 6, each pixel PXL may be provided and/or formed in a pixel area PXA provided on the substrate SUB. The pixel area PXA may include a light emitting area EMA and a peripheral area PPA. Here, the peripheral area PPA may include a non-light emitting area from which light is not emitted. In the embodiment, the light emitting area EMA may include a first sub-light emitting area SEMA1 and a second sub-light emitting area SEMA2.

In some embodiments, each pixel PXL may include a bank BNK disposed in the peripheral area PPA.

The bank BNK may be a structure that defines (or partitions) the pixel area PXA or light emitting area EMA of each of a corresponding pixel PXL and pixels adjacent thereto, and for example, may be a pixel defining film. For example, the pixel area PXA in which each pixel PXL is provided may include the first sub-light emitting area SEMA1 and the second sub-light emitting area SEMA2 partitioned by a bank BNK. However, the present disclosure is not limited thereto, and in some embodiments, the pixel area PXA may be partitioned to include one light emitting area EMA by the bank BNK. Alternatively, when each pixel PXL includes a light emitting unit (see the EMU in FIG. 4) including four serial stages, the pixel area PXA in which the pixel PXL is provided may also be partitioned into four light emitting areas EMA. A description of the embodiment partitioned into four light emitting areas EMA will be described later with reference to FIG. 17, for example.

In the described embodiment, the bank BNK may be a pixel defining film or a dam structure that defines each light emitting area EMA in which the light emitting elements LD should be supplied in a process of supplying (or injecting) light emitting elements LD to each pixel PXL. For example, the light emitting area of each pixel PXL is partitioned by the bank BNK, so that a mixed solution (for example, an ink) including a target amount and/or type of light emitting element LD may be supplied to (or injected into) the light emitting area EMA.

The bank BNK may be configured to include at least one light blocking material and/or reflective material to prevent a light leakage defect in which light leaks between each pixel PXL and pixels PXL adjacent thereto. In some embodiments, the bank BNK may include a transparent material (or substance). The transparent material may include, for example, a polyamides resin, a polyimide resin, and the like, but the present disclosure is not limited thereto. According to another embodiment, a reflective material layer may be separately provided and/or formed on the bank BNK to further improve an efficiency of light emitted from each of the pixels PXL.

The bank BNK may include at least one or more of openings exposing components disposed under the bank BNK in the pixel area PXA of the corresponding pixel PXL. As an example, the bank BNK may include first to third openings OP1, OP2, and OP3 exposing components disposed under the bank BNK in the pixel area PXA of the corresponding pixel PXL. In the described embodiment, the light emitting area EMA of each pixel PXL and the first and second openings OP1 and OP2 of the bank BNK may correspond to each other. For example, the first sub-light emitting area SEMA1 of each pixel PXL may correspond to the first opening OP1 of the bank BNK, and the second sub-light emitting area SEMA2 of the corresponding pixel PXL may correspond to the second opening OP2 of the bank BNK.

In the pixel area PXA, the third opening OP3 of the bank BNK may be disposed to be spaced from the first and second openings OP1 and OP2, and may be disposed to be adjacent to one side (for example, upper or lower side) of the pixel area PXA. For example, the third opening OP3 of the bank BNK may be adjacent to the lower side of the pixel area PXA.

Each pixel PXL may include a first electrode EL1, a second electrode EL2, a third electrode EL3, and a fourth electrode EL4 spaced from each other in the first direction DR1.

The first electrode EL1, the second electrode EL2, the third electrode EL3, and the fourth electrode EL4 may be sequentially arranged along the first direction DR1. The first electrode EL1, the second electrode EL2, the third electrode EL3, and the fourth electrode EL4 may be extended in a direction that is different from the first direction DR1, for example, the second direction DR2 crossing the first direction DR1. Each end portion of the first to fourth electrodes EL1, EL2, EL3, and EL4 may be disposed within the third opening OP3 of the bank BNK. After the light emitting elements LD are supplied and arranged in the pixel area PXA during the manufacturing process of the display device, the first to fourth electrodes EL1, EL2, EL3, and EL4 may be separated from other electrodes (for example, the first to fourth electrodes EL1, EL2, EL3, and EL4 provided to the pixels PXL adjacent in the second direction DR2) in the third opening OP3. The third opening OP3 of the bank BNK may be provided for a separation process with respect to the first electrode EL1, the second electrode EL2, the third electrode EL3, and the fourth electrode EL4.

The first electrode EL1 may include a protrusion protruding in the first direction DR1 toward the second electrode EL2 in the light emitting area EMA of each pixel PXL. The protrusion of the first electrode EL1 may be provided so that the first electrode EL1 and the second electrode EL2 is maintained by an interval (e.g., a set or predetermined interval) in the light emitting area EMA of the corresponding pixel PXL. Similarly, the fourth electrode EL4 may include a protrusion protruding in a direction opposite to the first direction DR1 toward the third electrode EL3 in the light emitting area EMA. The protrusion of the fourth electrode EL4 may be provided so that the third electrode EL3 and the fourth electrode EL4 is maintained by an interval (e.g., a set or predetermined interval) in the light emitting area EMA.

However, the first electrode EL1, the second electrode EL2, the third electrode EL3, and the fourth electrode EL4 are not limited thereto. For example, the shape and/or mutual arrangement relationship of the first electrode EL1, the second electrode EL2, the third electrode EL3, and the fourth electrode EL4 may be variously changed. For example, each of the first electrode EL1 and the fourth electrode EL4 may have a curved shape without including the protrusion. As another example, the second electrode EL2 and/or the third electrode EL3 may extend to adjacent pixels PXL in the second direction DR2.

The first electrode EL1 may be connected to the first transistor T1 described with reference to FIG. 4 through a first contact hole CH1, and the third electrode EL3 may be connected to the second driving power source VSS (or second power line PL2) described with reference to FIG. 4 through a second contact hole CH2. In the described embodiment, the first electrode EL1 may be the first electrode EL1 described with reference to FIG. 4, and the third electrode EL3 may be the second electrode EL2 described with reference to FIG. 4. That is, the first electrode EL1 may be an anode of the light emitting unit (see "EMU" in FIG. 4) of each pixel PXL, and the third electrode EL3 may be a cathode of the light emitting unit EMU.

In the pixel area PXA (or light emitting area EMA) of each pixel PXL, each of the first to fourth electrodes EL1, EL2, EL3, and EL4 may be disposed to be spaced from the adjacent electrode along the first direction DR1. For example, the first electrode EL1 may be disposed to be spaced from the second electrode EL2, the second electrode EL2 may be disposed to be spaced from the third electrode EL3, and the third electrode EL3 may be disposed to be spaced from the fourth electrode EL4. A shape between the first electrode EL1 and the second electrode EL2, a shape between the second electrode EL2 and the third electrode EL3, and a shape between the third electrode EL3 and the fourth electrode EL4 may be the same, but the present disclosure is not limited thereto. In some embodiments, the shape between the first electrode EL1 and the second electrode EL2, the shape between the second electrode EL2 and the third electrode EL3, and the shape between the third electrode EL3 and the fourth electrode EL4 may be different from each other.

Each of the first to fourth electrodes EL1, EL2, EL3, and EL4 may have a multi-layered structure including a reflective electrode and a conductive capping layer. Further, the reflective electrode may have a single-layered or multi-layered structure. As an example, the reflective electrode may include at least one opaque metal layer, and may selectively further include at least one transparent conductive layer that is disposed at an upper portion and/or a lower portion of the opaque metal layer.

Each of the first to fourth electrodes EL1, EL2, EL3, and EL4 may be used as an alignment electrode (or alignment wire) for alignment of the light emitting elements LD by receiving an alignment signal (e.g., a set or predetermined alignment signal) (or alignment voltage) from an alignment pad disposed in the non-display area (see 'NDA' in FIG. 3), before the light emitting elements LD are aligned in the light emitting area EMA of each pixel PXL.

The first electrode EL1, for example, may be used as a first alignment electrode (or first alignment wire) by receiving a first alignment signal (or first alignment voltage) from a first alignment pad. The second electrode EL2, for example, may be used as a second alignment electrode (or second alignment wire) by receiving a second alignment signal (or second alignment voltage) from a second alignment pad. Third electrode EL3, for example, may be used as a third alignment electrode (or third alignment wire) by receiving a third alignment signal (or third alignment voltage) from a third alignment pad. The fourth electrode EL4, for example, may be used as a fourth alignment electrode (or fourth alignment wire) by receiving a fourth alignment signal (or fourth alignment voltage) from a fourth alignment pad. In this case, the same alignment signal may be applied to the second electrode EL2 and the third electrode EL3.

The above-described first to fourth alignment signals may be signals having a voltage difference (e.g., a set or predetermined voltage difference) and/or a phase difference (e.g., a set or predetermined phase difference) so that light emitting elements LD may be aligned between the first to fourth electrodes EL1 to EL4. At least one of the first to fourth alignment signals may be an AC signal (or voltage), but the present disclosure is not limited thereto.

In some embodiments, each pixel PXL may include a support member supporting each of the first to fourth electrodes EL1, EL2, EL3, and EL4 in order to change a surface profile (or shape) of each of the first to fourth electrodes EL1, EL2, EL3, and EL4 so that light emitted from the light-emitting elements LD is guided in an image display direction (or front direction) of the display device. The above-described support member may include a first bank pattern BNKP1 overlapping one area of the first electrode EL1, a second bank pattern BNKP2 overlapping one area of the second electrode EL2, and a third bank pattern BNKP3 overlapping one area of the third electrode EL3, and a fourth bank pattern BNKP4 overlapping one area of the fourth electrode EL4.

The first bank pattern BNKP1, the second bank pattern BNKP2, the third bank pattern BNKP3, and the fourth bank pattern BNKP4 are disposed to be spaced from each other in the first direction DR1 in the pixel area PXA (or light emitting area EMA) of each pixel PXL, and may allow one area of each of the first electrode EL1, the second electrode EL2, the third electrode EL3, and the fourth electrode EL4 to upwardly protrude. For example, the first electrode EL1 (or the protrusion of the first electrode EL1) may be disposed on the first bank pattern BNKP1 to protrude in the third direction (that is, the thickness direction of the substrate SUB) by the first bank pattern BNKP1, the second electrode EL2 may be disposed on the second bank pattern BNKP2 to protrude in the third direction DR3 by the second bank pattern BNKP2, the third electrode EL3 may be disposed on the third bank pattern BNKP3 to protrude in the third direction DR3 by the third bank pattern BNKP3, and the fourth electrode EL4 (or the protrusion of the fourth electrode EL4) may be disposed on the fourth bank pattern BNKP4 to protrude in the third direction DR3 by the fourth bank pattern BNKP4.

Each pixel PXL may include a plurality of light emitting elements LD. The light emitting elements LD may include the first light emitting element LD1 and the second light emitting element LD2. In some embodiments, each pixel PXL may further include the reverse direction light emitting element LDr described with reference to FIG. 4.

At least two to several tens of light emitting elements LD may be aligned and/or provided in the pixel area PXA of each pixel PXL, but the number of the light emitting elements LD is not limited thereto. In some embodiments, the number of light emitting elements LD aligned and/or provided in the pixel area PXA may be variously changed.

The light emitting elements LD may be disposed between two adjacent electrodes of the first to fourth electrodes EL1, EL2, EL3, and EL4.

The first light emitting element LD1 may be disposed and/or aligned between the first electrode EL1 and the second electrode EL2. The first end portion EP1 (or one end portion) of the first light emitting element LD1 may face the first electrode EL1, and the second end portion EP2 (or the other end portion) of the first light emitting element LD1 may face the second electrode EL2. When a plurality of first light emitting elements LD1 are provided, the plurality of first light emitting elements LD1 may be mutually connected in parallel between the first electrode EL1 and the second electrode EL2, and may configure the first serial stage SET1 described with reference to FIG. 4 together with the first and second electrodes EL1 and EL2.

The second light emitting element LD2 may be disposed and/or aligned between the third electrode EL3 and the fourth electrode EL4. The first end portion EP1 (or one end portion) of the second light emitting element LD2 may face the fourth electrode EL4, and the second end portion EP2 (or the other end portion) of the second light emitting element LD2 may face the third electrode EL3. When a plurality of second light emitting elements LD2 are provided, the plurality of second light emitting elements LD2 may be mutually connected in parallel between the third electrode EL3 and the fourth electrode EL4, and may configure the second serial stage SET2 described with reference to FIG. 4 together with the third and fourth electrodes EL3 and EL4.

In the embodiment, the first end portion EP1 of the first light emitting element LD1 and the first end portion EP1 of the second light emitting element LD2 may include a semiconductor layer of the same type (for example, the second semiconductor layer 13 described with reference to FIG. 1). The second end portion EP2 of the first light emitting element LD1 and the second end portion EP2 of the second light emitting element LD2 may include a semiconductor layer of the same type (for example, the first semiconductor layer 11 described with reference to FIG. 1).

In FIG. 5 and FIG. 6, it is shown that the light emitting elements LD are aligned in the first direction DR1 between the first electrode EL1, the second electrode EL2, the third electrode EL3, and the fourth electrode EL4, but the alignment direction of the light emitting elements LD is not limited thereto. In some embodiments, at least one or more of the light emitting elements LD may be arranged in an oblique direction inclined to the first direction DR1 or the second direction DR2 between two adjacent electrodes of the first to fourth electrodes EL1, EL2, EL3, and EL4.

In the embodiment, the first end portion EP1 of the first light emitting element LD1 is not directly disposed on the first electrode EL1, but may be electrically and/or physically connected to the first electrode EL1 through at least one contact electrode, for example, the first contact electrode CNE1. Similarly, the second end portion EP2 of the second light emitting element LD2 is not directly disposed on the third electrode EL3, but may be electrically and/or physically connected to the third electrode EL3 through at least one contact electrode, for example, the second contact electrode CNE2.

Each of the light emitting elements LD may be an ultra-small light emitting diode using a material having an inorganic crystal structure, for example, having a size as small as nano-scale or micro-scale. For example, each of the light emitting elements LD may be the light emitting element LD described with reference to FIG. 1 and FIG. 2. Each of the light emitting elements LD may emit one of color light and/or white light.

The light emitting elements LD may be provided in a form dispersed in a solution (or ink) and may be injected (or supplied) to the light emitting area EMA of each pixel PXL. The light emitting elements LD may be injected (or supplied) into the light emitting area EMA of each pixel PXL through various methods including an inkjet printing method and a slit coating method. For example, the light emitting elements LD may be mixed with a volatile solvent and then injected (or supplied) into the light emitting area EMA through an inkjet printing method or a slit coating method. In this case, when an corresponding alignment signal is applied to each of the first to fourth electrodes EL1, EL2, EL3, and EL4, an electric field may be formed between two adjacent electrodes of the first to fourth electrodes EL1, EL2, EL3, and EL4. Accordingly, the light emitting elements LD may be aligned between two adjacent electrodes from among the first to fourth electrodes EL1, EL2, EL3, and EL4. As described above, because the same alignment signal is applied to each of the second and third electrodes EL2 and EL3, the light emitting elements LD may not be aligned between the second electrode EL2 and the third electrode EL3. However, the present disclosure is not limited thereto. In some embodiments, when an alignment signal is applied to each of the second and third electrodes EL2 and EL3, due to wire resistance of the two electrodes and influence of an electric field induced between adjacent electrodes, a potential difference may occur between the alignment signals applied to the second electrode EL2 and the third electrode EL3. In this case, the light emitting elements LD may be aligned between the second and third electrodes EL2 and EL3. After the light emitting elements LD are aligned, the light emitting elements LD may be stably aligned between the first to fourth electrodes EL1, EL2, EL3, and EL4, by volatilizing the solvent or eliminating the solvent through another method.

In some embodiments, each pixel PXL may include a first contact electrode CNE1, a second contact electrode CNE2, and an intermediate electrode CTE.

The first contact electrode CNE1, the second contact electrode CNE2, and the intermediate electrode CTE may be constituent elements that may electrically more stably connect the first to fourth electrodes EL1, EL2, EL3, and EL4 and the light emitting elements LD.

The first contact electrode CNE1 may be formed on the first end portion EP1 of the first light emitting element LD1 and on at least one area of the first electrode EL1 corresponding thereto to physically and/or electrically connect the first end portion EP1 of the first light emitting element LD1 to the first electrode EL1.

The first contact electrode CNE1 may have a bar shape extending along the second direction DR2 when viewed in a plan view, but the present disclosure is not limited thereto. In some embodiments, the shape of the first contact electrode CNE1 may be variously changed within a range in which it is electrically stably connected to the first end portion EP1 of the first light emitting element LD1. Further, the shape of the first contact electrode CNE1 may be variously changed in consideration of the connection relationship with the first electrode EL1 disposed therebelow.

The second contact electrode CNE2 may be formed on the second end portion EP2 of the second light emitting element LD2 and on at least one area of the third electrode EL3 corresponding thereto to physically and/or electrically connect the second end portion EP2 of the second light emitting element LD2 to the third electrode EL3.

The second contact electrode CNE2 may have a bar shape extending along the second direction DR2 when viewed in a plan view, but the present disclosure is not limited thereto. In some embodiments, the shape of the second contact electrode CNE2 may be variously changed within a range in which it is electrically stably connected to the second end portion EP2 of the second light emitting element LD2. Further, the shape of the second contact electrode CNE2 may be variously changed in consideration of the connection relationship with the third electrode EL3 disposed therebelow.

The intermediate electrode CTE may include a first intermediate electrode CTE1 and a second intermediate electrode CTE2 extending in the second direction DR2.

The first intermediate electrode CTE1 may be provided and/or formed on the second end portion EP2 of the first light emitting element LD1 and on at least one area of the second electrode EL2 corresponding thereto. The first intermediate electrode CTE1 may physically and/or electrically connect the second end portion EP2 of the first light emitting element LD1 to the second electrode EL2. In the embodiment, the first intermediate electrode CTE1 may be provided in a shape extending along the second direction DR2 between the first contact electrode CNE1 and the second contact electrode CNE2 in a plan view.

The second intermediate electrode CTE2 may be provided and/or formed on the first end portion EP1 of the second light emitting element LD2 and on at least one area of the fourth electrode EL4 corresponding thereto. The second intermediate electrode CTE2 may physically and/or electrically connect the first end portion EP1 of the second light emitting element LD2 to the fourth electrode EL4. In the embodiment, the second intermediate electrode CTE2 may be provided in a shape extending along the second direction DR2 between the second contact electrode CNE2 and the bank BNK disposed in the peripheral area PPA when viewed in a plan view.

The first intermediate electrode CTE1 and the second intermediate electrode CTE2 may be integrally provided to be connected to each other. The first intermediate electrode CTE1 and the second intermediate electrode CTE2 may be different areas of the intermediate electrode CTE. The first intermediate electrode CTE1 may have the same configuration as the first intermediate electrode CTE1 described with reference to FIG. 4, and the second intermediate electrode CTE2 may have the same configuration as the second intermediate electrode CTE2 described with reference to FIG. 4. The intermediate electrode CTE may be a bridge electrode (or a connection electrode) electrically connecting the second end portion EP2 of the first light emitting element LD1 and the first end portion EP1 of the second light emitting element LD2. That is, the intermediate electrode CTE may be a bridge electrode connecting the first serial stage SET1 and the second serial stage SET2.

The intermediate electrode CTE including the first intermediate electrode CTE1 and the second intermediate electrode CTE2, when viewed in a plan view, may have a closed loop shape that is spaced from the second contact electrode CNE2 and surrounds (or is around) a surrounding (or a periphery or a circumference) of the second contact electrode CNE2, but the present disclosure is not limited thereto. In some embodiments, the intermediate electrode CTE may be changed in various shapes within a range in which it stably connects the consecutive first and second serial stages SET1 and SET2. As an example, the intermediate electrode CTE may have a shape surrounding (or a shape that is around) the remaining area of the second contact electrode CNE2 except for at least one area of the second contact electrode CNE2, for example, a shape that does not form a complete closed loop and is partially opened.

The first contact electrode CNE1, the second contact electrode CNE2, and the intermediate electrode CTE may be disposed to be spaced from each other in a plan view.

The first contact electrode CNE1 may face an area of the intermediate electrode CTE, for example, the first intermediate electrode CTE1. The first contact electrode CNE1 and the first intermediate electrode CTE1 may extend in the same direction, for example, the second direction DR2, and may be spaced from each other in the first direction DR1.

The second contact electrode CNE2 may face another area of the intermediate electrode CTE, for example, the second intermediate electrode CTE2. The second contact electrode CNE2 and the second intermediate electrode CTE2 may extend in the second direction DR2, and may be spaced from each other in the first direction DR1.

In some embodiments, each pixel PXL may further include an insulating pattern INSP and an intermediate bank CT_BNK.

The insulating pattern INSP may be disposed in the peripheral area PPA of each pixel PXL, and overlap the bank BNK. For example, the insulating pattern INSP may be formed in the peripheral area PPA of each pixel PXL in which the bank BNK is disposed to have the same planar shape as the bank BNK. However, the present disclosure is not limited thereto, and in some embodiments, the insulating pattern INSP may be formed in the peripheral area PPA of each pixel PXL so as to correspond only to the bank BNK extending in the second direction DR2. In this case, the insulating pattern INSP may not be disposed below the bank BNK extending in the first direction DR1.

The insulating pattern INSP supports the bank BNK disposed in the peripheral area PPA to allow a thickness of the bank BNK to be thicker than a thickness (e.g., a set or predetermined thickness) in the third direction DR3, so that when ink including the light emitting elements LD is supplied (or injected) into the pixel area PXA (or the light emitting area EMA) of each pixel PXL, it is possible to prevent the ink from flowing into the pixel area (or light emitting area) of pixels PXL adjacent to the corresponding pixel PXL. The insulating pattern INSP may be made of an organic insulating material including an organic material that is suitable in stably supporting the bank BNK and maintaining the thickness of the bank BNK at a suitable thickness (e.g., a set or predetermined thickness) or more.

The insulating pattern INSP may implement a dam part DAM together with the bank BNK. The dam unit DAM may be a structure that controls an amount of ink including a target amount and/or type of light emitting element LD in the light emitting area EMA of each pixel PXL.

The intermediate bank CT_BNK may be provided between the first sub-light emitting area SEMA1 and the second sub-light emitting area SEMA2 of each pixel PXL. The intermediate bank CT_BNK may be integrally provided with the bank BNK disposed in the peripheral area PPA of each pixel PXL to be connected to the bank BNK. When the intermediate bank CT_BNK and the bank BNK are integrally provided, the intermediate bank CT_BNK may be one area of the bank BNK.

The intermediate bank CT_BNK may include the same material (or substance) as the bank BNK. The intermediate bank CT_BNK may be disposed to be close to a center of the light emitting area EMA of each pixel PXL when viewed in a plan view. In the embodiment, the intermediate bank CT_BNK may be configured to be stepped from the bank BNK in the third direction DR3. For example, the intermediate bank CT_BNK may have a thickness thinner than that of the bank BNK in the third direction DR3. A detailed description of this will be described later with reference to FIG. 7-FIG. 8B.

The intermediate bank CT_BNK may be disposed between the first sub-light emitting area SEMA1 and the second sub-light emitting area SEMA2 of each pixel PXL to partially overlap the second and third electrodes EL2 and EL3. For example, the intermediate bank CT_BNK may be provided in at least one area of the second electrode EL2 and at least one area of the third electrode EL3 to partially overlap the second and third electrodes EL2 and EL3.

In a process of spraying ink into each pixel PXL, when the ink is ejected only into one area of areas (for example, areas corresponding to a printing nozzles) determined as an ink ejection position of the pixel PXL and the ink is not ejected to one or more other areas thereof, the intermediate bank CT_BNK may be a structure for controlling droplet spreading that allows the ink ejected only into the one area to disperse (or spread) in the one or more other areas. That is, the intermediate bank CT_BNK may be a droplet spreading control structure for dispersing ink together with the bank BNK.

In the described embodiment, each of the intermediate bank CT_BNK and the bank BNK may include a liquid-repellent layer treated with a liquid-repellent and an area having a lyophilic characteristic without liquid-repellent treatment. This will be described in detail with reference to FIG. 7-FIG. 8B.

Hereinafter, a stacked structure of each pixel PXL according to the above-described embodiment will be mainly described with reference to FIG. 7-FIG. 8B.

Figure 7:
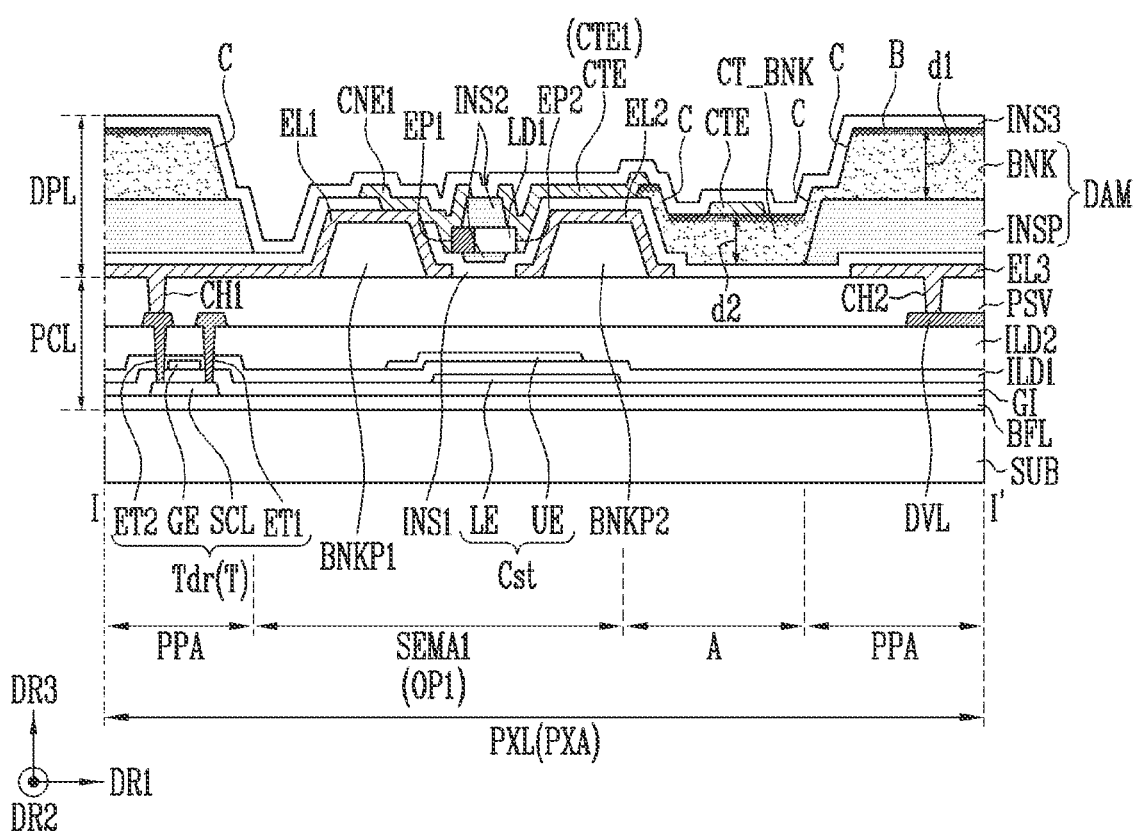
FIG. 7 illustrates a cross-sectional view taken along the line I-I' of FIG. 5.
Figure 8A:
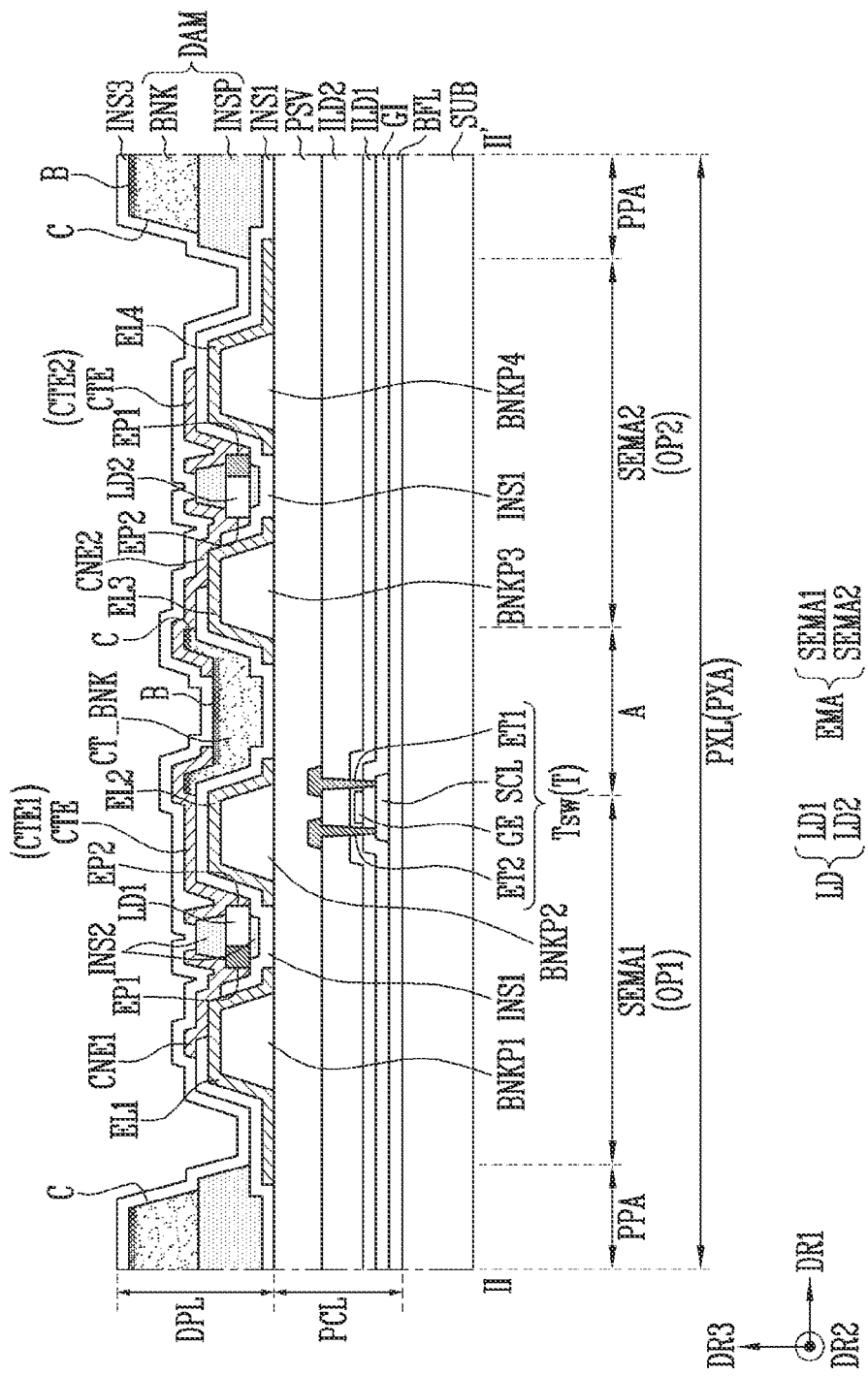
FIG. 8A and FIG. 8B illustrate cross-sectional views taken along the line II-II' of FIG. 5.
Figure 8B:
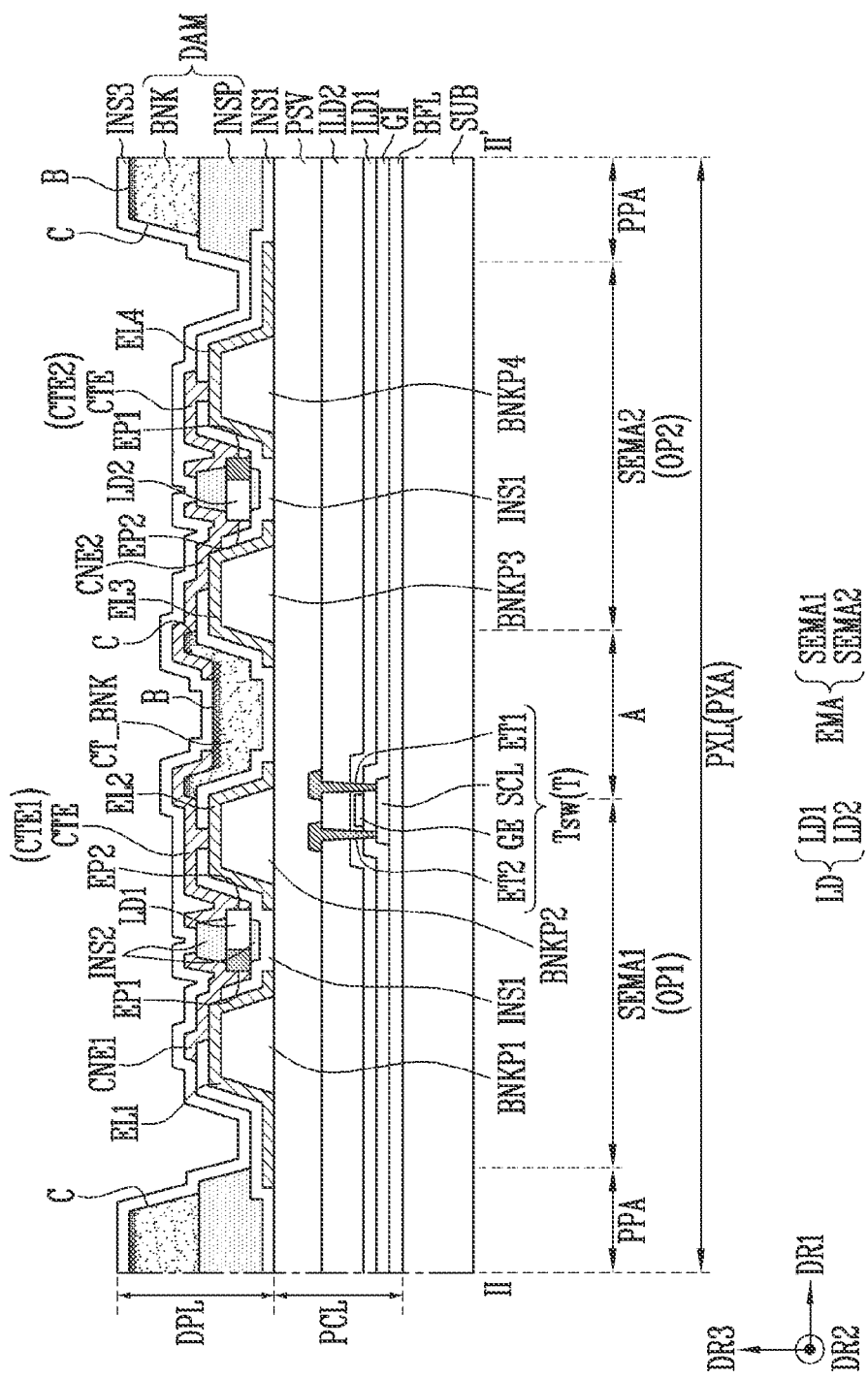

FIG. 7 illustrates a cross-sectional view taken along the line I-I' of FIG. 5, and FIG. 8A and FIG. 8B illustrate cross-sectional views taken along the line II-II' of FIG. 5.

In FIG. 7-FIG. 8B, one pixel PXL is simplified by showing each electrode as an electrode of a single film and each insulating layer as an insulating layer of a single film, but the present disclosure is not limited thereto.

Referring to FIG. 5-FIG. 8B, the pixel PXL may include the substrate SUB, a pixel circuit layer PCL, and a display element layer DPL.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, at least one transistor T, at least one storage capacitor Cst, and a passivation layer PSV.

The buffer layer BFL may prevent impurities from being diffused into the transistor T included in the pixel circuit (see PXC' in FIG. 4). The buffer layer BFL may be an inorganic insulating film including an inorganic material. The buffer layer BFL may include at least one of metal oxides such as a silicon nitride (SiNx), a silicon oxide (SiOx), a silicon oxynitride (SiOxNy), and an aluminum oxide (AlOx). The buffer layer BFL may be provided as a single film, but may be provided as a multi-film of at least double or more films. When the buffer layer BFL is provided as the multi-film, respective layers thereof may be made of the same material or different materials. The buffer layer BFL may be omitted depending on the material, a process condition, and the like of the substrate SUB.

The transistor T may include a driving transistor Tdr for controlling a driving current of the light emitting elements LD and a switching transistor Tsw electrically connected to the driving transistor Tdr. However, the present disclosure is not limited thereto, and the pixel circuit PXC may further include circuit elements that perform other functions in addition to the driving transistor Tdr and the switching transistor Tsw. The driving transistor Tdr may be the first transistor T1 described with reference to FIG. 4, and the switching transistor Tsw may be the second transistor T2 described with reference to FIG. 4. In the following embodiment, the driving transistor Tdr and the switching transistor Tsw are comprehensively referred to as a transistor T or transistors T.

Each of the driving transistor Tdr and the switching transistor Tsw may include a semiconductor pattern SCL, a gate electrode GE, a first terminal ET1, and a second terminal ET2. The first terminal ET1 may be one of a source electrode and a drain electrode, and the second terminal ET2 may be the remaining electrode. For example, the first terminal ET1 may be the source electrode, and the second terminal ET2 may be the drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap the gate electrode GE of the corresponding transistor T in the thickness direction of the substrate SUB. The semiconductor pattern SCL may be a semiconductor pattern made of a poly silicon, an amorphous silicon, an oxide semiconductor, or the like. For example, the channel region, which is a semiconductor pattern that is not doped with impurities, may be an intrinsic semiconductor. The first contact region and the second contact region may be semiconductor patterns doped with impurities. A gate insulating layer GI may be disposed on the semiconductor pattern SCL to cover the semiconductor pattern SCL and the buffer layer BFL.

The gate electrode GE may be provided and/or formed on the gate insulating layer GI to correspond to the channel region of the semiconductor pattern SCL. The gate electrode GE may be provided on the gate insulating layer GI to overlap the channel region of the semiconductor pattern SCL. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material.

The gate insulating layer GI may be an inorganic insulating film including an inorganic material. For example, the gate insulating layer GI may include at least one of metal oxides such as a silicon nitride (SiNx), a silicon oxide (SiOx), a silicon oxynitride (SiOxNy), and an aluminum oxide (AlOx). However, the material of the gate insulating layer GI is not limited to the above-described embodiments. In some embodiments, the gate insulating layer GI may be formed as an organic insulating film including an organic material. The gate insulating layer GI may be provided as a single film, or may be provided as a multi-film of at least two or more films.

A first interlayer insulating layer ILD1 may be disposed on the gate electrode GE and a second interlayer insulating layer ILD2 may be disposed on the first interlayer insulating layer ILD1. Each of the first terminal ET1 and the second terminal ET2 may be provided and/or formed on a second interlayer insulating layer ILD2, and may contact the first contact region and the second contact region of the semiconductor pattern SCL through a contact hole sequentially passing through the gate insulating layer GI and the first and second interlayer insulating layers ILD1 and ILD2. For example, the first terminal ET1 may contact the first contact region of the semiconductor pattern SCL, and the second terminal ET2 may contact the second contact region of the semiconductor pattern SCL. Each of the first and second terminals ET1 and ET2 may include the same material as that of the gate electrode GE, or may include one or more materials selected from the materials illustrated as constituent materials of the gate electrode GE.

The first interlayer insulating layer ILD1 may include the same material as that of the gate insulating layer GI, or may include one or more materials selected from the materials illustrated as constituent materials of the gate insulating layer GI.

The second interlayer insulating layer ILD2 may be provided and/or formed on the first interlayer insulating layer ILD1. The second interlayer insulating layer INS2 may be an inorganic insulating film including an inorganic material or an organic insulating film including an organic material. In some embodiments, the second interlayer insulating layer ILD2 may include the same material as the first interlayer insulating layer ILD1, but the present disclosure is not limited thereto. The second interlayer insulating layer ILD2 may be provided as a single film, and may be provided as a multi-film of at least double or more films.

In the above-described embodiment, it is described that the first and second terminals ET1 and ET2 of the transistor T are separate electrodes that are electrically connected to the semiconductor pattern SCL through the contact hole sequentially penetrating the gate insulating layer GI and the first and second interlayer insulating layer ILD1 and ILD2, but the present disclosure is not limited thereto. In some embodiments, the first terminal ET1 of the transistor T may be a first contact region adjacent to the channel region of the corresponding semiconductor pattern SCL, and the second terminal ET2 of the transistor T may be a second contact region adjacent to the channel region of the corresponding semiconductor pattern SCL. In this case, the second terminal ET2 of the transistor T may be electrically connected to the light emitting elements LD of the corresponding pixel PXL through a separate connection member such as a bridge electrode.

In the embodiment of the present disclosure, the transistors T may be configured as a low temperature polysilicon thin film transistor, but the present disclosure is not limited thereto. In some embodiments, the transistors T may be configured as an oxide semiconductor thin film transistor. Further, in the above-described embodiment, the case in which the transistors T are thin film transistors having a top gate structure is described as an example, but the present disclosure is not limited thereto, and the structure of the transistors T may be variously changed.

The storage capacitor Cst may include a lower electrode LE provided on the gate insulating layer GI and an upper electrode UE provided on the first interlayer insulating layer ILD1 and overlapping the lower electrode LE in the thickness direction of the substrate SUB.

The lower electrode LE may be disposed at the same layer as the gate electrode GE of the driving transistor Tdr, and may include the same material as the gate electrode GE of the driving transistor Tdr. The lower electrode LE may be integrally provided with the gate electrode GE of the driving transistor Tdr. In this case, the lower electrode LE may be regarded as an area of the gate electrode GE of the driving transistor Tdr. In some embodiments, the lower electrode LE may be provided in a separate configuration (or non-integral configuration) from the gate electrode GE of the driving transistor Tdr. In this case, the lower electrode LE and the gate electrode GE of the driving transistor Tdr may be electrically connected through a separate connection element.

The upper electrode UE may overlap the lower electrode LE in the thickness direction of the substrate SUB, and may cover the lower electrode LE. Capacitance of the storage capacitor Cst may be increased by increasing an overlapping area of the upper electrode UE and the lower electrode LE. The storage capacitor Cst may be covered by the second interlayer insulating layer ILD2.

The pixel circuit layer PCL may include a driving voltage wire DVL provided and/or formed on the second interlayer insulating layer ILD2. The driving voltage wire DVL may have the same configuration as the second power line PL2 described with reference to FIG. 4. Therefore, a voltage of the second driving power source VSS may be applied to the driving voltage wire DVL. The pixel circuit layer PCL may further include the first power line PL1 connected to the first driving power source VDD. Although not directly shown in the drawing, the first power line PL1 may be provided at the same layer as the driving voltage wire DVL, or may be provided on a different layer from the driving voltage wire DVL. In the above-described embodiment, it has been described that the driving voltage wire DVL is provided at the same layer as the first and second terminals ET1 and ET2 of the transistors T, but the present disclosure is not limited thereto. In some embodiments, the driving voltage wire DVL may be provided at the same layer as one of conductive layers provided in the pixel circuit layer PCL. That is, the position of the driving voltage wire DVL in the pixel circuit layer PCL may be variously changed.

Each of the first power line PL1 and the driving voltage wire DVL may include a conductive material (or substance). For example, each of the first power line PL1 and the driving voltage wire DVL may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material. For example, each of the first power line PL1 and the driving voltage wire DVL may be configured of a double film stacked in the order of titanium (Ti)/copper (Cu).

The first power line PL1 may be electrically connected to one configuration of the display element layer DPL, for example, to the first electrode EL1, and the driving voltage wire DVL may be electrically connected to the other configuration of the display element layer DPL, for example, to the third electrode EL3. For example, the first electrode EL1 may be electrically connected to the second terminal ET2 of the transistor T and the driving voltage wire DVL may be electrically connected to the third electrode EL3.

The passivation layer PSV may be provided and/or formed on the transistors T and the driving voltage wire DVL.

The passivation layer PSV may be include an organic insulating film, an inorganic insulating film, or the organic insulating layer disposed on the inorganic insulating film. The inorganic insulating film may include, for example, at least one of metal oxides such as a silicon nitride (SiNx), a silicon oxide (SiOx), a silicon oxynitride (SiOxNy), and an aluminum oxide (AlOx). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The passivation layer PSV may include the first contact hole CH1 exposing the second terminal ET2 of the driving transistor Tdr and the second contact hole CH2 exposing the driving voltage wire DVL.

The display element layer DPL may be provided on the passivation layer PSV.

The display element layer DPL may include the first to fourth bank patterns BNKP1, BNKP2, BNKP3, and BNKP4, the insulating pattern INSP, the bank BNK, the intermediate bank CT_BNK, the first to fourth electrodes EL1, EL2, EL3, and EL4, the light emitting elements LD, the first and second contact electrodes CNE1 and CNE2, and the intermediate electrode CTE, and the first to third insulating layers INS1 to INS3.

The first to fourth bank patterns BNKP1, BNKP2, BNKP3, and BNKP4 may be provided and/or formed on the passivation layer PSV. The first to fourth bank patterns BNKP1, BNKP2, BNKP3, and BNKP4 may be disposed to be spaced from each other in the pixel area PXA (or light emitting area EMA) of each pixel PXL. The first to fourth bank patterns BNKP1, BNKP2, BNKP3, and BNKP4 may protrude in the third direction DR3 on the pixel circuit layer PCL. The first to fourth bank patterns BNKP1, BNKP2, BNKP3, and BNKP4 may have substantially the same height, but the present disclosure is but is not limited thereto. In some embodiments, the first to fourth bank patterns BNKP1, BNKP2, BNKP3, and BNKP4 may have different heights from each other.

The first bank pattern BNKP1 may be provided and/or formed between the passivation layer PSV and the first electrode EL1, the second bank pattern BNKP2 may be provided and/or formed between the passivation layer PSV and the second electrode EL2, the third bank pattern BNKP3 may be provided and/or formed between the passivation layer PSV and the third electrode EL3, and the fourth bank pattern BNKP4 may be provided and/or formed between the passivation layer PSV and the fourth electrode EL4.

The first to fourth bank patterns BNKP1, BNKP2, BNKP3, and BNKP4 may be an inorganic insulating film including an inorganic material or an organic insulating film including an organic material. In some embodiments, the first to fourth bank patterns BNKP1, BNKP2, BNKP3, and BNKP4 may include an organic insulating film of a single film and/or an inorganic insulating film of a single layer, but the present disclosure is not limited thereto. In some embodiments, the first to fourth bank patterns BNKP1, BNKP2, BNKP3, and BNKP4 may be provided in a multilayered structure in which at least one or more of organic insulating film and at least one or more of inorganic insulating film are stacked. However, the materials of the first to fourth bank patterns BNKP1, BNKP2, BNKP3, and BNKP4 are not limited to the above-described embodiment, and in some embodiments, the first to fourth bank patterns BNKP1, BNKP2, BNKP3, and BNKP4 may include a conductive material (or substance).

The first to fourth bank patterns BNKP1, BNKP2, BNKP3, and BNKP4 may have cross-sections of a trapezoidal shape of which width is narrowed from one surface (for example, an upper surface) of the passivation layer PSV toward an upper portion thereof along the third direction DR3, but the present disclosure is not limited thereto. In some embodiments, the first to fourth bank patterns BNKP1, BNKP2, BNKP3, and BNKP4 may include a curved surface having a cross section of a semi-elliptic shape or a semi-circular shape (or semi-spherical shape) of which width is narrowed from one surface of the passivation layer PSV toward an upper portion thereof along the third direction DR3. When viewed in a cross-sectional view, the shapes of the first to fourth bank patterns BNKP1, BNKP2, BNKP3, and BNKP4 are not limited to the above-described embodiments, and the shapes thereof may be variously changed within a range in which the first to fourth bank patterns may improve efficiency of light emitted from each of the light emitting elements LD. In some embodiments, at least one of the first to fourth bank patterns BNKP1, BNKP2, BNKP3, and BNKP4 may be omitted, or its position may be changed.

In the embodiment, the first to fourth bank patterns BNKP1, BNKP2, BNKP3, and BNKP4 may function as reflective members. For example, the first to fourth bank patterns BNKP1, BNKP2, BNKP3, and BNKP4 may function as reflective members that improve light emission efficiency of each pixel PXL by guiding light emitted from each light emitting element LD in a desired direction along with the first to fourth electrodes EL1, EL2, EL3, and EL4 provided thereon.

The first to fourth electrodes EL1, EL2, EL3, and EL4 may be disposed on upper portions of the first to fourth bank patterns BNKP1, BNKP2, BNKP3, and BNKP4, respectively. The first to fourth electrodes EL1, EL2, EL3, and EL4 may be disposed to be spaced from each other in the pixel area PXA (or light emitting area EMA) of each pixel PXL.

In some embodiments, the first to fourth electrodes EL1, EL2, EL3 and EL4 respectively disposed on the first to fourth bank patterns BNKP1, BNKP2, BNKP3, and BNKP4 may have shapes corresponding to respective shapes of the first to fourth bank patterns BNKP1, BNKP2, BNKP3, and BNKP4. For example, the first to fourth electrodes EL1, EL2, EL3, and EL4 may protrude in the third direction DR3, while respectively having an inclined or curved surface corresponding to the first to fourth bank patterns BNKP1, BNKP2, BNKP3, and BNKP4.

Each of the first to fourth electrodes EL1, EL2, EL3, and EL4 may be made of a material having a constant reflectance in order to direct light emitted from each of the light emitting elements LD in an image display direction (or front direction) of the display device. Each of the first to fourth electrodes EL1, EL2, EL3, and EL4 may be made of a conductive material (or substance) having a constant reflectance. The conductive material (or substance) may include an opaque metal that is suitable for reflecting light emitted by the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In some embodiments, each of the first electrode EL1 and the second electrode EL2 may include a transparent conductive material (or substance). The transparent conductive material (or substance) may include a conductive oxide such as an indium tin oxide (ITO), an indium zinc oxide (IZO), a zinc oxide (ZnO), an indium gallium zinc oxide (IGZO), and an indium tin zinc oxide (ITZO), and a conductive polymer such as poly(3,4-ethylenedioxythiophene (PEDOT). When the first electrode EL1 and the second electrode EL2 contain a transparent conductive material (or substance), a separate conductive layer made of an opaque metal for reflecting the light emitted from the light emitting elements LD in the image display direction of the display device may be added. However, the materials of the first to fourth electrodes EL1, EL2, EL3, and EL4 are not limited to the above-described materials.

In some embodiments, each of the first to fourth electrodes EL1, EL2, EL3, and EL4 may be provided and/or formed as a single film, but the present disclosure is not limited thereto. In some embodiments, each of the first to fourth pixel electrode EL1, EL2, EL3, and EL4 may be provided and/or formed as a multi-film in which at least double or more materials of metals, alloys, conductive oxides, and conductive polymers are stacked. Each of the first to fourth electrodes EL1, EL2, EL3, and EL4 may be formed of at least a double film to reduce or minimize distortion due to signal delay when a signal (or voltage) is transmitted to respective end portions EP1 and EP2 of each of the light emitting elements LD. For example, each of the first to fourth electrodes EL1, EL2, EL3, and EL4 may include at least one reflective electrode layer. Further, each of the first to fourth electrodes EL1, EL2, EL3, and EL4 may selectively further include at least one of at least one transparent electrode layer disposed at an upper portion and/or a lower portion of the reflective electrode layer and at least one conductive capping layer covering an upper portion of the reflective electrode layer and/or the transparent electrode layer.

In some embodiments, the reflective electrode layer of each of the first to fourth electrodes EL1, EL2, EL3, and EL4 may be made of a conducting material having a constant (or uniform) reflectance. As an example, the reflective electrode layer may include an opaque metal, but is not limited thereto. That is, the reflective electrode layer may be made of various reflective conductive materials. When each of the first to fourth electrodes EL1, EL2, EL3, and EL4 includes a reflective electrode layer, it is possible for the light emitted from respective end portions of each of the light emitting elements LD, that is, the first and second end portions EP1 and EP2, to further proceed in the image display direction (or the third direction DR3) of the display device. For example, when the first to fourth electrodes EL1, EL2, EL3, and EL4 are disposed to face the first and second end portions EP1 and EP2 while having an inclined or curved surface corresponding to a shape of the first to fourth bank patterns BNKP1, BNKP2, BNKP3, and BNKP4, light emitted from the first and second end portions EP1 and EP2 of each of the light emitting elements LD may be reflected by the first to fourth electrodes EL1, EL2, EL3, and EL4 to further proceed in image display direction of the display device. Therefore, the efficiency of light emitted from the light emitting elements LD may be improved.

In some embodiments, the transparent electrode layer of each of the first to fourth electrodes (EL1, EL2, EL3, EL4) may include various transparent conductive materials. In the embodiment, each of the first to fourth electrodes EL1, EL2, EL3, and EL4 may be configured of a triple layer having a stacked structure of ITO/Ag/ITO. As such, when the first to fourth electrodes EL1, EL2, EL3, and EL4 are configured of a multi-film having at least a double layer or more, a voltage drop due to a signal delay (RC delay) may be reduced or minimized. Therefore, a desired voltage may be effectively transmitted to the light emitting elements LD.

Further, when each of the first to fourth electrodes EL1, EL2, EL3, and EL4 includes a conductive capping layer covering the reflective electrode layer and/or the transparent electrode layer, it is possible to prevent the reflective electrode layers of the first to fourth electrodes EL1, EL2, EL3, and EL4 from being damaged during the manufacturing process of each pixel PXL. However, the conductive capping layer may be selectively included in the first to fourth electrodes EL1, EL2, EL3, and EL4, and may be omitted in some embodiments. In some embodiments, the conductive capping layer may be regarded as a constituent element of each of the first to fourth electrodes EL1, EL2, EL3, and EL4, or as a separate constituent element disposed on the first to fourth electrodes EL1, EL2, EL3, and EL4.

The first electrode EL1 may be electrically connected to the driving transistor Tdr of the pixel circuit layer PCL through the first contact hole CH1 of the passivation layer PSV, and the third electrode EL3 may be electrically connected to the driving voltage wire DVL of the pixel circuit layer PCL through the second contact hole CH2 of the passivation layer PSV. The first to fourth electrodes EL1, EL2, EL3, and EL4 may be used as alignment electrodes to align the light emitting elements LD. In some embodiments, the first and third electrodes EL1 and EL3 of the first to fourth electrodes EL1, EL2, EL3, and EL4 may be used as driving electrodes for driving the light emitting elements LD.

A first insulating layer INS1 may be provided and/or formed on the first to fourth electrodes EL1, EL2, EL3, and EL4. For example, the first insulating layer INS1 may be formed to cover one area of the first to fourth electrodes EL1, EL2, EL3, and EL4, and may include an opening exposing the other area of the first to fourth electrodes EL1, EL2, EL3, and EL4.

The first insulating layer INS1 may include an inorganic insulating film made of an inorganic material or an organic insulating film made of an organic material. The first insulating layer INS1 may be formed as an inorganic insulating film that is suitable for protecting the light emitting elements LD from the pixel circuit layer PCL. For example, the first insulating layer INS1 may include at least one of metal oxides such as a silicon nitride (SiNx), a silicon oxide (SiOx), a silicon oxynitride (SiOxNy), and an aluminum oxide (AlOx), but the present disclosure is not limited thereto. In some embodiments, the first insulating layer INS1 may be formed as an organic insulating film that is suitable for flattening a support surface of the light emitting elements LD.

The first insulating layer INS1 may be provided as a single film or multi-film. When the first insulating layer INS1 is provided as a multi-film, the first insulating layer INS1 may be provided in a distributed bragg reflector (DBR) structure in which a first layer and a second layer having different refractive indexes and configured of inorganic insulating films are alternately stacked. For example, the first insulating layer INS1 may be provided in a structure in which a first layer having a small refractive index and a second layer having a larger refractive index than that of the first layer are alternately stacked. As described above, when the first insulating layer INS1 is provided as a multi-film, the first insulating layer INS1 may be used as a reflective member that reflects light emitted from the light emitting elements LD in a target direction by using reinforcing interference due to a difference in refractive index between the first layer and the second layer. In this case, each of the first and second layers may include at least one of a silicon oxide (SiOx), a silicon nitride (SiNx), a silicon oxynitride (SiOxNy), a silicon oxycarbide (SiOxCy), a silicon carbonitride (SiCxNy), a silicon oxycarbide (SiOxCy), an aluminum oxide (AlOx), an aluminum nitride (AlNx), a hafnium oxide (HfOx), a zirconium oxide (ZrOx), a titanium oxide (TiOx), and a tantalum oxide (TaOx).

The first insulating layer INS1 may be provided and/or formed on the passivation layer PSV to entirely cover the first to fourth electrodes EL1, EL2, EL3, and EL4. After the light emitting elements LD are supplied (or injected) and aligned on the first insulating layer INS1, the first insulating layer INS1 may be partially opened to expose one area of each of the first and third electrodes EL1 and EL3, as shown in FIG. 8A. After the light emitting elements LD are supplied (or injected) and aligned, the first insulating layer INS1 may be patterned in a form of an individual pattern that is locally disposed under the light emitting elements LD. The first insulating layer INS1 may cover the remaining areas except for one area of each of the first and third electrodes EL1 and EL3. In some embodiments, the first insulating layer INS1 may be omitted. In another embodiment, the first insulating layer INS1 may be partially opened to expose one area of each of the first to fourth electrodes EL1, EL2, EL3, and EL4 as shown in FIG. 8B.

The insulating pattern INSP may be provided and/or formed on the first insulating layer INS1.

The insulating pattern INSP may be provided and/or formed in the peripheral area PPA adjacent to the light emitting area EMA of each pixel PXL. The insulating pattern INSP is provided on the first insulating layer INS1, and may have a suitable thickness (e.g., a set or predetermined thickness) or more in the third direction DR3. For example, the insulating pattern INSP may be designed to have a thickness thicker than that of each of the first to fourth bank patterns BNKP1, BNKP2, BNKP3, and BNKP4 in the third direction DR3. In this case, the insulating pattern INSP may have a more protruding structure in the third direction DR3 than the first to fourth bank patterns BNKP1, BNKP2, BNKP3, and BNKP4.

The bank BNK may be provided and/or formed on the insulating pattern INSP, and the intermediate bank CT_BNK may be provided and/or formed on one area of the first insulating layer INS1 where the insulating pattern INSP is not disposed.

The bank BNK may be formed in the peripheral area PPA of the corresponding pixel PXL so as to surround the light emitting area EMA of each pixel PXL. The bank BNK may be provided on the insulating pattern INSP to form the dam part DAM together with the insulating pattern INSP. In the process of supplying (or injecting) light emitting elements LD into the light emitting area EMA of the corresponding pixel PXL, the dam part DAM may be a structure that prevents ink including the light emitting elements LD from flowing into the light emitting area EMA of the adjacent pixel PXL, or controls a certain amount of ink to be supplied to each light emitting area EMA. The bank BNK may include the first to third openings OP1, OP2, and OP3. The first opening OP1 may correspond to the first sub-light emitting area SEMA1 of each pixel PXL, and the second opening OP2 may correspond to the second sub-light emitting area SEMA2 of the corresponding pixel PXL.

The intermediate bank CT_BNK may be provided and/or formed in an area (A) between the first sub-light emitting area SEMA1 and the second sub-light emitting area SEMA2 of each pixel PXL. The intermediate bank CT_BNK may partially overlap each of the second and third electrodes EL2 and EL3 when viewed in plan and cross-sectional views. In some embodiments, the intermediate bank CT_BNK may partially overlap the second bank pattern BNKP2 disposed below the second electrode EL2 and the third bank pattern BNKP3 disposed below the third electrode EL3, when viewed in a plan view and a cross-sectional view.

The intermediate bank CT_BNK may be integrally provided with the bank BNK disposed in the peripheral area PPA to be connected to the bank BNK, but the present disclosure is not limited thereto. In some embodiments, the intermediate bank CT_BNK may be provided in a form of an island that is spaced from the bank BNK and surrounded by the bank BNK.

The intermediate bank CT_BNK and the bank BNK may have different thicknesses in the third direction DR3. For example, a thickness d1 of the bank BNK in the third direction DR3 may be thicker than a thickness d2 of the intermediate bank CT_BNK in the third direction DR3. That is, the thickness d2 of the intermediate bank CT_BNK in the third direction DR3 may be thinner than the thickness d1 of the bank BNK in the third direction DR3. However, the present disclosure is not limited thereto, and in some embodiments, the intermediate bank CT_BNK and the bank BNK may have the same thickness (or substantially the same thickness) in the third direction DR3.

In the embodiment, after the bank BNK and the intermediate bank CT_BNK are formed, at least one of the bank BNK and the intermediate bank CT_BNK may be liquid-repellent-treated to have liquid repellency. For example, at least a portion of the bank BNK may be liquid-repellent-treated to have liquid repellency, or at least a portion of the intermediate bank CT_BNK may be liquid-repellent-treated to have liquid repellency. In another example, at least portion of the bank BNK and at least portion of the intermediate bank CT_BNK may be liquid-repellent-treated to have liquid repellency. In the following embodiments, an embodiment in which at least portion of the bank BNK and at least portion of the intermediate bank CT_BNK are liquid-repellent-treated to have liquid repellency will be specifically described.

The liquid repellency may mean, for example, a property of repelling an organic solvent or the like, which is an inkjet ejection liquid. For example, an upper surface (B) of the bank BNK and an upper surface (B) of the intermediate bank CT_BNK in the third direction DR3 may respectively include a liquid-repellent layer having liquid repellency. In this case, the liquid-repellent layer may have a contact angle of about 80° to 130° when water droplets are dripped on a surface of the liquid-repellent-treated object (the upper surface (B) of the bank BNK and the upper surface (B) of the intermediate bank CT_BNK), but the present disclosure is not limited thereto.

Examples of the liquid-repellent treatment may include treatment using a surface modifier as a liquid-repellent treatment agent, treatment with various energy rays, treatment by chemical adsorption, treatment by graft polymerization on a material surface, and the like.

The treatment using the surface modifier may mean a treatment for forming a liquid-repellent layer to which a small amount of a surface modifier is added to a surface of an object. Examples of the surface modifier as the liquid-repellent treatment agent include vinyl polymers having a perfluoroalkyl group (Rf group) in the side chain, and silicone containing an Rf group. The liquid-repellent layer may be formed by a method such as soaking a surface modifier in a paper waste to apply it to a surface thereof, or spraying the surface modifier onto the surface by spray or inkjet printing.

The treatment with various energy rays may mean a treatment in which a surface of an object has liquid repellency by energy rays. Examples of the energy rays are plasma, electron rays, and ion beams. Examples of the liquid-repellent treatment in a case of using the plasma treatment may include an example of roughening a surface of an object by plasma etching and then forming, for example, a liquid-repellent monomolecular film on the roughened surface; an example of fluorinating a surface by fluorine-based gas plasma, forming a film configured of a liquid-repellent compound on the surface by plasma CVD; and an example of forming a liquid-repellent thin film on a surface of an object by plasma polymerization.

Examples of the treatment by surface roughening may include an example of imparting protrusions and depressions shape on a surface of an object by thermal press, an example of etching by chemicals, an example of blast treatment, and the like.

In the treatment by chemical adsorption, it may be desirable to modify a terminal of the adsorbed molecule with fluorine. For example, as a terminal substituent, a $CF_3$ group may be preferable from the viewpoint of liquid repellency.

Among the examples of the liquid-repellent treatment described above, it may be preferable in that the fluoridation of the surface of the object by the fluorine-based gas plasma may be simplified and uniformly surface-treated. In the embodiment, the upper surface (B) of the bank BNK and the upper surface (B) of the intermediate bank CT_BNK may include a liquid-repellent layer having liquid repellency by plasma.

When the above-described liquid-repellent treatment is performed, the upper surface (B) of the bank BNK and the upper surface (B) of the intermediate bank CT_BNK may be respectively exposed to the outside, and may react with the fluorine-based gas plasma to include a liquid-repellent layer having liquid repellency. Here, the liquid-repellent layer may be a layer containing fluorine (F). Because a side surface (C) of the bank BNK and a side surface (C) of the intermediate bank CT_BNK are not exposed to the outside, they may not react with the fluorine-based gas plasma in the liquid-repellent treatment process described above. Accordingly, the side surface (C) of the bank BNK and the side surface (C) of the intermediate bank CT_BNK may not have liquid repellency and may have a lyophilic characteristic. Here, the lyophilic characteristic may mean a property of getting wet with ink, which is an inkjet discharge liquid.

Due to the liquid-repellent treatment described above, each of the bank BNK and the intermediate bank CT_BNK may be divided into the upper surface (B) having liquid repellency and the side surface (C) having a lyophilic characteristic.

When each of the bank BNK and the intermediate bank CT_BNK is divided into the upper surface (B) having the liquid-repellent characteristic and the side surface (C) having the lyophilic characteristic, a degree of spreading of ink droplets ejected (or sprayed) into the pixel area PXA of each pixel PXL by a nozzle of an inkjet printing device may be easily controlled. For example, when two nozzles of the inkjet printing device correspond to the pixel area PXA of each pixel PXL, and when ink is ejected from only one of the two nozzles and ink is not ejected from the other one thereof, due to the side surface (C) of the bank BNK and the side surface (C) of the intermediate bank CT_BNK that have lyophilic properties, the ink ejected only into one area of the pixel area PXA may be dispersed (or moved) into the other area. In other words, when ink is ejected only into one area of the pixel area PXA and ink is not ejected into the other area, due to the lyophilic characteristics of the side surface (C) of the bank BNK and the side surface (C) of the intermediate bank CT_BNK, the ink may move to the other area where the ink is not ejected. Accordingly, the ink is dispersed (or spread) in the entire area of the pixel area PXA, so that the light emitting elements LD provided in the ink may be evenly distributed in the pixel area PXA.

The light emitting elements LD may be supplied (or injected) and aligned in the light emitting area EMA of each pixel PXL in which the bank BNK and the intermediate bank CT_BNK are formed. For example, when the light emitting elements LD are supplied (or injected) into the light emitting area EMA through an inkjet printing method, the light emitting elements (LD) may be aligned between the first to fourth electrodes EL1, EL2, EL3, and EL4 by an alignment signal (e.g., a set or predetermined alignment signal) applied to each of the first to fourth electrodes EL1, EL2, EL3, and EL4. For example, at least one first light emitting element LD1 may be aligned between the first electrode EL1 and the second electrode EL2, and at least one second light emitting element LD2 may be aligned between the third electrode EL3 and the fourth electrode EL4.

A second insulating layer INS2 may be provided and/or formed on each of the light emitting elements LD. The second insulating layer INS2 may be provided and/or formed on the light emitting elements LD to partially cover an outer peripheral surface (e.g., an outer circumferential surface) (or a surface) of each of the light emitting elements LD, and may expose the first end portion EP1 and the second end portion EP2 of each of the light emitting elements LD to the outside.

The second insulating layer INS2 may be formed as a single film or multi-film, and may include an inorganic insulating film including at least one inorganic material or an organic insulating film including at least one organic material. The second insulating layer INS2 may include an inorganic insulating film that is suitable for protecting the active layer (see '12' in FIG. 1) of each of the light emitting elements LD from external oxygen and moisture. However, the present disclosure is not limited thereto, and the second insulating layer INS2 may be formed of an organic insulating film including an organic material according to design conditions of the display device to which the light emitting elements LD are applied. After the alignment of the light emitting elements LD is completed in the pixel area PXA (or light emitting area EMA) of each pixel PXL, the second insulating layer INS2 is formed on the light emitting elements LD, so that it is possible to prevent the light emitting elements LD from deviating from the aligned position.

When there is a gap (or space) between the first insulating layer INS1 and the light emitting elements LD before the second insulating layer INS2 is formed, the gap may be filled with the second insulating layer INS2 in the process of forming the second insulating layer INS2. In this case, the second insulating layer INS2 may be configured as an organic insulating film that is suitable for filling the gap between the first insulating layer INS1 and the light emitting elements LD.

The first contact electrode CNE1 may be provided and/or formed on the first electrode EL1 and the first end portion EP1 of the first light emitting element LD1. The first contact electrode CNE1 may electrically connect the first electrode EL1 and the first end portion EP1 of the first light emitting element LD1.

The first contact electrode CNE1 may be disposed to contact the first electrode EL1 on one area of the first electrode EL1 that is not covered by the first insulating layer INS1. Further, the first contact electrode CNE1 may be disposed on the first end portion EP1 of the first light emitting element LD1 to contact the first end portion EP1 of the first light emitting element LD1 adjacent to the first electrode EL1. That is, the first contact electrode CNE1 may be disposed to cover the first end portion EP1 of the first light emitting element LD1 and at least one area of the first electrode EL1 corresponding thereto.

Similarly, the second contact electrode CNE2 may be disposed on the third electrode EL3 and the second end portion EP2 of the second light emitting element LD2. The second contact electrode CNE2 may electrically connect the third electrode EL3 and the second end portion EP2 of the second light emitting element LD2.

The second contact electrode CNE2 may be disposed to contact the third electrode EL3 on one area of the third electrode EL3 that is not covered by the first insulating layer INS1. Further, the second contact electrode CNE2 may be disposed on the second end portion EP2 of the second light emitting element LD2 to contact the second end portion EP2 of the second light emitting element LD2 adjacent to the third electrode EL3. That is, the second contact electrode CNE2 may be disposed to cover the second end portion EP2 of the second light emitting element LD2 and at least one area of the third electrode EL3 corresponding thereto.

The first and second contact electrodes CNE1 and CNE2 may be made of various transparent conductive materials so that the light that is emitted from each of the light emitting elements LD and reflected by the first and third electrodes EL1 and EL3 proceeds in the image display direction of the display device without loss. For example, the first and second contact electrodes CNE1 and CNE2 may at least one of various transparent conductive materials (or substances) such as an indium tin oxide (ITO), an indium zinc oxide (IZO), a zinc oxide (ZnO), an indium gallium zinc oxide (IGZO), and an indium tin zinc oxide (ITZO), and may be formed to be substantially transparent or translucent to satisfy a light transmittance (e.g., a set or predetermined light transmittance) (or transmittance). However, the materials of the first and second contact electrodes CNE1 and CNE2 are not limited to the above-described embodiment. In some embodiments, the first and second contact electrodes CNE1 and CNE2 may be made of various opaque conductive materials (or substances). The first and second contact electrodes CNE1 and CNE2 may be formed as a single film or multi-film.

In the embodiment, the first contact electrode CNE1 and the second contact electrode CNE2 may be provided at the same layer. In this case, the first contact electrode CNE1 and the second contact electrode CNE2 may be formed by the same process. However, the present disclosure is not limited thereto, and in some embodiments, the first contact electrode CNE1 and the second contact electrode CNE2 may be formed by different processes, and may be provided in different layers.

The intermediate electrode CTE may include the first intermediate electrode CTE1 and the second intermediate electrode CTE2.

The first intermediate electrode CTE1 may be provided and/or formed on the second electrode EL2 and the second end portion EP2 of the first light emitting element LD1. The first intermediate electrode CTE1, as shown in FIG. 8A, may be electrically insulated from the second electrode EL2 completely covered by the first insulating layer INS1. However, the present disclosure is not limited thereto, and in some embodiments, as shown in FIG. 8B, when one area of the second electrode EL2 is partially exposed by the first insulating layer INS1, the first intermediate electrode CTE1 may be electrically connected to the second electrode EL2. The first intermediate electrode CTE1 may be electrically connected to the second electrode EL2 to be configured of a double layer that reduces wire resistance to reduce or minimize distortion due to signal delay.

The second intermediate electrode CTE2 may be provided and/or formed on the fourth electrode EL4 and the first end portion EP1 of the second light emitting element LD2. The second intermediate electrode CTE2, as shown in FIG. 8A, may be electrically insulated from the fourth electrode EL4 completely covered by the first insulating layer INS1. However, the present disclosure is not limited thereto, and in some embodiments, as shown in FIG. 8B, when one area of the fourth electrode EL4 is partially exposed by the first insulating layer INS1, the second intermediate electrode CTE2 may be electrically connected to the fourth electrode EL4 to be configured of a double layer that reduce wire resistance to reduce or minimize distortion due to signal delay.

The intermediate electrode CTE may be made of various transparent conductive materials so that the light that is emitted from each of the light emitting elements LD and reflected by the first to fourth electrodes EL1, EL2, EL3, and EL4 proceeds to the image display direction of the display device without loss. For example, the intermediate electrode CTE may include the same material as the first and second contact electrodes CNE1 and CNE2, or may include at least one selected from materials exemplified as constituent materials of the first and second contact electrodes CNE1 and CNE2.

The intermediate electrode CTE may be provided at the same layer as the first and second contact electrodes CNE1 and CNE2, and may be formed through the same process as them. For example, the intermediate electrode CTE and the first and second contact electrodes CNE1 and CNE2 may be provided and/or formed on the second insulating layer INS2. However, the present disclosure is not limited thereto, and in some embodiments, the intermediate electrode CTE may be provided in a different layer from the first and second contact electrodes CNE1 and CNE2, and may be formed through different processes.

A third insulating layer INS3 may be provided and/or formed on the first contact electrode CNE1, the second contact electrode CNE2, and the intermediate electrode CTE. The third insulating layer INS3 may be an inorganic insulating film including an inorganic material or an organic insulating film including an organic material. For example, the third insulating layer INS3 may have a structure in which at least one inorganic insulating film and at least one organic insulating film are alternately stacked. The third insulating layer INS3 may entirely cover the display element layer DPL to block moisture or moisture from the outside from being introduced into the display element layer DPL including the light emitting elements LD. In some embodiments, at least one overcoat layer (for example, a layer flattening the upper surface of the display element layer DPL) may be further disposed on the third insulating layer INS3.

When a driving current flows from the first power line PL1 to the driving voltage wire DVL by the driving transistor Tdr of the pixel circuit layer PCL included in each pixel PXL, the driving current may flow into the light emitting unit (see 'EMU' in FIG. 4) of the corresponding pixel PXL through the first contact hole CH1.

For example, the driving current is supplied to the first electrode EL1 through the first contact hole CH1, and the driving current passes through the first light emitting element LD1 through the first contact electrode CNE1 in direct contact with (or connected to) the first electrode EL1 to flow into the intermediate electrode CTE. Accordingly, in the first serial stage SET1, the first light emitting element LD1 may emit light with luminance corresponding to the current flowing thereinto.

The driving current flowing through the intermediate electrode CTE flows into the second contact electrode CNE2 through the intermediate electrode CTE and the second light emitting element LD2. Accordingly, in the second serial stage SET2, the second light emitting element LD2 may emit light with luminance corresponding to the current flowing thereinto.

In the above-described manner, the driving current of each pixel PXL may sequentially pass through the first light emitting element LD1 of the first serial stage SET1 and the second light emitting element LD2 of the second serial stage SET2 to flow. Accordingly, each pixel PXL may emit light with luminance corresponding to a data signal supplied during each frame period.

According to the above-described embodiment, in the process of forming the first contact electrode CNE1 and the second contact electrode CNE2, the intermediate electrode CTE may be concurrently formed (e.g., simultaneously formed). Accordingly, a manufacturing process of each pixel PXL and a display device having the same may be simplified, thereby improving product yield.

Further, according to the above-described embodiment, by configuring the light emitting unit EMU having a serial/parallel mixed structure, each pixel PXL may be stably driven to reduce the driving current flowing through the display panel of the display device, so that it is possible to improve power consumption efficiency.

Figure 9:
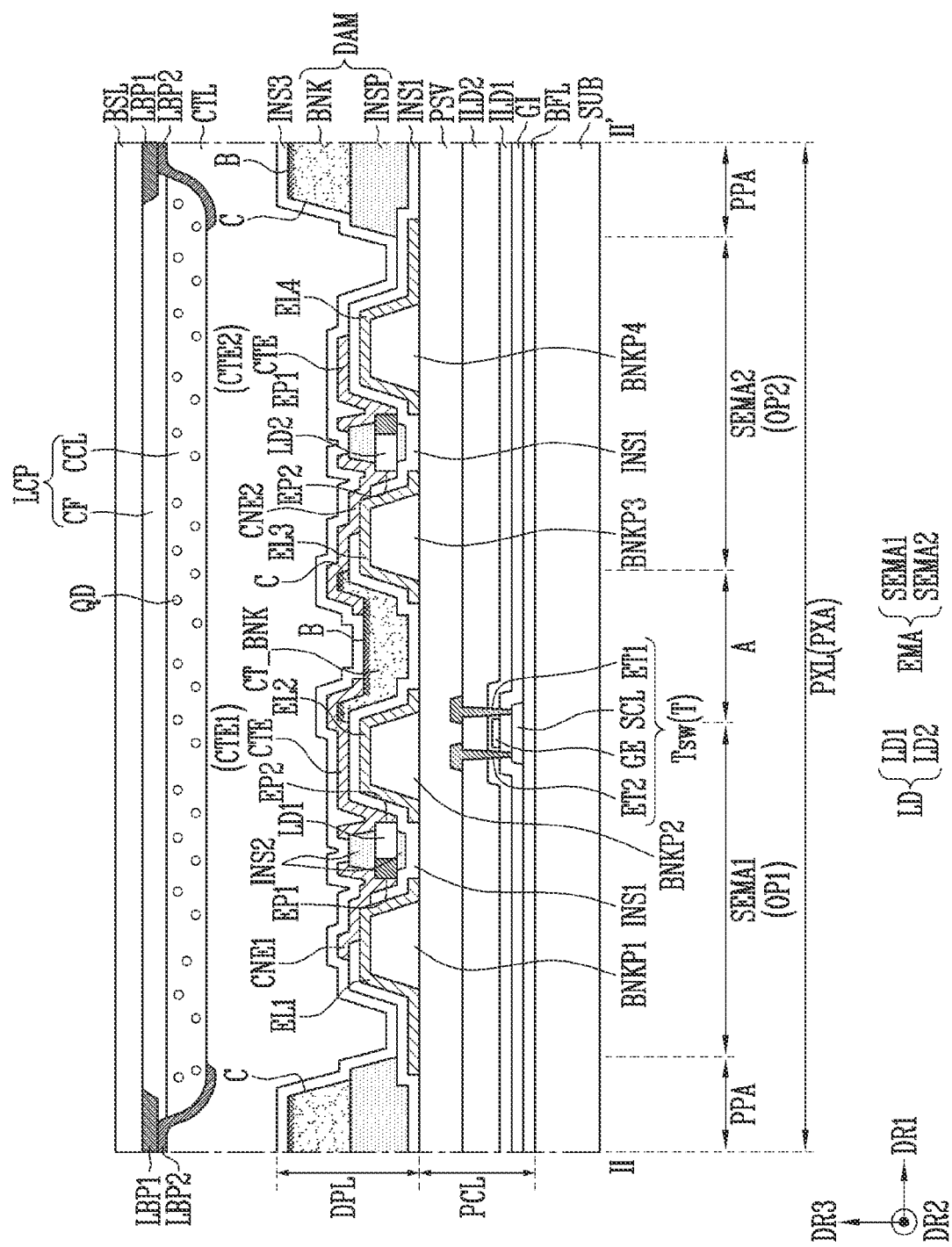
FIG. 9 illustrates a cross-sectional view of another embodiment of a pixel taken along the line I-I' of FIG. 5.

FIG. 9 illustrates a cross-sectional view of a pixel taken along the line I-I' of FIG. 5 according to another embodiment of the present disclosure.

Referring to FIG. 5, FIG. 6, and FIG. 9, an upper substrate may be further disposed on the third insulating layer INS3.

The upper substrate may be provided on the display element layer DPL so that the pixels PXL cover the disposed display area (see 'DA' in FIG. 3). The upper substrate may be configured of an encapsulation substrate (or a thin film encapsulation layer) and/or a window member of a display device. A intermediate layer CTL may be provided between the upper substrate and the display element layer DPL.

The intermediate layer CTL may be a transparent adhesive layer (or bonding layer) for reinforcing adherence between the display element layer DPL and the upper substrate, for example, an optically clear adhesive layer, but the present disclosure is not limited thereto. In some embodiments, the intermediate layer CTL may be a refractive index conversion layer for improving light emitting luminance of each pixel PXL by converting refractive index of light emitted from the light emitting elements LD and proceeding to the upper substrate.

The upper substrate may include a base layer BSL and a light conversion pattern layer LCP.

The base layer BSL may be a rigid substrate or a flexible substrate, and its material or physical properties are not particularly limited. The base layer BSL may be made of the same material as the substrate SUB, or may be made of a material different from the substrate SUB.

The light conversion pattern layer LCP may be disposed on one surface of the base layer BSL to face the pixels PXL of the substrate SUB. The light conversion pattern layer LCP may include a color conversion layer CCL and a color filter CF corresponding to a color (e.g., a set or predetermined color).

The color conversion layer CCL may include color conversion particles QD corresponding to a specific color. The color filter CF may selectively transmit the light of the specific color.

One color conversion layer CCL is disposed on one surface of the base layer BSL so as to face one pixel PXL, and may include color conversion particles QD that convert light emitted from the light emitting elements LD disposed in one pixel PXL into light of a specific color. One color conversion layer CCL may include color conversion particles QD that convert light emitted from the light emitting elements LD disposed in the pixel area PXA of one pixel PXL into light of a specific color. For example, when the one pixel PXL is a red pixel (or red sub-pixel), the color conversion layer CCL may include the color conversion particles QD of a red quantum dot that converts light emitted from the light emitting elements LD into red light. As another example, when the one pixel PXL is a green pixel (or green sub-pixel), the color conversion layer CCL may include the color conversion particles QD of a green quantum dot that converts light emitted from the light emitting elements LD into green light. As another example, when the one pixel PXL is a blue pixel (or blue sub-pixel), the color conversion layer CCL may include the color conversion particles QD of a blue quantum dot that converts light emitted from the light emitting elements LD into blue light. In some embodiments, when the one pixel PXL is a blue pixel (or a blue sub-pixel), a light scattering layer including light scattering particles may be provided instead of the color conversion layer CCL including the color conversion particles QD. For example, when the light emitting elements LD emits blue light, the one pixel PXL may include the light scattering layer including the light scattering particles. The above-described light scattering layer may be omitted according to embodiments. According to another embodiment, when the one pixel PXL is the blue pixel (or blue sub-pixel), a transparent polymer may be provided instead of the color conversion layer CCL.

The color filter CF may selectively transmit the light of the specific color. The color filter CF may form the light conversion pattern layer LCP together with the color conversion layer CCL, and may include a color filter material that selectively transmits light of a specific color converted by the color conversion layer CCL. The color filter CF may include a red color filter, a green color filter, and a blue color filter. The above-described color filter CF may be provided in the pixel area PXA so as to correspond to the color conversion layer CCL.

The light conversion pattern layer LCP including the color conversion layer CCL and the color filter CF may be disposed in the light emitting area of the pixel area PXA.

A first light blocking pattern LBP1 may be disposed between the color filter CF corresponding to the one pixel PXL and the color filter corresponding to the pixel PXL adjacent to the one pixel PXL. The first light blocking pattern LBP1 may be provided on the base layer BSL to overlap the bank BNK provided in the pixel area PXA of the corresponding pixel PXL. In some embodiments, the first light blocking pattern LBP1 may be provided in a multi-filmed structure in which at least two or more color filters selectively transmitting light of different colors from among a red color filter, a green color filter, and a blue color filter overlap each other. For example, the first light blocking pattern LBP1 may be provided to include a red color filter, a green color filter disposed on the red color filter and overlapping the red color filter, and a blue color filter disposed on the green color filter and overlapping the green color filter. That is, the first light blocking pattern LBP1 may be provided to have a structure in which a red color filter, a green color filter, and a blue color filter are sequentially stacked. In this case, the red color filter, the green color filter, and the blue color filter may be used as the first light blocking pattern LBP1 for blocking light transmission, in the peripheral area PPA of the pixel area PXA.

In some embodiments, a second light blocking pattern LBP2 may be disposed on the first light blocking pattern LBP1. The first light blocking pattern LBP1 and the second light blocking pattern LBP2 may include the same material. For example, the first light blocking pattern LBP1 and the second light blocking pattern LBP2 may be a black matrix.

FIG. 10A-FIG. 10D illustrate schematic top plan views of the intermediate bank shown in FIG. 5 according to another embodiment.

In relation to the intermediate bank CT_BNK of FIG. 10A-FIG. 10D, differences from the above-described embodiment will be mainly described in order to avoid duplicate descriptions. Constituent elements not specifically described in the present disclosure refer to the embodiment described above, the same reference numerals designate the same constituent elements, and the similar reference numerals designate the similar constituent elements.

First, referring to FIG. 5 and FIG. 10A-FIG. 10D, the intermediate bank CT_BNK may be disposed between the first sub-light emitting area SEMA1 and the second sub-light emitting area SEMA2 of each pixel PXL, and may partially overlap each of the second and third electrodes EL2 and EL3.

The intermediate bank CT_BNK may be disposed to be spaced from the bank BNK, may not be connected to the bank BNK, and may be provided in a separate configuration from the bank BNK. The intermediate bank CT_BNK may be provided in an isolated island shape surrounded by the bank BNK. When the intermediate bank CT_BNK and the bank BNK are not connected to each other, and are disposed to be spaced from each other by a certain interval, flowing of ink (for example, a mixed solution including the light emitting elements LD dispersed in a solvent) ejected into the pixel area PXA of each pixel PXL may be more easily controlled.

Figure 10A:
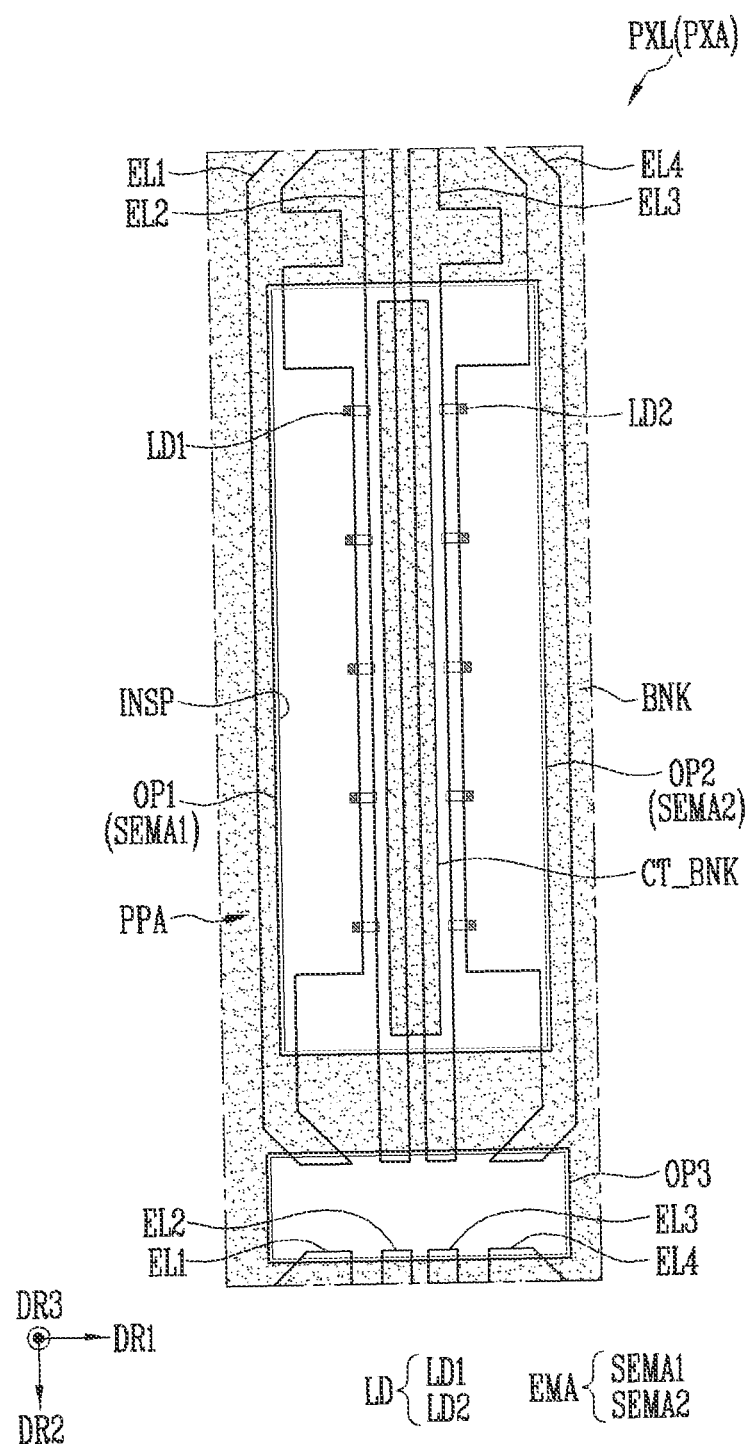
Figure 10B:
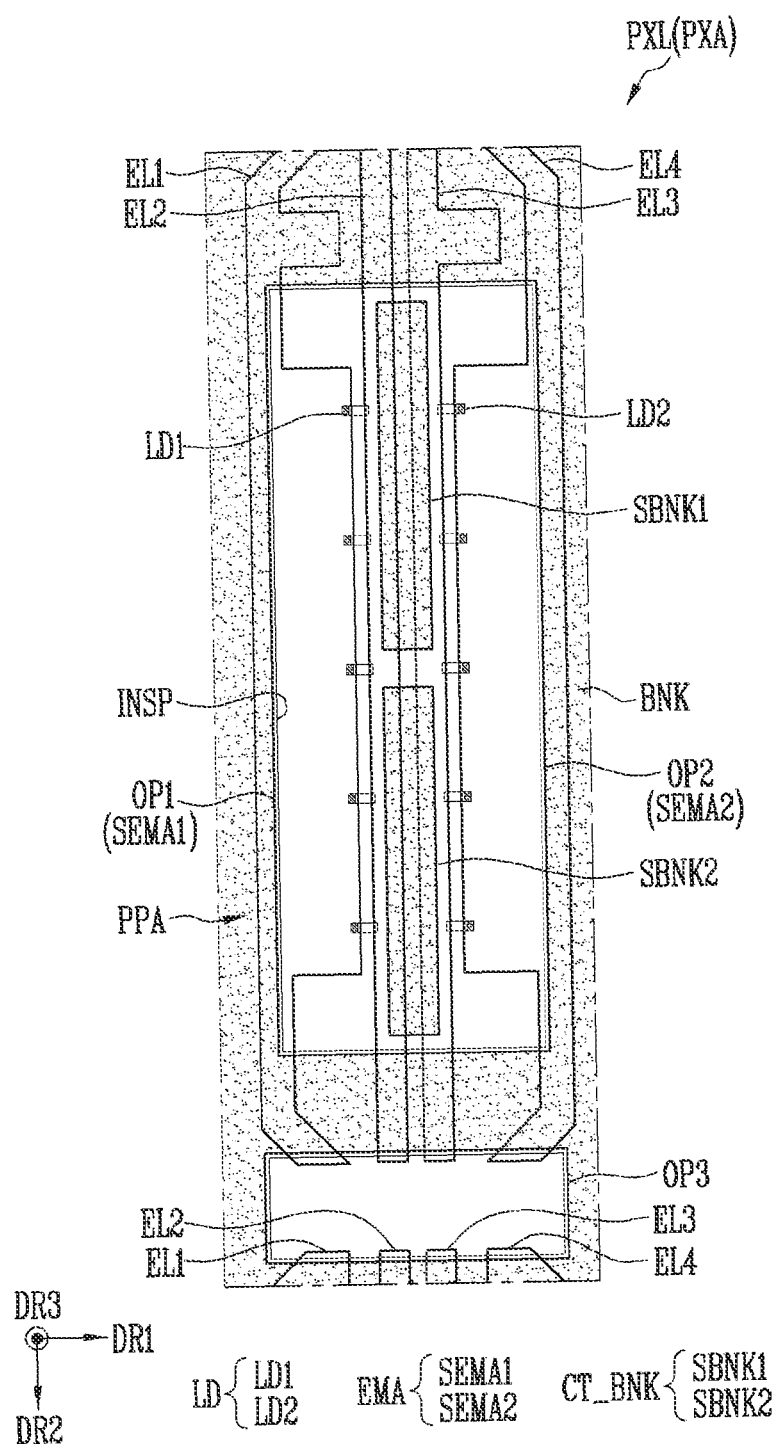

In some embodiments, the intermediate bank CT_BNK may include at least two sub-banks spaced from each other along the second direction DR2. As an example, the intermediate bank CT_BNK may include a first sub-bank SBNK1 and a second sub-bank SBNK2 that are spaced from each other and face each other along the second direction DR2 as shown in FIG. 10B.

The first sub-bank SBNK1 may be disposed between the first sub-light emitting area SEMA1 and the second sub-light emitting area SEMA2 to correspond to an upper end portion (or upper side) of the pixel area PXA of each pixel PXL. The first sub-bank SBNK1 may partially overlap one area of the second electrode EL2 and one area of the third electrode EL3 at the upper end portion (or upper side) of the pixel area PXA.

The second sub-bank SBNK2 may be disposed between the first sub-light emitting area SEMA1 and the second sub-light emitting area SEMA2 to correspond to a lower end portion (or lower side) of the pixel area PXA of each pixel PXL. The second sub-bank SBNK2 may partially overlap the other area of the second electrode EL2 and the other area of the third electrode EL3 at the lower end portion (or lower side) of the pixel area PXA.

Figure 10C:
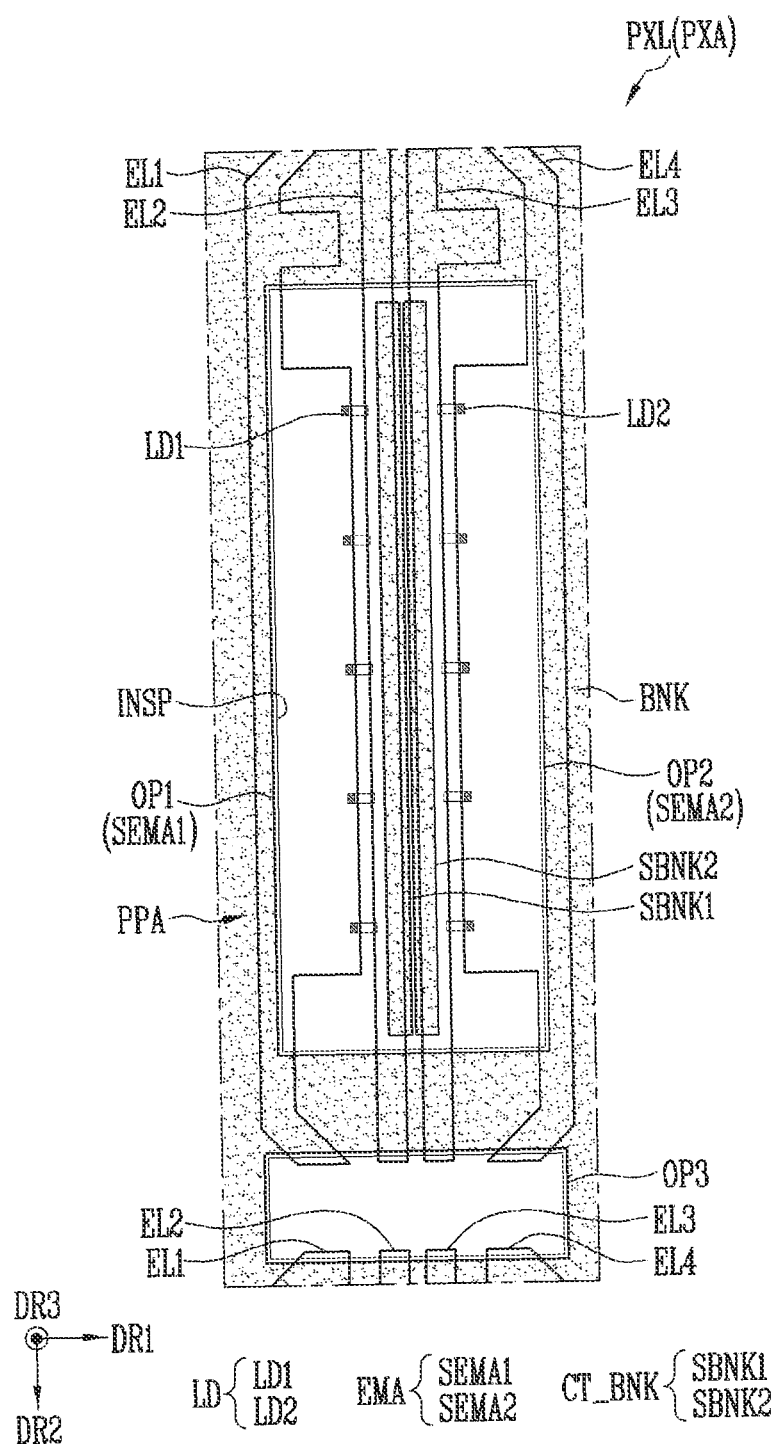
Figure 11B:
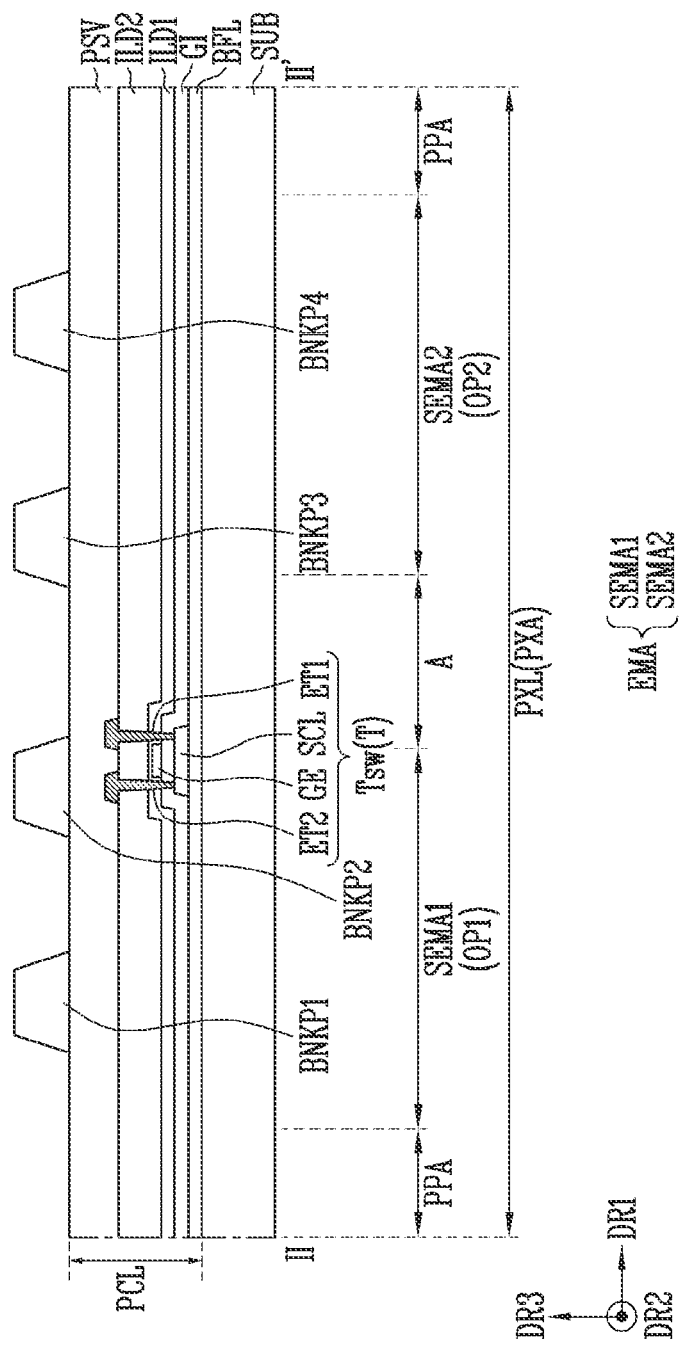
Figure 11C:
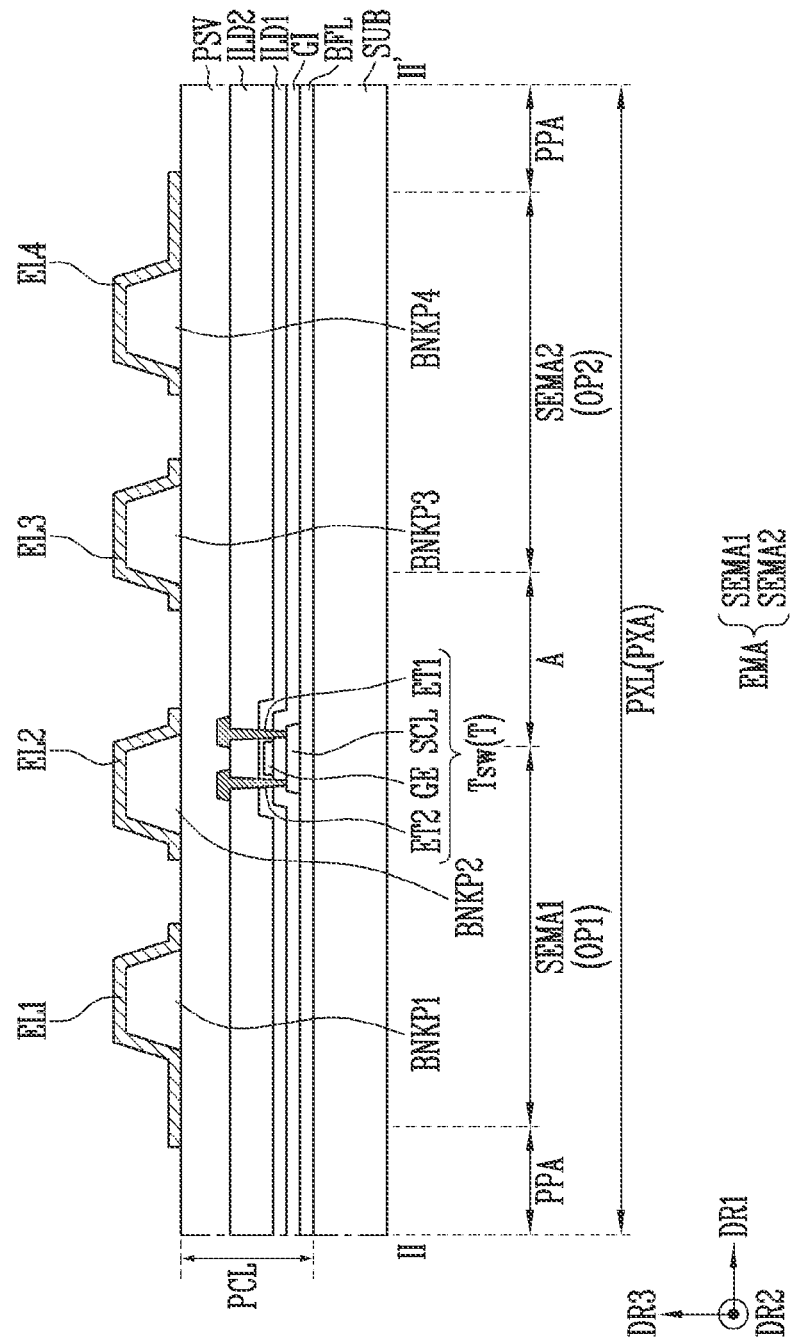
Figure 11D:
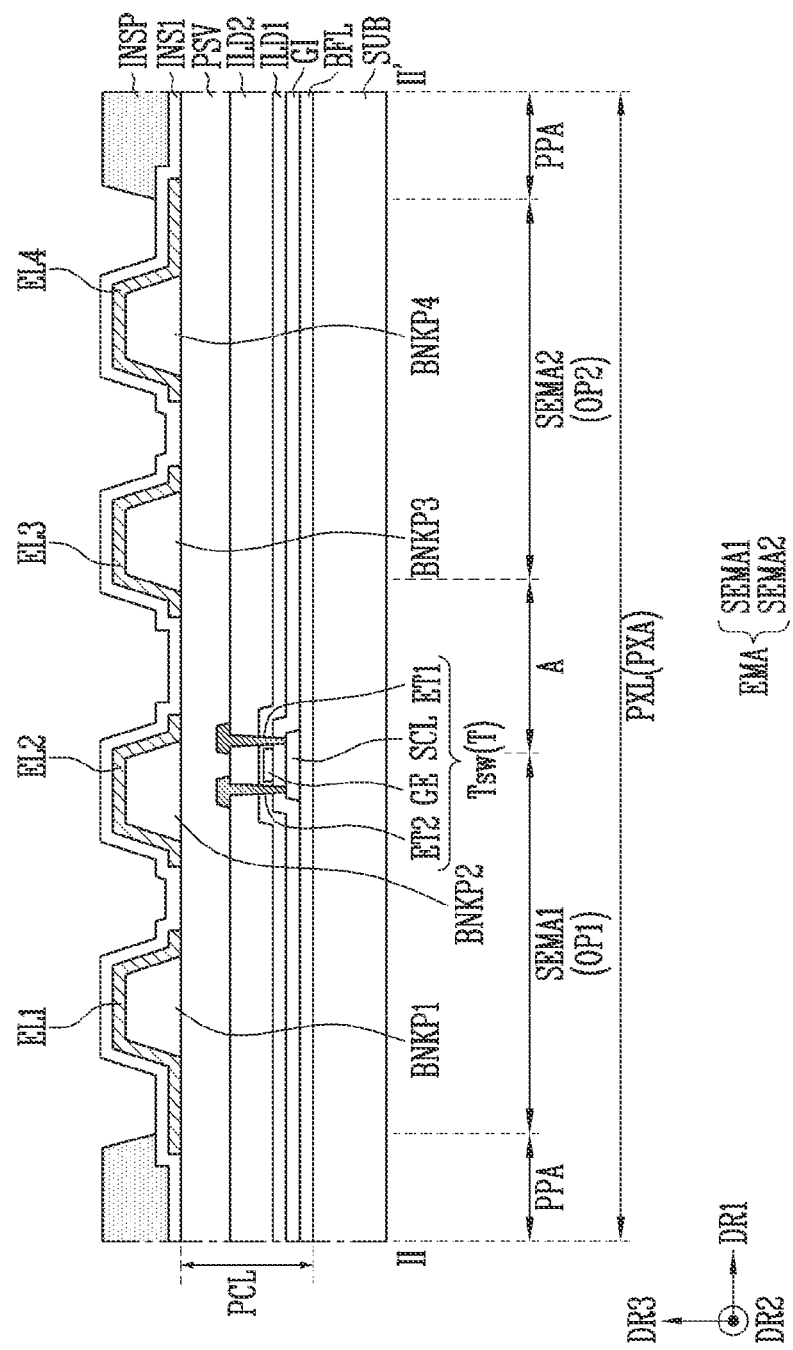
Figure 11E:
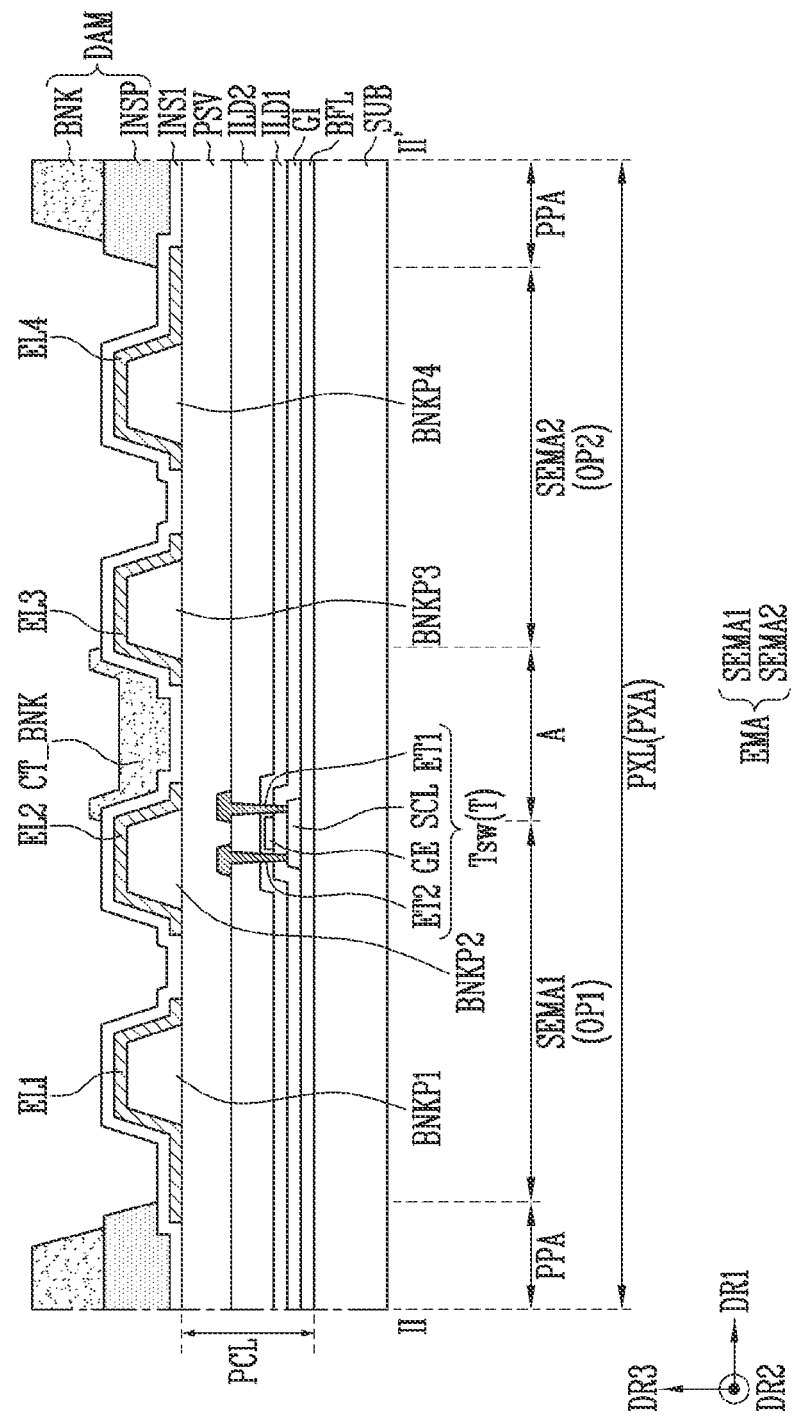
Figure 11F:
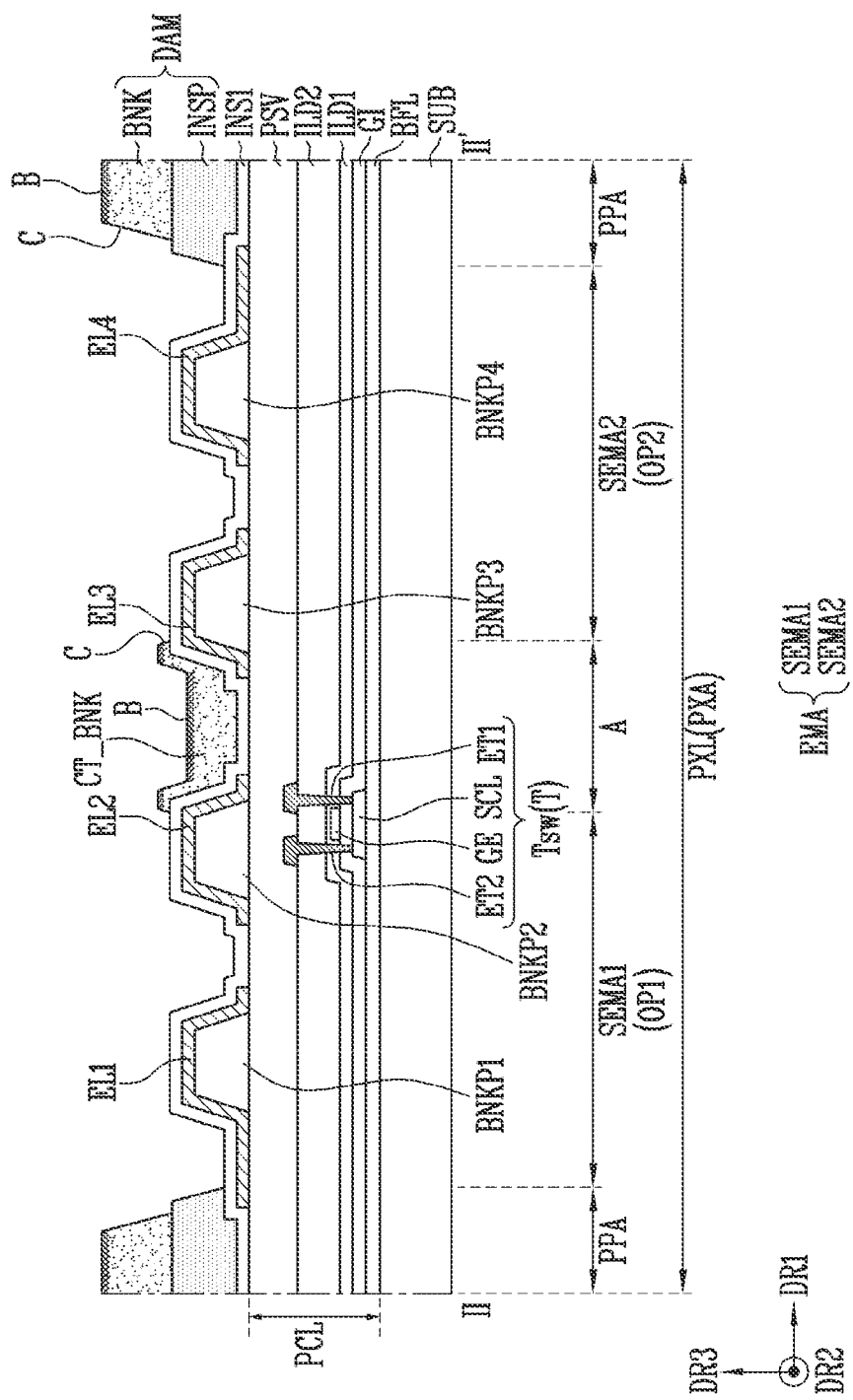
Figure 11G:
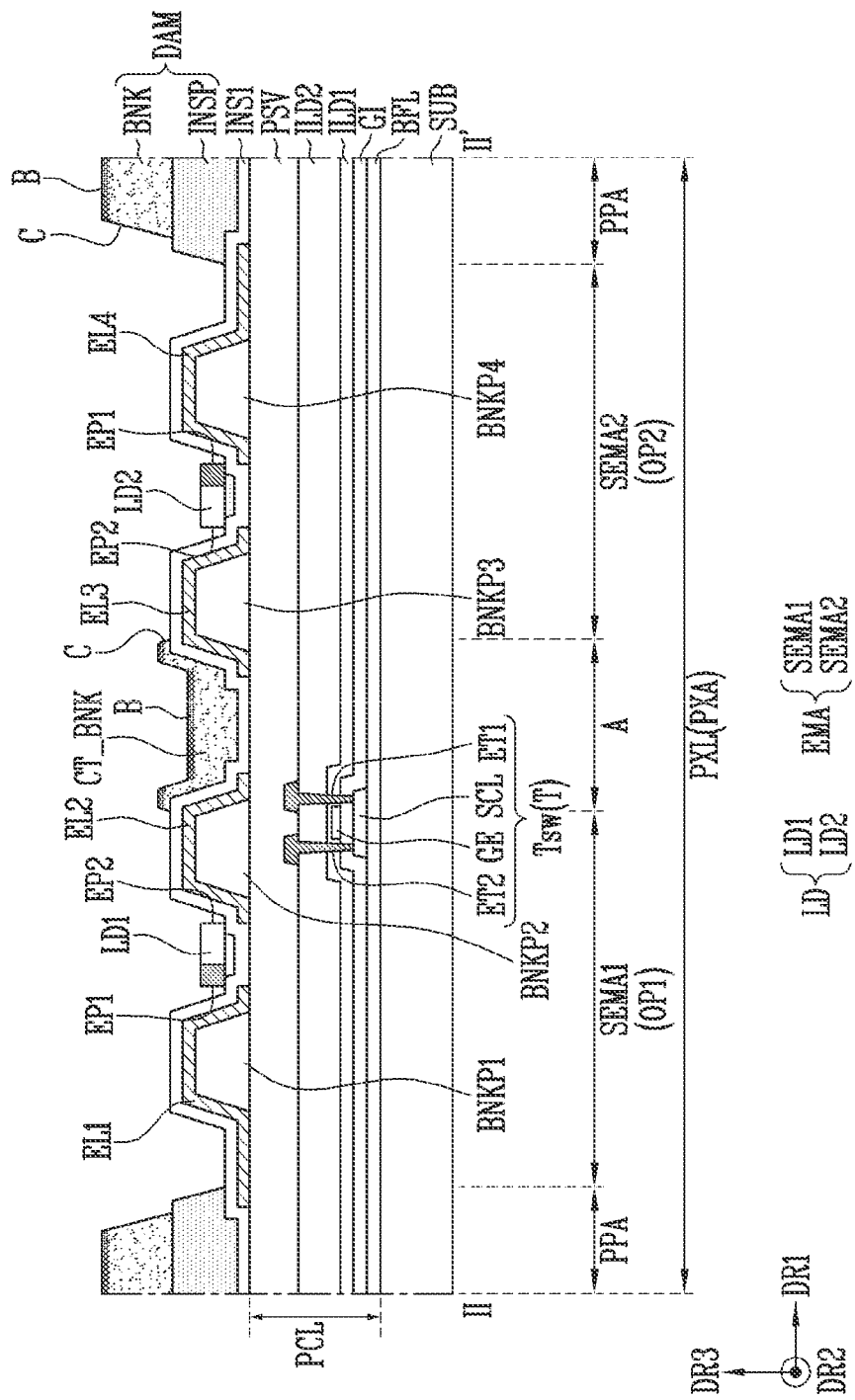
Figure 11H:
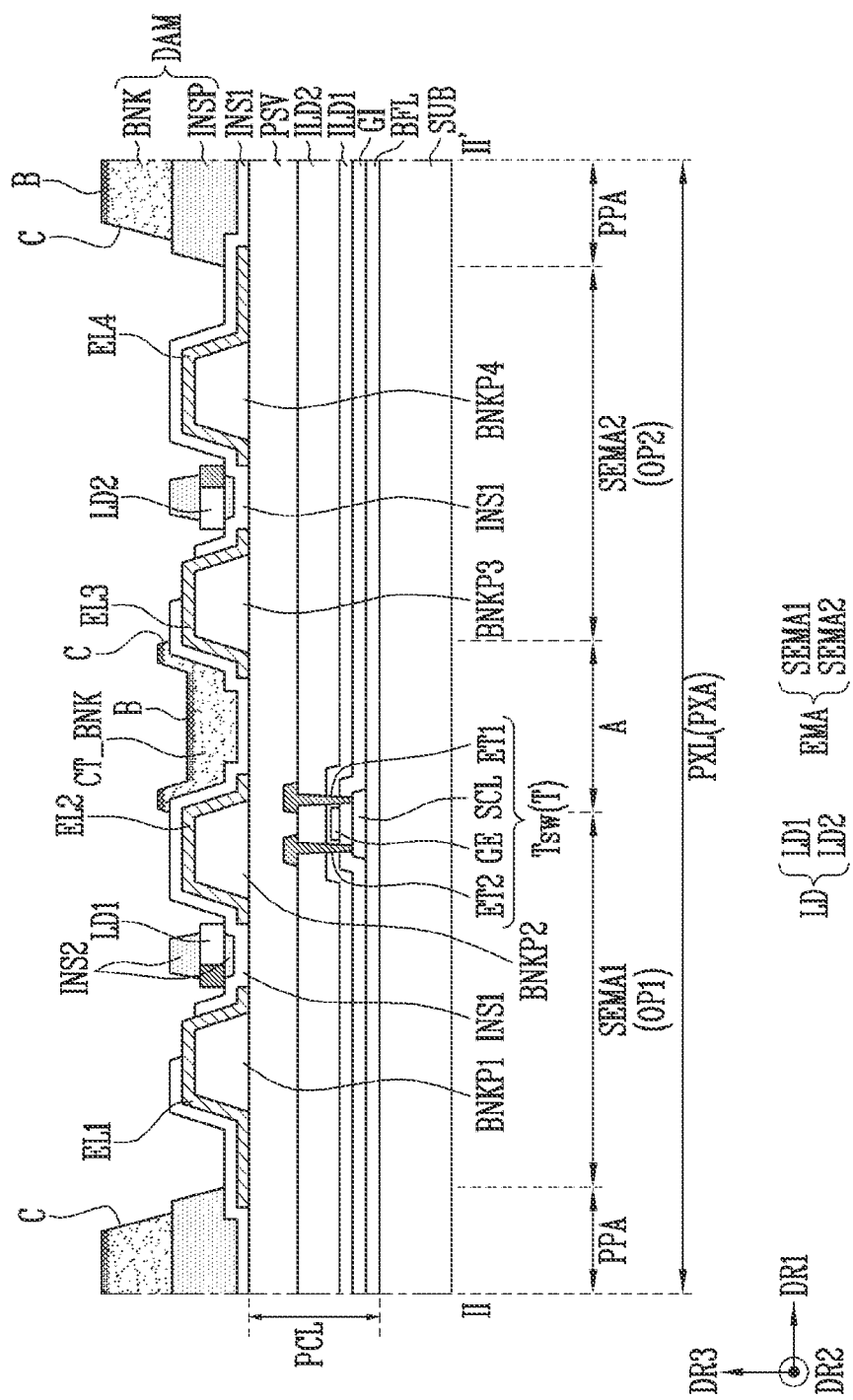
Figure 11I:
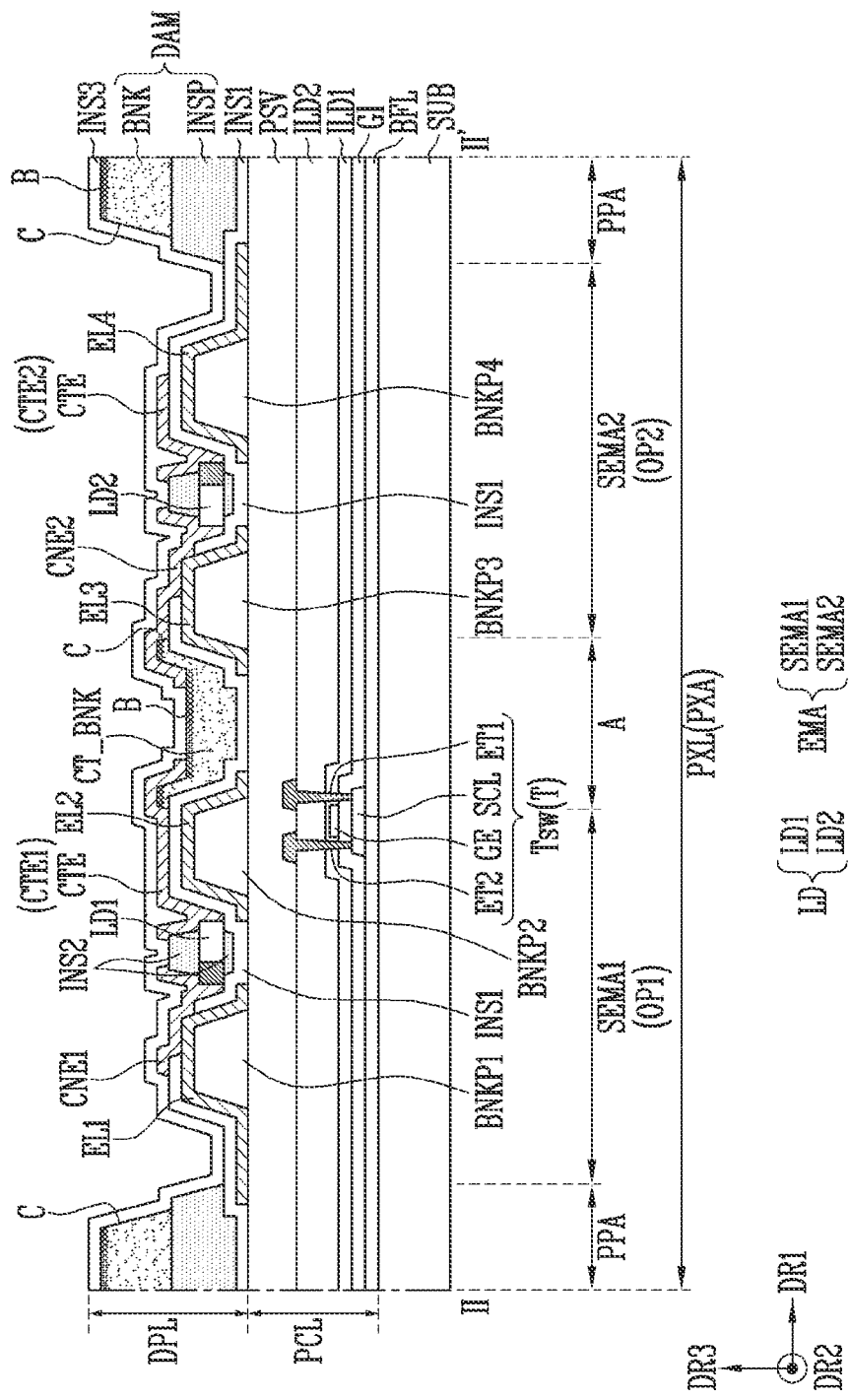

In some embodiments, the intermediate bank CT_BNK may include at least two sub-banks spaced from each other along the first direction DR1. As an example, the intermediate bank CT_BNK may include a first sub-bank SBNK1 and a second sub-bank SBNK2 that are spaced from each other and face each other along the first direction DR1 as shown in FIG. 10C.

The first sub-bank SBNK1 may be disposed to be adjacent to the left between the first sub-light emitting area SEMA1 and the second sub-light emitting area SEMA2 of each pixel PXL, and may partially overlap one area of the second electrode EL2. The second sub-bank SBNK2 may be disposed to be adjacent to the right between the first sub-light emitting area SEMA1 and the second sub-light emitting area SEMA2 of the corresponding pixel PXL, and may partially overlap one area of the third electrode EL3.

In some embodiments, the intermediate bank CT_BNK may include at least two sub-banks spaced from each other along the first direction DR1 and at least two sub-banks spaced from each other along the second direction DR2. As an example, the intermediate bank CT_BNK may include (1-1)-th and (1-2)-th sub-banks SBNK1_1 and SBNK1_2 spaced from and facing each other along the first direction DR1 as shown in FIG. 10D, and (2-1)-th and (2-2)-th sub-banks SBNK2_1 and SBNK2_2 spaced from and facing each other along the first direction DR1. The (1-1)-th sub-bank SBNK1_1 and the (1-2)-th sub-bank SBNK1_2 may form the first sub-bank SBNK1. The (2-1)-th sub-bank SBNK2_1 and the (2-2)-th sub-bank SBNK2_2 may form the second sub-bank SBNK2.

The first sub-bank SBNK1 may be disposed at the upper end portion (or upper side) of the pixel area PXA of each pixel PXL, and the second sub-bank SBNK2 may be disposed at the lower end portion (or lower side) of the pixel area PXA.

The (1-1)-th sub-bank SBNK1_1 may be disposed to be adjacent to the left between the first sub-light emitting area SEMA1 and the second sub-light emitting area SEMA2 of each pixel PXL, and may partially overlap one area of the second electrode EL2. The (1-2)-th sub-bank SBNK1_2 may be disposed to be adjacent to the right between the first sub-light emitting area SEMA1 and the second sub-light emitting area SEMA2, and may partially overlap one area of the third electrode EL3.

The (2-1)-th sub-bank SBNK2_1 may be disposed to be adjacent to the left between the first sub-light emitting area SEMA1 and the second sub-light emitting area SEMA2 of each pixel PXL, and may partially overlap the other area of the second electrode EL2. The (2-2)-th sub-bank SBNK2_2 may be disposed to be adjacent to the right between the first sub-light emitting area SEMA1 and the second sub-light emitting area SEMA2, and may partially overlap the other area of the third electrode EL3.

The shape of the intermediate bank CT_BNK is not limited to the above-described embodiments, and may be variously changed within a range in which the flow of the ink ejected into the pixel area PXA of each pixel PXL may be easily controlled.

FIG. 11A-FIG. 11I illustrate sequential schematic cross-sectional views of a manufacturing method of the pixel of FIG. 8A.

In FIG. 11A-FIG. 11I, differences from the above-described embodiment will be mainly described in order to avoid duplicate descriptions.

Referring to FIG. 5, FIG. 8A, and FIG. 11A, the pixel circuit layer PCL is formed on the substrate SUB.

The pixel circuit layer PCL may include the buffer layer BFL, the transistors T, the storage capacitor Cst, the driving voltage wire DVL, and the passivation layer PSV.

Referring to FIG. 5, FIG. 8A, FIG. 11A, and FIG. 11B, the first to fourth bank patterns BNKP1, BNKP2, BNKP3, and BNKP4 are formed on the passivation layer PSV. The first to fourth bank patterns BNKP1, BNKP2, BNKP3, and BNKP4 may be spaced from each other on the passivation layer PSV.

Referring to FIG. 5, FIG. 8A, and FIG. 11A-FIG. 11C, the first to fourth electrodes EL1, EL2, EL3, and EL4 are formed on the first to fourth bank patterns BNKP1, BNKP2, BNKP3, and BNKP4.

The first electrode EL1 may be formed on the first bank pattern BNKP1, the second electrode EL2 may be formed on the second bank pattern BNKP2, the third electrode EL3 may be formed on the third bank pattern BNKP3, and the fourth electrode EL4 may be formed on the fourth bank pattern BNKP4.

Referring to FIG. 5, FIG. 8A, and FIG. 11A-FIG. 11D, an insulating material layer INS1 is formed on the passivation layer PSV including the first to fourth electrodes EL1, EL2, EL3, and EL4. The first insulating layer INS1 may be an inorganic insulating film including an inorganic material or an organic insulating film including an organic material. The first insulating layer INS1 may be patterned by a subsequent process to be provided as the first insulating layer INS1 partially exposing one area of each of the first and third electrodes EL1 and EL3. Thus, the same reference numeral as the first insulating layer INS1 is denoted to the first insulating layer INS1.

Successively, the insulating pattern INSP is formed. The insulating pattern INSP may be made of an organic insulating film including an organic material having a suitable thickness (e.g., a set or predetermined thickness) or more, for example, about 3 μm in the third direction DR3. The insulating pattern INSP is formed in the peripheral area PPA included in the pixel area PXA of each pixel PXL.

Referring to FIG. 5, FIG. 8A, and FIG. 11A-FIG. 11E, the bank BNK and the intermediate bank CT_BNK are formed on the insulating material layer including the first insulating layer INS1 and an insulating pattern INSP.

The bank BNK may be formed on the insulating pattern INSP, and the intermediate bank CT_BNK may be formed on the first insulating layer INS1 disposed in an area (A) between the first sub-light emitting area SEMA1 and the second sub-light emitting area SEMA2 of each pixel PXL. The bank BNK and the intermediate bank CT_BNK may be formed by the same process, and may include the same material.

As the bank BNK is formed on the insulating pattern INSP, the bank BNK may have a more protruding structure in the third direction DR3 than the intermediate bank CT_BNK formed on the first insulating layer INS1. Accordingly, in the process of supplying the light emitting elements LD to the light emitting area EMA of each pixel PXL, the bank BNK together with the insulating pattern INSP, while preventing ink including the light emitting elements LD from flowing into the light emitting area EMA of the adjacent pixels PXL, or controlling to supply a desired amount of ink (e.g., a set or predetermined amount of ink) to each light emitting area EMA, may implement a structure that determines a supply position of the ink, for example, a dam part DMA.

Referring to FIG. 5, FIG. 8A, and FIG. 11A-FIG. 11F, the liquid-repellent layer is formed by performing a liquid-repellent treatment in one area of the bank BNK and one area of the intermediate bank CT_BNK. In this case, one area of the bank BNK may be the upper surface (B) of the bank BNK, and the one area of the intermediate bank CT_BNK may be the upper surface (B) of the intermediate bank CT_BNK. The other area of the bank BNK excluding the upper surface (B), the first insulating layer INS1, and the other area of the intermediate bank CT_BNK excluding the upper surface (B) may not be exposed to the outside by a mask or the like. That is, in the liquid-repellent treatment process, the upper surface (B) of the bank BNK and the upper surface (B) of the intermediate bank CT_BNK are exposed to the outside, and the remaining area excluding the upper surface (B) of the bank BNK and the upper surface (B) of the intermediate bank CT_BNK and the first insulating layer INS1 may not be exposed to the outside.

For example, the liquid-repellent treatment may be performed by irradiating plasma on the upper surface (B) of the bank BNK and the upper surface (B) of the intermediate bank CT_BNK. For example, by using a gas in which fluorine or a fluorine compound is contained in the introduced gas, and by using a reduced pressure plasma treatment or atmospheric pressure plasma treatment in which plasma irradiation is performed under a reduced pressure atmosphere or atmospheric pressure atmosphere containing fluorine compounds and oxygen, the liquid-repellent treatment may be applied to the upper surface (B) of the bank BNK and the upper surface (B) of the intermediate bank CT_BNK. Due to the liquid-repellent treatment described above, the upper surface (B) of the bank BNK and the upper surface (B) of the intermediate bank CT_BNK may each have liquid repellency. That is, the upper surface (B) of the bank BNK and the upper surface (B) of the intermediate bank CT_BNK may include a liquid-repellent layer including fluorine (F).

In the liquid-repellent treatment process, an area of the bank BNK that is not irradiated with plasma, for example, the side surface (C) of the bank BNK, and the other area of the intermediate bank CT_BNK, for example, the side surface (C) of the intermediate bank CT_BNK do not have liquid repellency, and may have a lyophilic characteristic. Further, the first insulating layer INS1 may have a lyophilic characteristic.

In some embodiments, when the upper surface of the bank BNK is not exposed to the outside due to the mask, only the upper surface of the intermediate bank CT_BNK may have liquid repellency by the liquid-repellent treatment process described above. In another embodiment, when the upper surface of the intermediate bank CT_BNK is not exposed to the outside due to the mask, only the upper surface of the bank BNK may have liquid repellency by the liquid-repellent treatment process described above. That is, at least one of the upper surface of the bank BNK and the upper surface of the intermediate bank CT_BNK may have liquid repellency by the liquid-repellent treatment process described above, or both the upper surface of the bank BNK and the upper surface of the intermediate bank CT_BNK may have liquid repellency by the liquid-repellent treatment process described above.

Referring to FIG. 5, FIG. 8A, and FIG. 11A-FIG. 11G, an electric field is formed between two adjacent electrodes in the first direction DR1 by applying an alignment signal corresponding to each of the first to fourth electrodes EL1, EL2, EL3, and EL4.

Then, while the electric field is formed between the two adjacent electrodes, the ink including the light emitting elements LD is injected into the pixel area PXA of each of the pixels PXL by using an inkjet printing method. For example, at least two or more inkjet nozzles are disposed on the first insulating layer INS1, and ink mixed with the plurality of light emitting elements LD may be injected into each pixel area PXA through the inkjet nozzles. The method of injecting the light emitting elements LD into the pixel area PXA is not limited to the above-described embodiment, and the method of injecting the light emitting elements LD may be variously changed.

As described above, as the upper surface (B) of the bank BNK forming the dam part DAM with the insulating pattern INSP has liquid repellency, in the process of injecting the ink into each pixel area PXA, a phenomenon in which the ink flows into other pixels PXL (or adjacent pixels PXL) other than the corresponding pixels PXL may be prevented. That is, by providing the liquid repellency to the upper surface (B) of the bank BNK, the ink including the light emitting elements LD may be accurately positioned within a desired area of the corresponding pixel PXL (or the pixel area PXA of the corresponding pixel PXL).

When the light emitting elements LD are injected into the pixel area PXA, self-alignment of at least one or more first light emitting elements LD1 may be induced due to an electric field formed between the first electrode EL1 and the second electrode EL2. Accordingly, the first light emitting elements LD1 may be aligned between the first electrode EL1 and the second electrode EL2. Further, when the light emitting elements LD are injected into the pixel area PXA, self-alignment of at least one or more second light emitting elements LD2 may be induced due to an electric field formed between the third electrode EL3 and the fourth electrode EL4. Accordingly, the second light emitting elements LD2 may be aligned between the third electrode EL3 and the fourth electrode EL4.

After the light emitting elements LD are self-aligned between the first to fourth electrodes EL1, EL2, EL3, and EL4, the solvent contained in the ink is volatilized, or is removed by another method.

Referring to FIG. 5, FIG. 8A, and FIG. 11A-FIG. 11H, after the light emitting elements LD are aligned in the pixel area PXA (or light emitting area EMA) of each pixel PXL, the second insulating layer INS2 is formed on each of the light emitting elements LD. The second insulating layer INS2 may cover at least one surface (for example, the upper surface thereof in the third direction DR3) of each of the light emitting elements LD to expose both end portions EP1 and EP2 excluding the active layer of each of the light emitting elements LD (see "12" in FIG. 1) to the outside. The second insulating layer INS2 fixes the light emitting elements LD to prevent the light emitting elements LD from deviating from the aligned position.

Through the process of forming the second insulating layer INS2 or an etching process performed before and after thereof, a portion of the first insulating layer INS1 is removed to form a partially opened first insulating layer INS1 to expose one area of each of the first and third electrodes EL1 and EL3.

When the process of forming the first and second insulating layers INS1 and INS2 is performed so that each pixel PXL may be independently or separately driven from pixels PXL adjacent thereto, a portion of each of the first to fourth electrodes EL1, EL2, EL3, and EL4 may be removed. Accordingly, each of the first to fourth electrodes EL1, EL2, EL3, and EL4 provided in each pixel PXL may be electrically and/or physically separated from each of the first to fourth electrodes EL1, EL2, EL3, and EL4 provided to adjacent pixels PXL disposed in the same pixel row and/or the same pixel column.

Referring to FIG. 5, FIG. 8A, and FIG. 11A-FIG. 11I, the first and second contact electrodes CNE1 and CNE2 and the intermediate electrode CTE are formed on the second insulating layer INS2.

The first contact electrode CNE1 may be provided on the first insulating layer INS1, the second insulating layer INS2, the first electrode EL1, and the first end portion EP1 of the first light emitting element LD1. The first contact electrode CNE1 may be directly provided on the first electrode EL1 and the first end portion EP1 of the first light emitting element LD1 that are exposed by the first insulating layer INS1 to electrically connect the first electrode EL1 and the first light emitting element LD1.

The second contact electrode CNE2 may be provided on the first insulating layer INS1, the second insulating layer INS2, the third electrode EL3, and the second end portion EP2 of the second light emitting element LD2, respectively. The second contact electrode CNE2 may be directly provided on the third electrode EL3 and the second end portion EP2 of the second light emitting element LD2 that are exposed by the first insulating layer INS1 to electrically connect the third electrode EL3 and the second light emitting element LD2.

The intermediate electrode CTE may include the first intermediate electrode CTE1 and the second intermediate electrode CTE2.

The first intermediate electrode CTE1 may be provided on the first insulating layer INS1 on the second electrode EL2 to be electrically insulated from the second electrode EL2. For example, the first intermediate electrode CTE1 may be directly provided on the second end portion EP2 of the first light emitting element LD1. The second intermediate electrode CTE2 may be provided on the first insulating layer INS1 on the fourth electrode EL4 to be electrically insulated from the fourth electrode EL4. For example, the second intermediate electrode CTE2 may be directly provided on the first end portion EP1 of the second light emitting element LD2.

Subsequently, the third insulating layer INS3 is formed on the first contact electrode CNE1, the second contact electrode CNE2, and the intermediate electrode CTE. The third insulating layer INS3 may protect the first contact electrode CNE1, the second contact electrode CNE2, and the intermediate electrode CTE by entirely covering the first contact electrode CNE1, the second contact electrode CNE2, and the intermediate electrode CTE.

Figure 12:
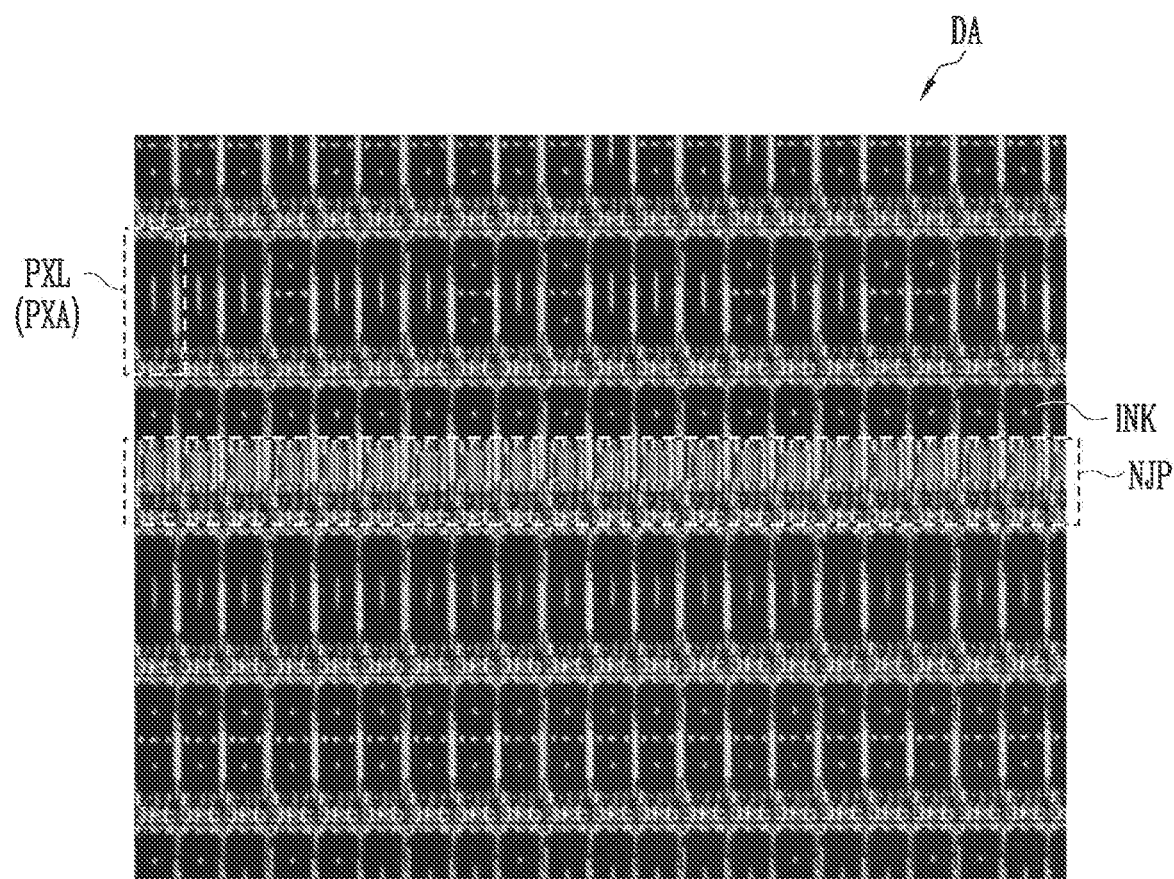
FIG. 12 illustrates an image of an area of a display device including pixels including an ink non-ejected area.
Figure 13A:
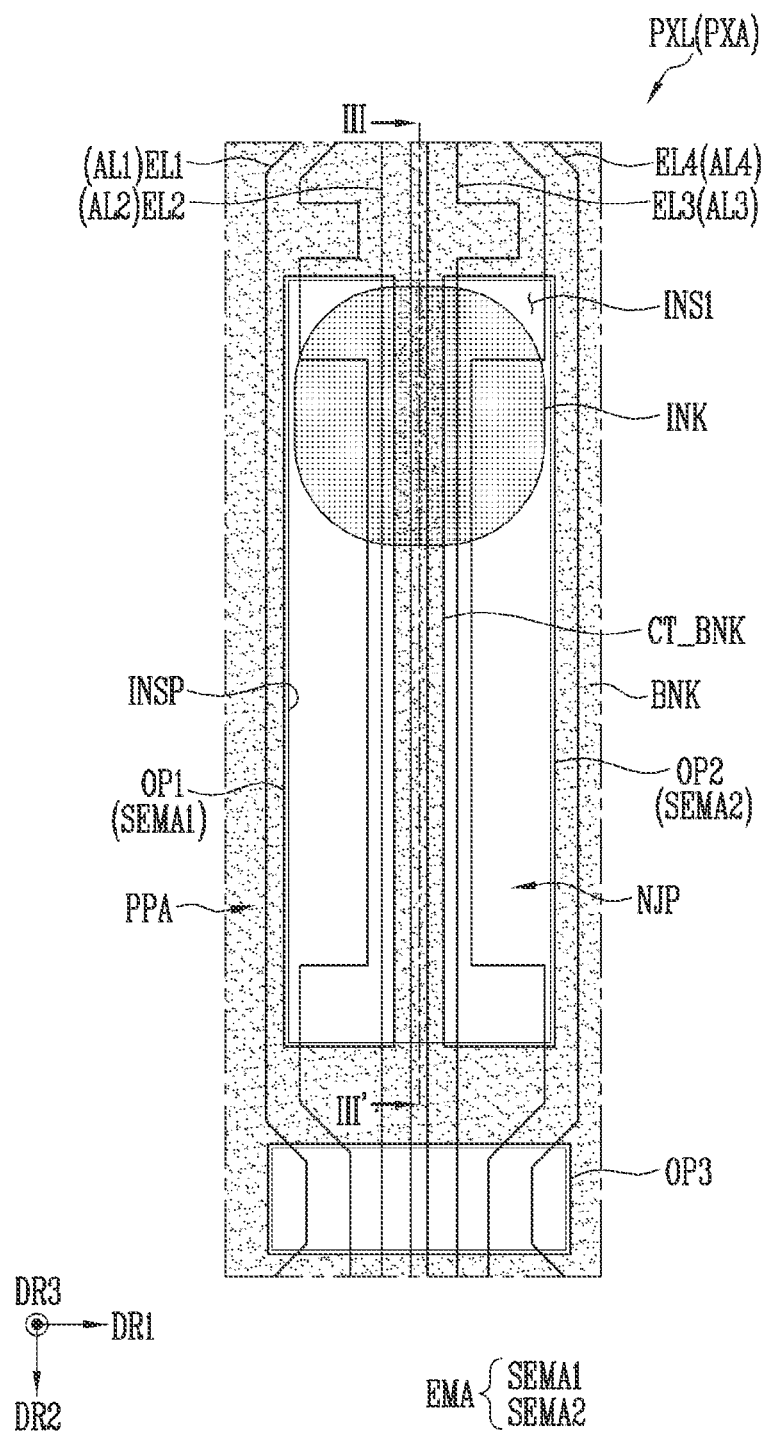
FIG. 13A and FIG. 13B illustrate schematic top plan views of a manufacturing method of a pixel according to an embodiment of the present disclosure.
Figure 13B:
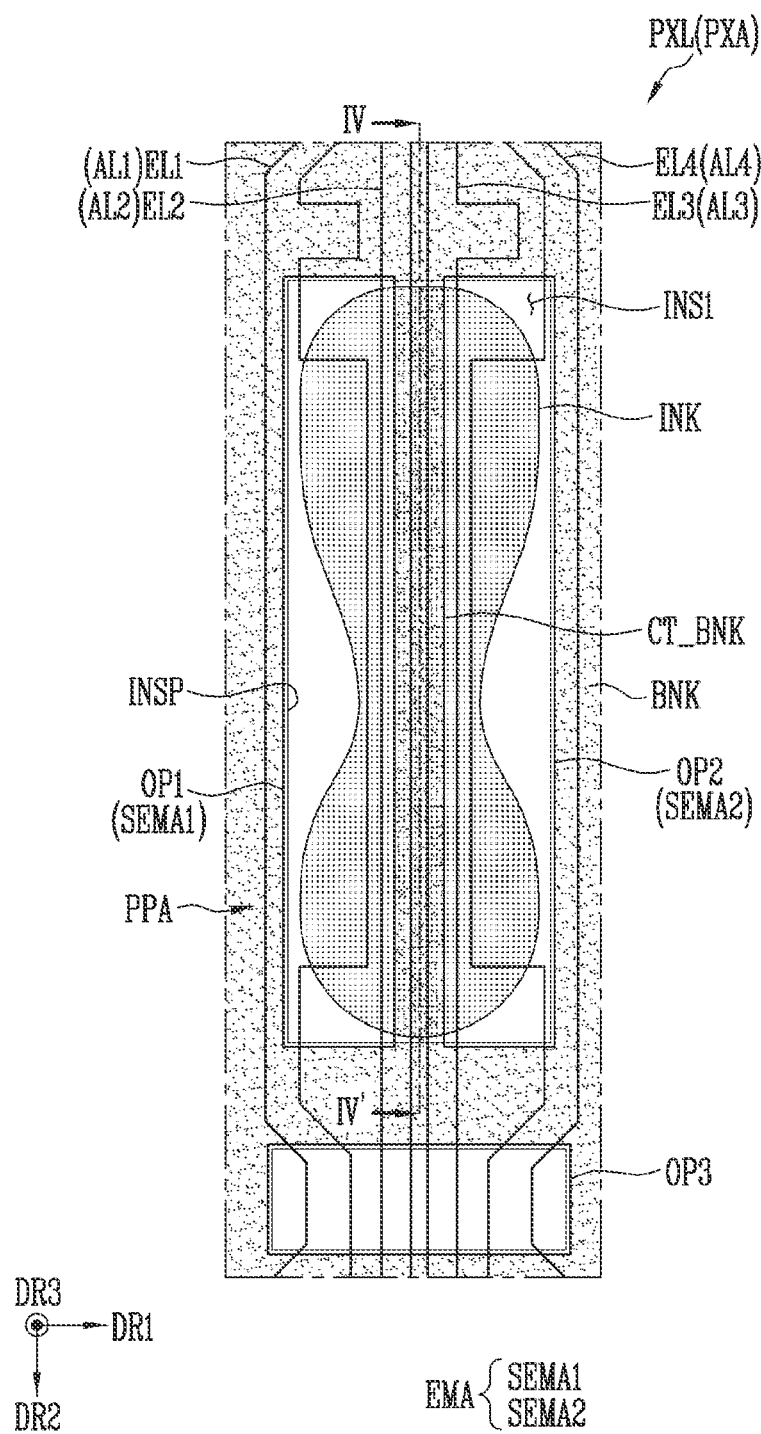
Figure 14A:
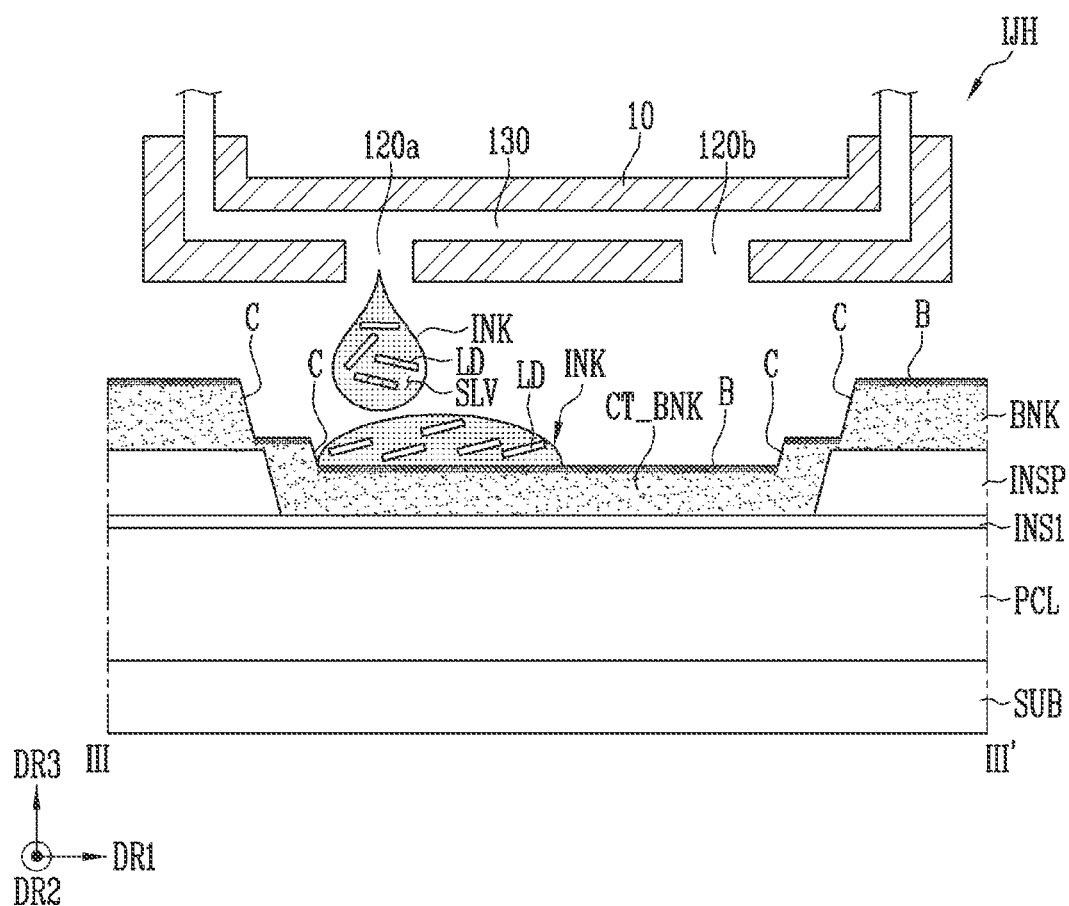
FIG. 14A illustrates a cross-sectional view taken along the line III-III' of FIG. 13A.
Figure 14B:
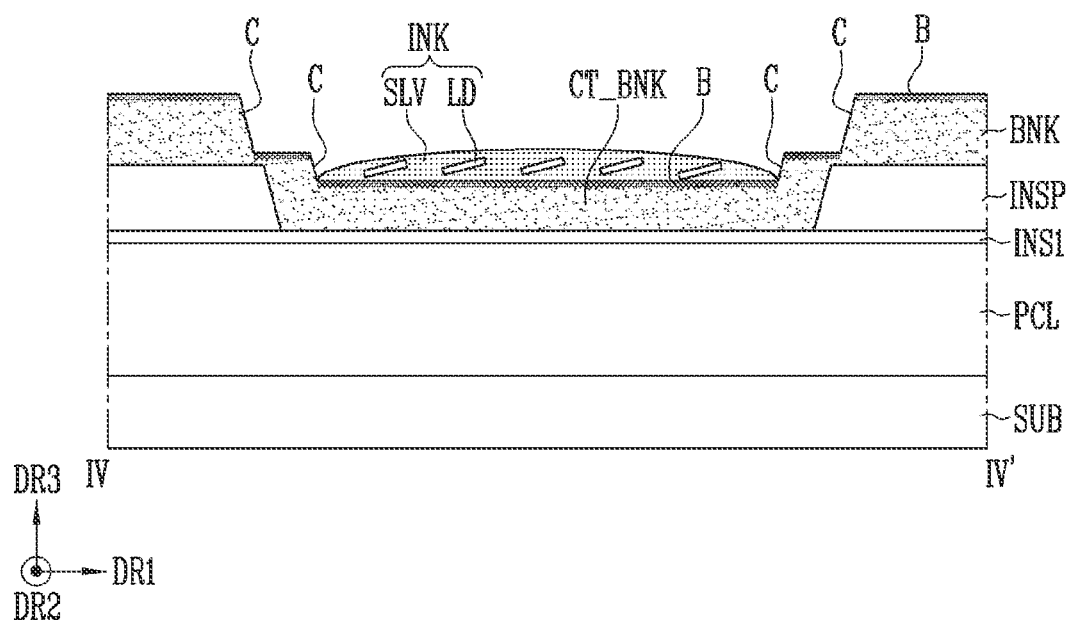
FIG. 14B is a cross-sectional view taken along the line IV-IV' of FIG. 13B.

FIG. 12 illustrates an image of an area of a display device including pixels including an ink non-ejected area, FIG. 13A and FIG. 13B illustrate schematic top plan views of a manufacturing method of a pixel according to an embodiment of the present disclosure, FIG. 14A illustrates a cross-sectional view taken along the line III-Ill' of FIG. 13A, and FIG. 14B is a cross-sectional view taken along the line IV-IV' of FIG. 13B.

FIG. 13A-FIG. 14B illustrate a process of supplying the light emitting elements LD from among processes of manufacturing the pixel PXL of FIG. 5.

For convenience, constituent elements included in the pixel circuit layer PCL are omitted in FIG. 14A and FIG. 14B.

Referring to FIG. 12-FIG. 14B, the light emitting elements LD are supplied (e.g., injected) to the pixel area PXA of each pixel PXL on the substrate SUB including the pixel circuit layer PCL, first to fourth alignment wires AL1, AL2, AL3, and AL4, the first insulating layer INS1, the bank BNK, and the intermediate bank CT_BNK.

In this case, the first to fourth alignment wires AL1, AL2, AL3, and AL4 may be respectively provided in a form of alignment wire before being separated into each of individual electrodes corresponding to a serial stage (e.g., a set or predetermined serial stage) of the pixel PXL. For example, the first electrode EL1 of which a portion is removed in a process after the light emitting elements LD are aligned may be provided in the form of the first alignment wire AL1 before the light emitting elements LD are aligned. The second electrode EL2 of which a portion is removed in a process after the light emitting elements LD are aligned may be provided in the form of the second alignment wire AL2 before the light emitting elements LD are aligned. The third electrode EL3 of which a portion is removed in a process after the light emitting elements LD are aligned may be provided in the form of the third alignment wire AL3 before the light emitting elements LD are aligned. The fourth electrode EL4 of which a portion is removed in a process after the light emitting elements LD are aligned may be provided in the form of the fourth alignment wire AL4 before the light emitting elements LD are aligned.

In the embodiment, the light emitting elements LD may be supplied (or injected) into each pixel area PXA through an inkjet printing method. For example, an inkjet head unit IJH may be disposed so that first and second nozzles 120a and 120b are properly positioned in each pixel area PXA, on the substrate SUB including the pixel circuit layer PCL, the first insulating layer INS1, the first to fourth alignment wires AL1, AL2, AL3, and AL4, the insulating pattern INSP, the bank BNK, and the intermediate bank CT_BNK. Here, the inkjet head unit IJH may include a print head 10, and the first and second nozzles 120a and 120b positioned at a lower surface of the print head 10. The print head 10 may have an extended shape along one direction, but the present disclosure is not limited thereto. The print head 10 may include an inner tube 130 formed along an extension direction. The first and second nozzles 120a and 120b may be connected to the inner tube 130 of the inkjet head 10. An ink INK including a solvent SLV and a plurality of light emitting elements LD contained (or dispersed) in the solvent SLV is supplied into the inner tube 130, and the ink INK may flow along the inner tube 130 to be sprayed (or ejected) through each of the first and second nozzles 120a and 120b. The ink INK ejected through the first and second nozzles 120a and 120b may be supplied to the first insulating layer INS1 of each pixel area PXA. An amount of the ink INK ejected through the first and second nozzles 120a and 120b may be adjusted according to a signal applied to the corresponding nozzle.

In the embodiment, the first nozzle 120a may correspond to the upper end portion (or upper side) of each pixel area PXA, and the second nozzle 120b may correspond to the lower end portion (or lower side) of the corresponding pixel area PXA. In this case, when the ink INK is not ejected from the second nozzle 120b but the ink INK is ejected only from the first nozzle 120a, the ink INK may supplied only to the upper end portion of the corresponding pixel area PXA, but the ink INK may not be supplied to the lower end portion of the pixel area PXA. In other words, the pixel area PXA may include a non-ejected area NJP in which the ink INK is not ejected. The non-ejected area NJP may be one area of the pixel area PXA in which the light emitting elements LD are not disposed. The pixel PXL provided (or included) in the pixel area PXA including the non-ejected area NJP may be recognized as a defective pixel PXL that does not generate light. Here, the defective pixel PXL may be a pixel recognized as a dark spot. For example, as shown in FIG. 12, when the pixels PXL included in the same pixel row in the display area DA include the non-ejected area NJP, a line-shaped dark spot defect may occur in a horizontal direction, or a defect due to a difference in luminance between the pixels PXL including the non-ejected area NJP and the pixels PXL adjacent thereto may occur.

In this case, as described above, because the side surface (C) of the bank BNK and the side surface (C) of the intermediate bank CT_BNK are not liquid-repellent-treated, they may have the liquid lyophilic characteristic (for example, a characteristic that a liquid including water and the like is easily bonded to other materials). In this case, the ink INK ejected only into the upper end portion of the pixel area PXA spontaneously moves to the side surface (C) of the bank BNK and the side surface (C) of the intermediate bank CT_BNK (e.g., to be wetted) to the non-ejected area NJP of the pixel area PXA to be dispersed or spread. Accordingly, the ink INK including the light emitting elements LD may be entirely and evenly spread in the pixel area PXA. In the embodiment, the intermediate bank CT_BNK may be a droplet spreading control member that further spreads the ink INK ejected only into the upper end portion of the pixel area PXA up to the lower end portion of the pixel area PXA.

In the display device according to the above-described embodiment, even if the ink INK is ejected only into one area of the pixel area PXA, it is possible to reduce an area of the pixel area PXA in which the ink INK is not ejected, by controlling the ink INK to spread to the other area of the pixel area PXA by one area (for example, side surface (C)) of the bank BNK and one area (for example, side surface (C)) of the intermediate bank CT_BNK to which the lyophilic characteristic are given. Accordingly, the light emitting elements LD are entirely and evenly distributed in the pixel area PXA, so that dark spot defects due to the non-positioning of the light emitting elements LD may be reduced or minimized.

Figure 15:
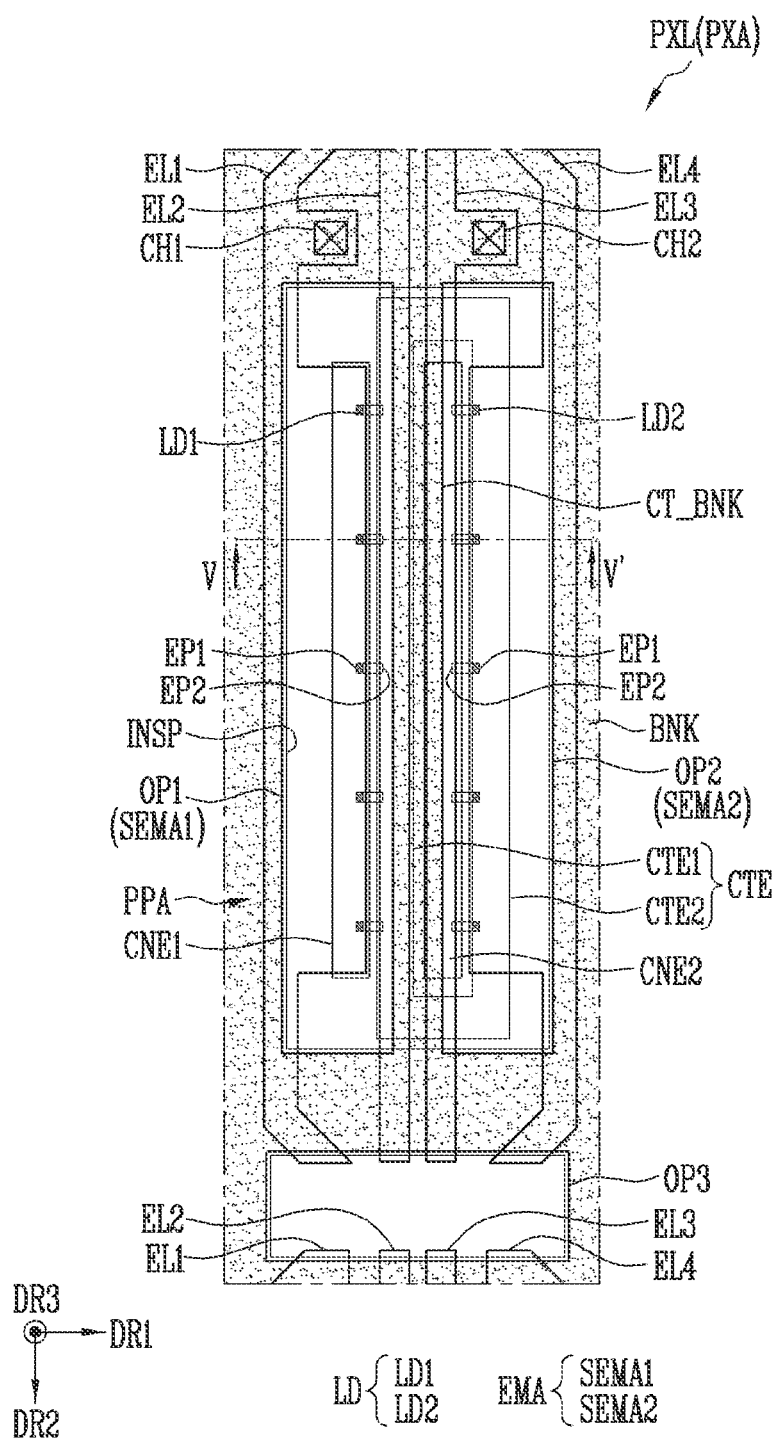
FIG. 15 illustrates a schematic top plan view of a pixel according to another embodiment of the present disclosure.
Figure 16:
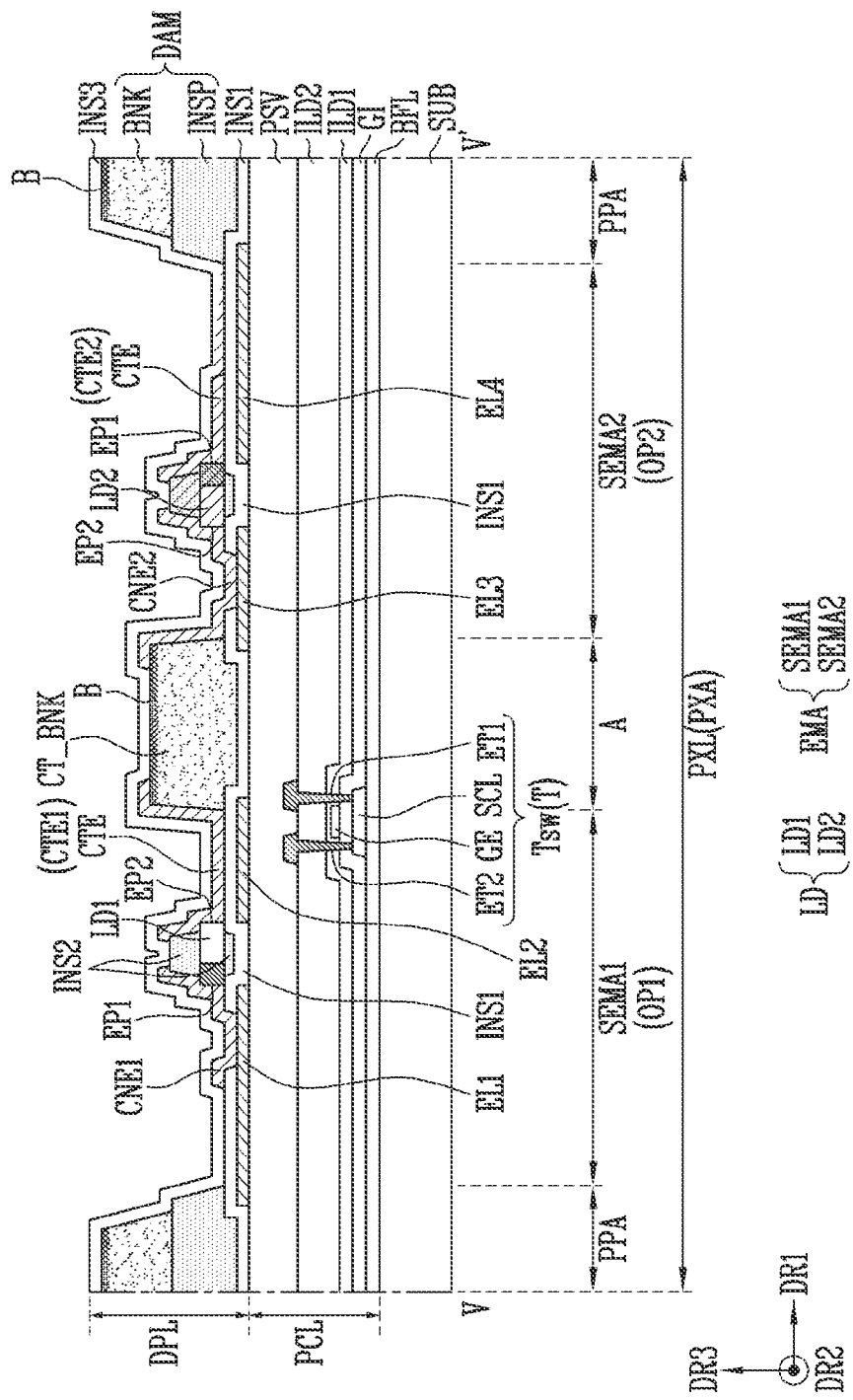
FIG. 16 illustrates a cross-sectional view taken along the line V-V' of FIG. 15.

FIG. 15 illustrates a schematic top plan view of a pixel according to another embodiment of the present disclosure, and FIG. 16 illustrates a cross-sectional view taken along the line V-V' of FIG. 15.

The pixel PXL shown in FIG. 15 and FIG. 16 may have configurations that are substantially the same as or similar to those of the pixel shown in FIG. 5 and FIG. 8A, except that the first to fourth electrodes EL1, EL2, EL3, and EL4 are directly disposed on the pixel circuit layer PCL.

Therefore, in relation to the pixels of FIG. 15 and FIG. 16, differences from the above-described embodiment will be mainly described in order to avoid duplicate descriptions.

Referring to FIG. 15 and FIG. 16, the pixel PXL may include the substrate SUB, the pixel circuit layer PCL, and the display element layer DPL.

The display element layer DPL may include the first to fourth electrodes EL1, EL2, EL3, and EL4, the insulating pattern INSP, the bank BNK, the intermediate bank CT_BNK, the light emitting elements LD, the first and second contact electrodes CNE1 and CNE2, and the intermediate electrode CTE, and the first to third insulating layers INS1, INS2, and INS3.

Each of the first to fourth electrodes EL1, EL2, EL3, and EL4 may be directly disposed on the pixel circuit layer PCL. For example, the first to fourth electrodes EL1, EL2, EL3, and EL4 may be directly disposed on the passivation layer PSV of the pixel circuit layer PCL. In this case, the first to fourth electrodes EL1, EL2, EL3, and EL4 may be made of a conductive material (or substance) having a suitable level of reflectivity (e.g., a set or predetermined level of reflectivity) or more so that the light emitted from the light emitting elements LD is directed to the image display direction of the display device. In this case, each of the first to fourth electrodes EL1, EL2, EL3, and EL4 may be used as a reflective member that independently directs the light emitted from the light emitting elements LD to the image display direction of the display device.

The intermediate bank CT_BNK may be disposed between the first sub-light emitting area SEMA1 and the second sub-light emitting area SEMA2 of each pixel PXL to partially overlap the second and third electrodes EL2 and EL3. For example, the intermediate bank CT_BNK may be provided in at least one area of the second electrode EL2 and at least one area of the third electrode EL3 to partially overlap the second and third electrodes EL2 and EL3.

As described above, when the first to fourth electrodes EL1, EL2, EL3, and EL4 are directly disposed on the pixel circuit layer PCL, the bank BNK and the intermediate bank CT_BNK may be configured to include a reflective material. Accordingly, some of light proceeding from respective end portions EP1 and EP2 of the light emitting elements LD to the first direction DR1 may be reflected by the bank BNK and the intermediate bank CT_BNK to proceed in the image display direction of the display device.

When each of the first to fourth electrodes EL1, EL2, EL3, and EL4 is directly disposed on the pixel circuit layer PCL, an interval between the light emitting elements LD and the light conversion pattern layer (see 'LCP' in FIG. 9) that may be disposed thereon may be reduced. Accordingly, the light emitted from the light emitting elements LD may be concentrated (or proceed) to the light conversion pattern layer LCP without loss. In this case, a larger amount of light is incident on the light conversion pattern layer LCP, so that an amount (or intensity) of light finally emitted from the light conversion pattern layer LCP may increase, and thus the light emission efficiency of each pixel PXL may be further improved.

Figure 17:
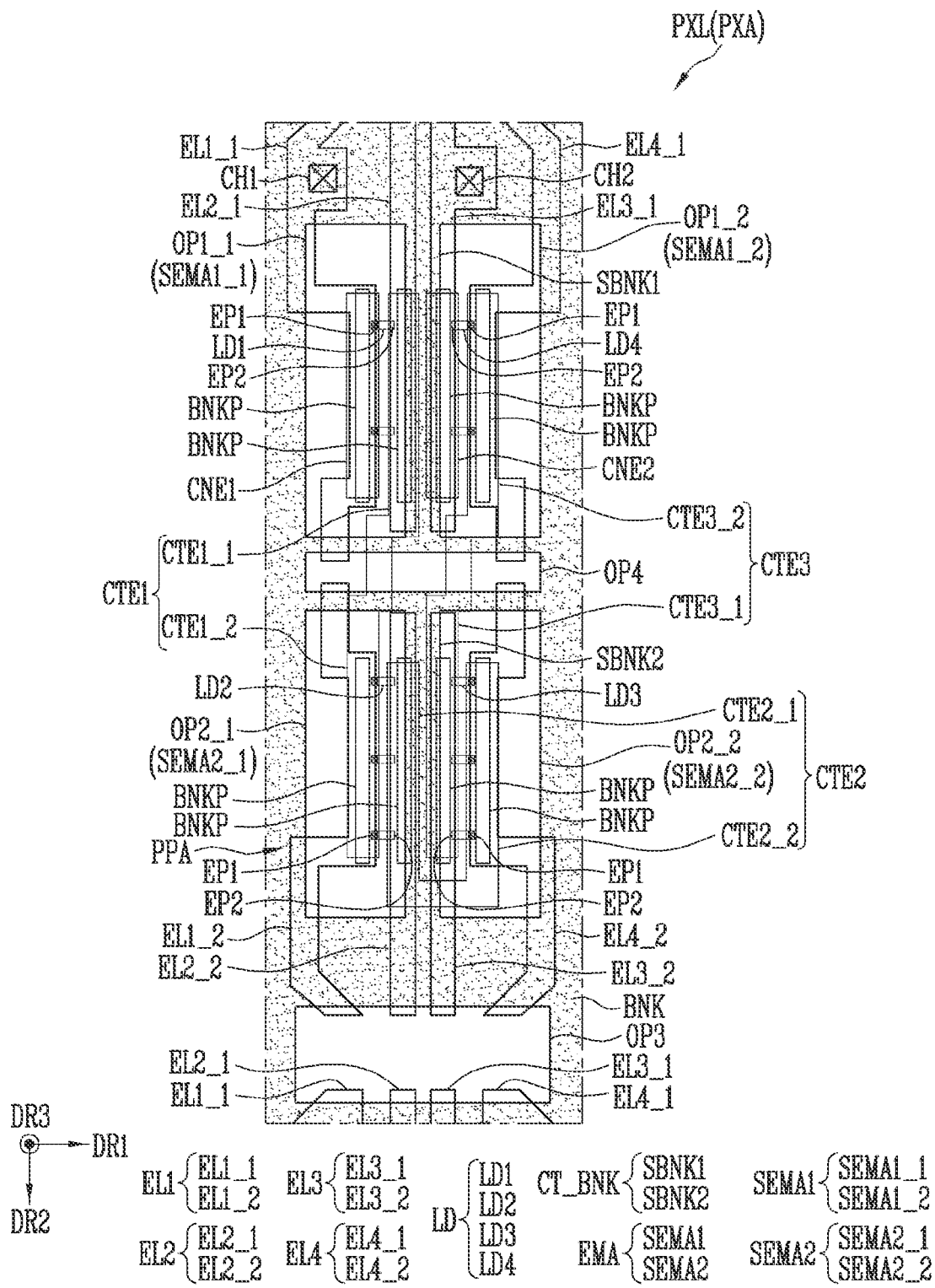
FIG. 17 illustrates a schematic top plan view of a pixel according to another embodiment of the present disclosure.
Figure 18:
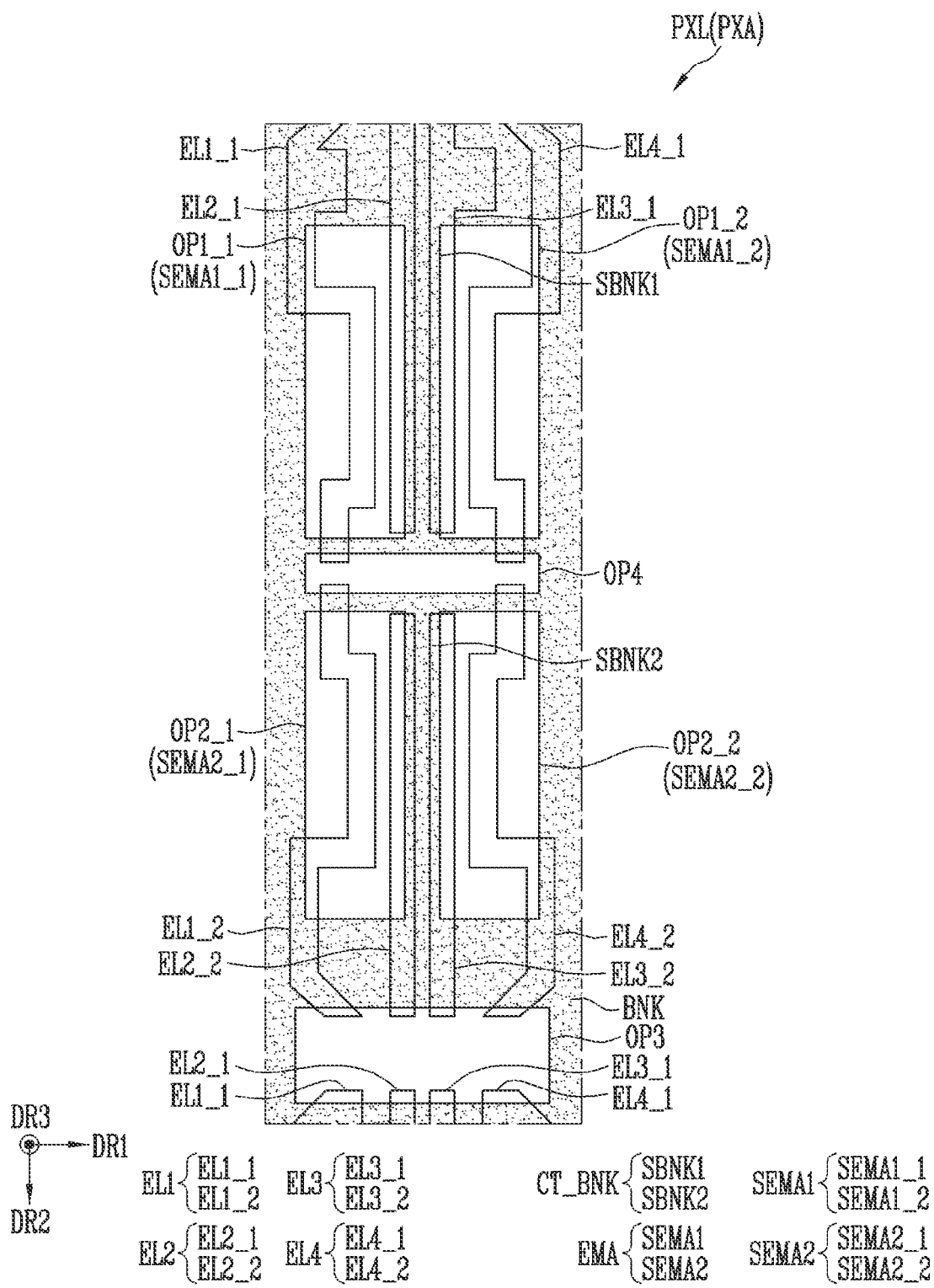
FIG. 18 illustrates a schematic top plan view of only a bank, an intermediate bank, and first to fourth electrodes, which are included in the pixel of FIG. 17.

FIG. 17 illustrates a schematic top plan view of a pixel according to another embodiment of the present disclosure, and FIG. 18 illustrates a schematic top plan view of only a bank, an intermediate bank, and first to fourth electrodes, which are included in the pixel of FIG. 17.

In relation to the pixels of FIG. 17 and FIG. 18, differences from the above-described embodiment will be mainly described in order to avoid duplicate descriptions. Constituent elements not specifically described in the present disclosure refer to the embodiment described above, the same reference numerals designate the same constituent elements, and the similar reference numerals designate the similar constituent elements.

Referring to FIG. 17 and FIG. 18, each pixel PXL may be provided and/or formed in the pixel area PXA provided on the substrate SUB. The pixel area PXA may include the light emitting area EMA and the peripheral area PPA. In the embodiment, the light emitting area EMA may include the first sub-light emitting area SEMA1 and the second sub-light emitting area SEMA2. The first sub-light emitting area SEMA1 may include a (1-1)-th sub-light emitting area SEMA1_1 and a (1-2)-th sub-light emitting area SEMA1_2 disposed to be adjacent to each other in the first direction DR1. The second sub-light emitting area SEMA2 may include a (2-1)-th sub-light emitting area SEMA2_1 and a (2-2)-th sub-light emitting area SEMA2_2 disposed to be adjacent to each other in the first direction DR1.

Each pixel PXL may include the bank BNK disposed in the peripheral area PPA.

The bank BNK may be a structure that defines (or partitions) the pixel area PXA or light emitting area EMA of each of the corresponding pixel PXL and pixels adjacent thereto, and for example, may be a pixel defining film. For example, the pixel area PXA in which each pixel PXL is provided may include four sub-light emitting areas partitioned by the bank BNK. Here, the four sub-light emitting areas may include the (1-1)-th sub-light emitting areas SEMA1_1, the (1-2)-th sub-light emitting areas SEMA1_2, the (2-1)-th sub-light emitting areas SEMA2_1, and the (2-2)-th sub-light emitting area SEMA2_2.

The bank BNK may include at least one or more openings exposing components disposed under the bank BNK in the pixel area PXA of the corresponding pixel PXL. As an example, the bank BNK may include first to fourth openings OP1, OP2, OP3, and OP4 exposing components disposed under the bank BNK in the pixel area PXA of the corresponding pixel PXL. The first opening OP1 may include a (1-1)-th opening OP1_1 and a (1-2)-th opening OP1_2 disposed to be adjacent to each other in the first direction DR1, and the second opening OP2 may include a (2-1)-th opening OP2_1 and a (2-2)-th opening OP2_2 disposed to be adjacent to each other in the first direction DR1

In the embodiment, the light emitting area EMA of each pixel PXL and the first and second openings OP1 and OP2 of the bank BNK may correspond to each other. For example, the (1-1)-th sub-light emitting area SEMA1_1 of each pixel PXL may correspond to the (1-1)-th opening OP1_1 of the bank BNK, the (1-2)-th sub-light emitting area SEMA1_2 of the corresponding pixel PXL may correspond to the (1-2)-th opening OP1_2 of the bank BNK, the (2-1)-th sub-light emitting area SEMA2_1 of the corresponding pixel PXL may correspond to the (2-1)-th opening OP2_1 of the bank BNK, and the (2-2)-th sub-light emitting area SEMA2_2 of the corresponding pixel PXL may correspond to the (2-2)-th opening OP2_2 of the bank BNK In the pixel area PXA, the third opening OP3 of the bank BNK may be disposed to be spaced from the first and second openings OP1 and OP2, and may be disposed at a lower side of the pixel area PXA.

Although not directly shown in the drawing, each pixel PXL may include an insulating pattern (see 'INSP' in FIG. 5) disposed in the peripheral area PXA. The insulating pattern INSP may be disposed under the bank (BNK) to support the bank BNK. The insulating pattern INSP may implement a dam part DAM together with the bank BNK.

Each pixel PXL may include the first electrode EL1, the second electrode EL2, the third electrode EL3, and the fourth electrode EL4 spaced from each other in the first direction DR1.

Each of the first to fourth electrodes EL1, EL2, EL3, and EL4 may include two electrodes disposed in the same column within the pixel area PXA of each pixel PXL. For example, the first electrode EL1 may include a (1-1)-th electrode EL1_1 and a (1-2) electrode EL1_2 that are disposed in the same column and are spaced from each other in the second direction DR2 to face (or be opposite) each other, the second electrode EL2 may include a (2-1)-th electrode EL2_1 and a (2-2) electrode EL2_2 that are disposed in the same column and are spaced from each other in the second direction DR2 to face (or be opposite) each other, the third electrode EL3 may include a (3-1)-th electrode EL3_1 and a (3-2) electrode EL3_2 that are disposed in the same column and are spaced from each other in the second direction DR2 to face (or be opposite) each other, and the fourth electrode EL4 may include a (4-1)-th electrode EL4_1 and a (4-2) electrode EL4_2 that are disposed in the same column and are spaced from each other in the second direction DR2 to face (or be opposite) each other.

The (1-1)-th electrode EL1_1, the (2-1)-th electrode EL2_1, the (3-1)-th electrode EL3_1, and the (4-1)-th electrode EL4_1 may be disposed in the first sub-light emitting area SEMA1 of the corresponding pixel PXL. For example, the (1-1)-th electrode EL1_1 and the (2-1)-th electrode EL2_1 may be disposed in the (1-1)-th sub-light emitting area SEMA1_1 of the first sub-light emitting area SEMA1, and the (3-1)-th electrode EL3_1 and the (4-1)-th electrode EL4_1 may be disposed in the (1-2)-th sub-light emitting area SEMA1_2 of the first sub-light emitting area SEMA1.

The (1-2)-th electrode EL1_2, the (2-2)-th electrode EL2_2, the (3-2)-th electrode EL3_2, and the (4-2)-th electrode EL4_2 may be disposed in the second sub-light emitting area SEMA2 of the corresponding pixel PXL. For example, the (1-2)-th electrode EL1_2 and the (2-2)-th electrode EL2_2 may be disposed in the (2-1)-th sub-light emitting area SEMA2_1 of the second sub-light emitting area SEMA2, and the (3-2)-th electrode EL3_2 and the (4-2)-th electrode EL4_2 may be disposed in the (2-2)-th sub-light emitting area SEMA2_2 of the second sub-light emitting area SEMA2.

One end portion of each of the (1-1)-th to (4-1)-th electrodes EL1_1, EL2_1, EL3_1, and EL4_1 and one end portion of each of the (1-2)-th to (4-2)-th electrodes EL1_2, EL2_2, EL3_2, and EL4_2 may be disposed within the third opening OP3 of the bank BNK. The first to fourth electrodes EL1, EL2, EL3, and EL4 may be separated from the other electrodes (for example, electrodes of the pixels PXL adjacent in the second direction DR2) in the third opening OP3 after alignment of the light emitting elements LD. That is, the third opening OP3 of the bank BNK may be provided for a separation process for the first to fourth electrodes EL1, EL2, EL3, and EL4.

Further, one end portion of each of the (1-1)-th to (4-1)-th electrodes EL1_1, EL2_1, EL3_1, and EL4_1 and the other end portion of each of the (1-2)-th to (4-2)-th electrodes EL1_2, EL2_2, EL3_2, and EL4_2 may be disposed within the fourth opening OP4 of the bank BNK. Each of the (1-1)-th to (4-1)-th electrodes EL1_1, EL2_1, EL3_1, and EL4_1 and each of the (1-2)-th to (4-2)-th electrodes EL1_2, EL2_2, EL3_2, and EL4_2 are separated from each other in the fourth opening OP4 after the light emitting elements LD are aligned such that the light emitting unit (see 'EMU' in FIG. 4) of each pixel PXL may be configured of four serial stages. In the embodiment, the fourth opening OP4 of the bank BNK may correspond to a center (or a central region) of an area of the light emitting area EMA of the corresponding pixel PXL.

In the first sub-light emitting area SEMA1, each of the (1-1)-th to (4-1)-th electrodes EL1_1, EL2_1, EL3_1, and EL4_1 may be disposed to be spaced from an electrode adjacent along the first direction DR1. For example, the (1-1)-th electrode EL1_1 may be disposed to be spaced from the (2-1)-th electrode EL2_1, the (2-1)-th electrode EL2_1 may be disposed to be spaced from the (3-1)-th electrode EL3_1, and the (3-1)-th electrode EL3_1 may be disposed to be spaced from the (4-1)-th electrode EL4_1 in the first direction DR1. A shape between the (1-1)-th electrode EL1_1 and the (2-1)-th electrode EL2_1, a shape between the (2-1)-th electrode EL2_1 and the (3-1)-th electrode EL3_1, and a shape between the (3-1)-th electrode EL3_1 and the (4-1)-th electrode EL4_1 may be the same, but the present disclosure is not limited thereto. In some embodiments, a shape between the (1-1)-th electrode EL1_1 and the (2-1)-th electrode EL2_1, a shape between the (2-1)-th electrode EL2_1 and the (3-1)-th electrode EL3_1, and a shape between the (3-1)-th electrode EL3_1 and the (4-1)-th electrode EL4_1 may be different from each other.

In the second sub-light emitting area SEMA2, each of the (1-2)-th to (4-2)-th electrodes EL1_2, EL2_2, EL3_2, and EL4_2 may be disposed to be spaced from an electrode adjacent along the first direction DR1. For example, the (1-2)-th electrode EL1_2 may be disposed to be spaced from the (2-2)-th electrode EL2_2, the (2-2)-th electrode EL2_2 may be disposed to be spaced from the (3-2)-th electrode EL3_2, and the (3-2)-th electrode EL3_2 may be disposed to be spaced from the (4-2)-th electrode EL4_2 in the first direction DR1. A shape between the (1-2)-th electrode EL1_2 and the (2-2)-th electrode EL2_2, a shape between the (2-2)-th electrode EL2_2 and the (3-2)-th electrode EL3_2, and a shape between the (3-2)-th electrode EL3_2 and the (4-2)-th electrode EL4_2 may be the same, but the present disclosure is not limited thereto. In some embodiments, a shape between the (1-2)-th electrode EL1_2 and the (2-2)-th electrode EL2_2, a shape between the (2-2)-th electrode EL2_2 and the (3-2)-th electrode EL3_2, and a shape between the (3-2)-th electrode EL3_2 and the (4-2)-th electrode EL4_2 may be different from each other.

The first to fourth electrodes EL1, EL2, EL3, and EL4 may be made of a material having a constant reflectance in order to direct light emitted from each of the light emitting elements LD in the image display direction (for example, front direction) of the display device. The first to fourth electrodes EL1, EL2, EL3, and EL4 may be made of a conductive material having a constant reflectance.

Because the (1-1)-th electrode EL1_1, the (2-1)-th electrode EL2_1, the (3-1)-th electrode EL3_1, and the (4-1)-th electrode EL4_1 are symmetrical to the (1-2)-th electrode EL1_2, the (2-2)-th electrode EL2_2, the (3-2)-th electrode EL3_2, and the (4-2)-th electrode EL4_2 based on the fourth opening OP4 of the bank BNK, the (1-1)-th electrode EL1_1, the (2-1)-th electrode EL2_1, the (3-1)-th electrode EL3_1, and the (4-1)-th electrode EL4_1 will be mainly described.

The (1-1)-th electrode EL1_1 may have a shape curved in the first direction DR1 toward the (2-1)-th electrode EL2_1 in the first sub-light emitting area SEMA1. The curved shape of the (1-1)-th electrode EL1_1 may be provided in order to maintain an interval between the (1-1)-th electrode EL1_1 and the (2-1)-th electrode EL2_1 at a constant interval (or at a substantially constant interval) in the first sub-light emitting area SEMA1. Similarly, the (4-1)-th electrode EL4_1 may have a shape curved in the first direction DR1 toward the (3-1)-th electrode EL3_1 in the first sub-light emitting area SEMA1. The curved shape of the (4-1)-th electrode EL4_1 may be provided in order to maintain an interval between the (3-1)-th electrode EL3_1 and the (4-1)-th electrode EL4_1 at a constant interval (or a substantially constant interval) in the first sub-light emitting area SEMA1. However, the shapes of the (1-1)-th electrode EL1_1 and the (4-1)-th electrode EL4_1 are not limited thereto. In some embodiments, the (1-1)-th electrode EL1_1 and the (4-1)-th electrode EL4_1 may include the protrusion as described in FIG. 5 instead of the curved shape. In another embodiment, the (1-1)-th electrode EL1_1 and the (4-1)-th electrode EL4_1 may have a constant width (or a substantially constant width) in the first direction DR1, and may have a bar shape extending in the second direction DR2.

The (1-1)-th electrode EL1_1 may be connected to the first transistor T1 described with reference to FIG. 4 through the first contact hole CH1, and the (3-1)-th electrode EL3_1 may be connected to the second driving power source VSS (or second power line PL2) described with reference to FIG. 4 through the second contact hole CH2. In the embodiment, the (1-1)-th electrode EL1_1 may be an anode of the light emitting unit EMU of each pixel PXL, and the (3-1)-th electrode EL3_1 may be a cathode of the light emitting unit EMU of the corresponding pixel PXL.

A structure (for example, a single-filmed or multi-filmed structure) of each of the (1-1)-th electrode EL1_1, the (2-1)-th electrode EL2_1, the (3-1)-th electrode EL3_1, and the (4-1)-th electrode EL4_1, the (1-2)-th electrode EL1_2, the (2-2)-th electrode EL2_2, the (3-2)-th electrode EL3_2, and the (4-2)-th electrode EL4_2 may be substantially the same as or similar to the structure of each of the first to fourth electrodes EL1, EL2, EL3, and EL4 described with reference to FIG. 5 and FIG. 8A.

Each pixel PXL may include a bank pattern BNKP overlapping one area of each of the (1-1)-th electrode EL1_1, the (2-1)-th electrode EL2_1, the (3-1)-th electrode EL3_1, and the (4-1)-th electrode EL4_1, the (1-2)-th electrode EL1_2, the (2-2)-th electrode EL2_2, the (3-2)-th electrode EL3_2, and the (4-2)-th electrode EL4_2. The bank pattern BNKP may include a first bank pattern BNKP overlapping one area of the (1-1)-th electrode EL1_1, a second bank pattern BNKP overlapping one area of the (2-1)-th electrode EL2_1, a third bank pattern BNKP overlapping one area of the (3-1)-th electrode EL3_1, a fourth bank pattern BNKP overlapping one area of the (4-1)-th electrode EL4_1, a fifth bank pattern BNKP overlapping one area of the (1-2)-th electrode EL1_2, a sixth bank pattern BNKP overlapping one area of the (2-2)-th electrode EL2_2, a seventh bank pattern BNKP overlapping one area of the (3-2)-th electrode EL3_2, and an eighth bank pattern BNKP overlapping one area of the (4-2)-th electrode EL4_2.

The first bank pattern BNKP, the second bank pattern BNKP, the third bank pattern BNKP, and the fourth bank pattern BNKP, the fifth bank pattern BNKP, the sixth bank pattern BNKP, the seventh bank pattern BNKP, and the eighth bank pattern BNKP are disposed to be separated from each other in the light emitting area EMA of each pixel PXL, and they may upwardly protrude one area of each of the (1-1)-th electrode EL1_1, the (2-1)-th electrode EL2_1, the (3-1)-th electrode EL3_1, and the (4-1)-th electrode EL4_1, the (1-2)-th electrode EL1_2, the (2-2)-th electrode EL2_2, the (3-2)-th electrode EL3_2, and the (4-2)-th electrode EL4_2.

While FIG. 17 illustrates that the first bank pattern BNKP, the second bank pattern BNKP, the third bank pattern BNKP, and the fourth bank pattern BNKP are separated from the fifth bank pattern BNKP, the sixth bank pattern BNKP, the seventh bank pattern BNKP, and the eighth bank pattern BNKP, respectively, the present disclosure is not limited thereto. In some embodiments, the first bank pattern BNKP may be integrally formed with the fifth bank pattern BNKP, and the fourth bank pattern BNKP may be integrally formed with the eighth bank pattern BNKP.

The pixel PXL may include a plurality of light emitting elements LD. The light emitting elements LD may include a first light emitting element LD1, a second light emitting element LD2, a third light emitting element LD3, and a fourth light emitting element LD4.

The first light emitting element LD1 may be disposed between the (1-1)-th electrode EL1_1 and the (2-1)-th electrode EL2_1 in the (1-1)-th sub-light emitting area SEMA1_1 of each pixel PXL. The first end portion EP1 of the first light emitting element LD1 may face the (1-1)-th electrode EL1_1, and the second end portion EP2 of the first light emitting element LD1 may face the (2-1)-th electrode EL2_1. When a plurality of first light emitting elements LD1 are provided, the plurality of first light emitting elements LD1 may be mutually connected in parallel between the (1-1)-th electrode EL1_1 and the (2-1)-th electrode EL2_1, and may form a first serial stage.

The second light emitting element LD2 may be disposed between the (1-2)-th electrode EL1_2 and the (2-2)-th electrode EL2_2 in the (2-1)-th sub-light emitting area SEMA2_1 of the corresponding pixel PXL. The first end portion EP1 of the second light emitting element LD2 may face the (1-2)-th electrode EL1_2, and the second end portion EP2 of the second light emitting element LD2 may face the (2-2)-th electrode EL2_2. When a plurality of second light emitting elements LD2 are provided, the plurality of second light emitting elements LD2 may be mutually connected in parallel between the (1-2)-th electrode EL1_2 and the (2-2)-th electrode EL2_2, and may form a second serial stage.

The third light emitting element LD3 may be disposed between the (3-2)-th electrode EL3_2 and the (4-2)-th electrode EL4_2 in the (2-2)-th sub-light emitting area SEMA2_2 of the corresponding pixel PXL. The first end portion EP1 of the third light emitting element LD3 may face the (4-2)-th electrode EL4_2, and the second end portion EP2 of the third light emitting element LD3 may face the (3-2)-th electrode EL3_2. When a plurality of third light emitting elements LD3 are provided, the plurality of third light emitting elements LD3 may be mutually connected in parallel between the (3-2)-th electrode EL3_2 and the (4-2)-th electrode EL4_2, and may form a third serial stage.

The fourth light emitting element LD4 may be disposed between the (3-1)-th electrode EL3_1 and the (4-1)-th electrode EL4_1 in the (1-2)-th sub-light emitting area SEMA1_2 of the corresponding pixel PXL. The first end portion EP1 of the fourth light emitting element LD4 may face the (4-1)-th electrode EL4_1, and the second end portion EP2 of the fourth light emitting element LD4 may face the (3-1)-th electrode EL3_1. When a plurality of fourth light emitting elements LD4 are provided, the plurality of fourth light emitting elements LD4 may be mutually connected in parallel between the (3-1)-th electrode EL3_1 and the (4-1)-th electrode EL4_1, and may form a fourth serial stage.

In some embodiments, each of the first light emitting element LD1, the second light emitting element LD2, the third light emitting element LD3, and the fourth light emitting element LD4 may be a light emitting diode with an ultra-small size, for example, with a small size of a nanoscale to a microscale, using a material having an inorganic crystal structure. For example, each of the first light emitting element LD1, the second light emitting element LD2, the third light emitting element LD3, and the fourth light emitting element LD4 may be the light emitting element LD shown in FIG. 1.

In some embodiments, each pixel PXL may include the first contact electrode CNE1, the second contact electrode CNE2, the first intermediate electrode CTE1, the second intermediate electrode CTE2, and a third intermediate electrode CTE3.

The first contact electrode CNE1 may be formed on the first end portion EP1 of the first light emitting element LD1 and on at least one area of the (1-1)-th electrode EL1_1 corresponding thereto to physically and/or electrically connect the first end portion EP1 of the first light emitting element LD1 to the (1-1)-th electrode EL1_1.

The second contact electrode CNE2 may be formed on the second end portion EP2 of the fourth light emitting element LD4 and on at least one area of the (3-1)-th electrode EL3_1 corresponding thereto to physically and/or electrically connect the second end portion EP2 of the fourth light emitting element LD4 to the (3-1)-th electrode EL3_1.

The first intermediate electrode CTE1 may include a (1-1)-th intermediate electrode CTE1_1 and a (1-2)-th intermediate electrode CTE1_2 that extend in the second direction DR2. The (1-1)-th intermediate electrode CTE1_1 may be formed on the second end portion EP2 of the first light emitting element LD1 and at least one area of the (2-1)-th electrode EL2_1 corresponding thereto. The first intermediate electrode CTE1 may extend from the (2-1)-th electrode EL2_1 (or the (1-1)-th intermediate electrode CTE1_1) to the (1-2)-th electrode EL1_2 (or the (1-2)-th intermediate electrode CTE1_2), and the (1-2)-th intermediate electrode CTE1_2 may be formed on the first end portion EP1 of the second light emitting element LD2 and at least one area of the (1-2)-th electrode EL1_2 corresponding thereto. The first intermediate electrode CTE1 may electrically connect the second end portion EP2 of the first light emitting element LD1 and the first end portion EP1 of the second light emitting element LD2. That is, the first intermediate electrode CTE1 may be a first bridge electrode (or first connection electrode) connecting the first serial stage and the second serial stage.

The second intermediate electrode CTE2 may include a (2-1)-th intermediate electrode CTE2_1 and a (2-2)-th intermediate electrode CTE2_2 that extend in the second direction DR2. The (2-1)-th intermediate electrode CTE2_1 may be formed on the second end portion EP2 of the second light emitting element LD2 and at least one area of the (2-2)-th electrode EL2_2 corresponding thereto. The second intermediate electrode CTE2 may extend from the (2-2)-th electrode EL2_2 by bypassing the third intermediate electrode CTE3 or third light emitting element LD3, and the (2-2)-th intermediate electrode CTE2_2 may be formed on the first end portion EP1 of the third light emitting element LD3 and at least one area of the (4-2)-th electrode EL4_2 corresponding thereto. The second intermediate electrode CTE2 may electrically connect the second end portion EP2 of the second light emitting element LD2 and the first end portion EP1 of the third light emitting element LD3. That is, the second intermediate electrode CTE2 may be a second bridge electrode (or second connection electrode) connecting the second serial stage and the third serial stage.

The third intermediate electrode CTE3 may include a (3-1)-th intermediate electrode CTE3_1 and a (3-2)-th intermediate electrode CTE3_2 that extend in the second direction DR2. The (3-1)-th intermediate electrode CTE3_1 may be formed on the second end portion EP2 of the third light emitting element LD3 and at least one area of the (3-2)-th electrode EL3_2 corresponding thereto. The third intermediate electrode CTE3 may extend from the (3-2)-th electrode EL3_2 (or the (3-1)-th intermediate electrode CTE3_1) to the (4-1)-th electrode EL4_1 (or the (3-2)-th intermediate electrode CTE3_2), and the (3-2)-th intermediate electrode CTE3_2 may be formed on the first end portion EP1 of the fourth light emitting element LD4 and at least one area of the (4-1)-th electrode EL4_1 corresponding thereto. The third intermediate electrode CTE3 may electrically connect the second end portion EP2 of the third light emitting element LD3 and the first end portion EP1 of the fourth light emitting element LD4. That is, the third intermediate electrode CTE3 may be a third bridge electrode (or third connection electrode) connecting the third serial stage and the fourth serial stage.

The first to third intermediate electrodes CTE1, CTE2, and CTE3 may be electrodes to which a signal (e.g., a set or predetermined signal) (or voltage) is not directly transmitted from the outside.

The first intermediate electrode CTE1 is provided to overlap the (2-1)-th electrode EL2_1 and the (1-2)-th electrode EL1_2, so that it may have a shape bent at least one or more times, but the present disclosure is not limited thereto. In some embodiments, the first intermediate electrode CTE1 may be changed into various shapes within a range in which the continuous first and second serial stages are stably connected.

The second intermediate electrode CTE2 is provided to overlap the (2-2)-th electrode EL2_2 and the (4-2)-th electrode EL4_2, so that it may have a shape bent at least one or more times, but the present disclosure is not limited thereto. In some embodiments, the second intermediate electrode CTE2 may be changed into various shapes within a range in which the continuous second and third serial stages are stably connected.

The third intermediate electrode CTE3 is provided to overlap the (3-2)-th electrode EL3_2 and the (4-1)-th electrode EL4_1, so that it may have a shape bent at least one or more times, but the present disclosure is not limited thereto. In some embodiments, the third intermediate electrode CTE3 may be changed into various shapes within a range in which the continuous third and fourth serial stages are stably connected.

Each of the first contact electrode CNE1, the second contact electrode CNE2, the first intermediate electrode CTE1, the second intermediate electrode CTE2, and the third intermediate electrode CTE3 may be made of various transparent conductive materials so that the light emitted from each of the light emitting elements LD and reflected by each of the first to fourth electrodes EL1, EL2, EL3, and EL4 proceeds to the image display direction of the display device without significant loss.

The first to third intermediate electrodes CTE1, CTE2, and CTE3 may be provided at the same layer as the first and second contact electrodes CNE1 and CNE2, and may be formed through the same process. However, the present disclosure is not limited thereto, and in some embodiments, the first to third intermediate electrodes CTE1, CTE2, and CTE3 may be provided in a different layer from the first and second contact electrodes CNE1 and CNE2, and may be formed through different processes.

As described above, the first light emitting element LD1 may be connected in series to the second light emitting element LD2 through the first intermediate electrode CTE1, and the second light emitting element LD2 may be connected in series to the third light emitting element LD3 through the second intermediate electrode CTE2, and the third light emitting element LD3 may be connected in series to the fourth light emitting element LD4 through the third intermediate electrode CTE3.

In each pixel PXL during each frame period, a driving current may flow from the (1-1)-th electrode EL1_1 through the first light emitting element LD1, the first intermediate electrode CTE1, the second light emitting element LD2, the second intermediate electrode CTE2, the third light emitting element LD3, the third intermediate electrode CTE3, and the fourth light emitting element LD4 to the (3-1)-th electrode EL3_1.

As described with reference to FIG. 5 and FIG. 6, the first light emitting element LD1, the second light emitting element LD2, the third light emitting element LD3, and the fourth light emitting element LD4 may be connected in series through the first intermediate electrode CTE1, the second intermediate electrode CTE2, and the third intermediate electrode CTE3 between the (1-1)-th electrode EL1_1 and the (3-1)-th electrode EL3_1. In this way, the light emitting unit EMU of the pixel PXL may be configured by connecting the light emitting elements LD arranged in the pixel area PXA of each pixel PXL in a series/parallel mixed structure. Accordingly, while reducing or minimizing an area occupied by the alignment electrode (or without increasing the number of alignment electrodes), it is possible to configure the light emitting unit EMU in a series/parallel mixed structure including four series stages, and thus a high resolution and fine pitch display device may be implemented.

In some embodiments, each pixel PXL may include the intermediate bank CT_BNK.

The intermediate bank CT_BNK may be integrally provided with the bank BNK disposed in the peripheral area PPA of each pixel PXL to be physically connected to the bank BNK. When the intermediate bank CT_BNK and the bank BNK are integrally provided, the intermediate bank CT_BNK may be one area of the bank BNK. However, the present disclosure is not limited thereto, and in some embodiments, the intermediate bank CT_BNK may not be integrally provided with the bank BNK, but may be separately provided from the bank BNK. In this case, the intermediate bank CT_BNK may be surrounded by the bank BNK to be disposed to be spaced from the bank BNK.

In the embodiment, the intermediate bank CT_BNK may include the first sub-bank SBNK1 and the second sub-bank SBNK2. The first sub-bank SBNK1 and the second sub-bank SBNK2 may be spaced from each other in the second direction DR2, and may face (or be opposite) each other. The first sub-bank SBNK1 may overlap one area of each of the (2-1)-th and (3-1)-th electrodes EL2_1 and EL3_1 between the (1-1)-th sub-light emitting area SEMA1_1 and the (1-2)-th sub-light emitting area SEMA1_2. The second sub-bank SBNK2 may overlap one area of each of the (2-2)-th and (3-2)-th electrodes EL2_2 and EL3_2 between the (2-1)-th sub-light emitting area SEMA2_1 and the (2-2)-th sub-light emitting area SEMA2_2.

The first sub-bank SBNK1 may be connected to the bank BNK disposed at the upper end portion (or upper side) of the pixel area PXA of each pixel PXL and the bank BNK disposed at the upper side of the fourth opening OP4, and the second sub-bank SBNK2 may be connected to the bank BNK disposed at the lower side of the fourth opening OP4 and the bank BNK disposed at the lower end portion (or lower side) of the pixel area PXA. When viewed in a plan view, the bank BNK and the intermediate bank CT_BNK may be connected to each other to form a mesh structure.

In the embodiment, one area of the bank BNK and one area of the intermediate bank CT_BNK may be liquid-repellent-treated to have liquid repellency, and the other area of the bank BNK and the other area of the intermediate bank CT_BNK may not be liquid-repellent-treated to have a lyophilic characteristic. As an example, the upper surface of the bank BNK (see 'B' in FIG. 8A) and the upper surface of the intermediate bank CT_BNK (see 'B' in FIG. 8A) may have liquid repellency, and the side surface of the bank BNK (see 'C' of FIG. 8A) and the side surface of the intermediate bank CT_BNK (see 'C' of FIG. 8A) may have a lyophilic characteristic.

As described above, in the process of supplying (or injecting) the ink including the light emitting elements LD into the pixel PXL, the bank BNK and the intermediate bank CT_BNK, which form a mesh structure in each pixel PXL, may control a degree of droplet spreading of the ink such that the ink may be evenly spread (or substantially evenly spread) in the pixel area PXA of the corresponding pixel PXL. Accordingly, the light emitting elements LD are entirely and evenly distributed (or substantially evenly distributed) in the pixel area PXA, so that each pixel PXL may emit light having uniform luminance (or substantially uniform luminance).

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims.

What is claimed is:

1. A display device, comprising:
    a substrate including a pixel area, the pixel area including a first sub-light emitting area, a second sub-light emitting area, and a peripheral area surrounding the first and second sub-light emitting areas;
    a pixel in the pixel area, the pixel comprising:
        a first electrode;
        a second electrode spaced from the first electrode in a first direction that is perpendicular to a thickness direction of the substrate; and
        a plurality of first light emitting elements, wherein a first end of each of the plurality of first light emitting elements is electrically connected to the first electrode and a second end of each of the plurality of first light emitting elements is electrically connected to the second electrode;
    a bank in the peripheral area and including a first opening corresponding to the first sub-light emitting area and a second opening corresponding to the second sub-light emitting area;
    an insulating pattern in the peripheral area and overlapping the bank, the insulating pattern being located between the substrate and the bank; and
    an intermediate bank between the first sub-light emitting area and the second sub-light emitting area,
    wherein at least one surface of the bank and at least one surface of the intermediate bank comprise a liquid-repellent layer comprising fluorine (F).

2. The display device of claim 1, wherein
    an upper surface of the bank and an upper surface of the intermediate bank comprise the liquid-repellent layer.

3. The display device of claim 2, wherein
    in a cross-sectional view, a side surface of the bank and a side surface of the intermediate bank are not liquid-repellent-treated and have a lyophilic characteristic.

4. The display device of claim 2, wherein
    the intermediate bank is integrally provided with the bank and connected to the bank.

5. The display device of claim 2, wherein
    the bank and the insulating pattern have a same planar shape.

6. The display device of claim 2, wherein
    the insulating pattern comprises an insulating material comprising an organic material.

7. The display device of claim 2, wherein
    the intermediate bank is spaced from the bank.

8. The display device of claim 7, wherein
    the intermediate bank comprises a first sub-bank and a second sub-bank that are spaced from each other in a second direction different from the first direction.

9. The display device of claim 7, wherein
    the intermediate bank comprises a first sub-bank and a second sub-bank that are spaced from each other in the first direction.

10. The display device of claim 1, wherein
    the intermediate bank comprises a same material as the bank.

11. The display device of claim 1, wherein the pixel further comprises:
    a third electrode and a fourth electrode, the first electrode, the second electrode, the third electrode, and the fourth electrode are spaced from each other;
    the plurality of first light emitting elements is between the first electrode and the second electrode; and
    a plurality of second light emitting elements between the third electrode and the fourth electrode.

12. The display device of claim 11, wherein the pixel further comprises:
    a first contact electrode on the first electrode to connect the first end of each of the plurality of first light emitting elements and the first electrode;
    an intermediate electrode on each of the second and fourth electrodes to connect the second end of each of the plurality of first light emitting elements and a first end of each of the plurality of second light emitting elements; and
    a second contact electrode on the third electrode to connect a second end of each of the plurality of second light emitting elements and the third electrode.

13. The display device of claim 11, wherein the pixel further comprises:
    a color conversion layer in the first sub-light emitting area and the second sub-light emitting area; and
    a color filter layer located on the color conversion layer and configured to allow light emitted from the color conversion layer to selectively pass therethrough.

14. The display device of claim 1, wherein
    in a cross-sectional view, a thickness of the intermediate bank is less than that of the bank.

15. A display device, comprising:
    a substrate including a pixel area, the pixel area including a first sub-light emitting area, a second sub-light emitting area, and a peripheral area surrounding the first and second sub-light emitting areas;
    a pixel in the pixel area, the pixel comprising:
        a first electrode;
        a second electrode spaced from the first electrode in a first direction that is perpendicular to a thickness direction of the substrate; and
        a plurality of first light emitting elements, wherein a first end of each of the plurality of first light emitting elements is electrically connected to the first electrode and a second end of each of the plurality of first light emitting elements is electrically connected to the second electrode;
    a bank in the peripheral area and including a first opening corresponding to the first sub-light emitting area and a second opening corresponding to the second sub-light emitting area;
    an insulating pattern in the peripheral area and overlapping the bank, the insulating pattern being located between the substrate and the bank; and
    an intermediate bank between the first sub-light emitting area and the second sub-light emitting area,
    wherein an upper surface of the bank and an upper surface of the intermediate bank comprise a liquid-repellent layer comprising fluorine (F).

16. The display device of claim 15, wherein
    in a cross-sectional view, a side surface of the bank and a side surface of the intermediate bank are not liquid-repellent-treated and have a lyophilic characteristic.

17. The display device of claim 15, wherein
    the intermediate bank is integrally provided with the bank and connected to the bank.

18. The display device of claim 15, wherein the intermediate bank is spaced from the bank.

\* \* \* \* \*